United States Patent
Kim et al.

(10) Patent No.: US 9,553,156 B2
(45) Date of Patent: Jan. 24, 2017

(54) ORGANIC LIGHT EMITTING DISPLAY DEVICE AND METHOD OF MANUFACTURING THE SAME

(71) Applicant: LG DISPLAY CO., LTD., Seoul (KR)

(72) Inventors: Binn Kim, Seoul (KR); TaeHwan Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/801,499

(22) Filed: Jul. 16, 2015

(65) Prior Publication Data

US 2016/0020422 A1 Jan. 21, 2016

(30) Foreign Application Priority Data

Jul. 16, 2014 (KR) .................. 10-2014-0089511
Jul. 29, 2014 (KR) .................. 10-2014-0096248
Aug. 5, 2014 (KR) .................. 10-2014-0100336

(51) Int. Cl.
*H01L 29/45* (2006.01)
*H01L 27/32* (2006.01)
*H01L 51/52* (2006.01)

(52) U.S. Cl.
CPC ........... *H01L 29/45* (2013.01); *H01L 27/3276* (2013.01); *H01L 51/5228* (2013.01); *H01L 51/5253* (2013.01); *H01L 27/3248* (2013.01); *H01L 51/5218* (2013.01); *H01L 2251/308* (2013.01)

(58) Field of Classification Search
CPC .. H01L 29/45; H01L 51/5253; H01L 27/3276; H01L 51/5228; H01L 51/5218; H01L 2251/308; H01L 27/3248
See application file for complete search history.

(56) References Cited

U.S. PATENT DOCUMENTS

2011/0084257 A1* 4/2011 Kwon ................. H01L 27/3276 257/40
2014/0353620 A1* 12/2014 Park .................... H01L 27/3258 257/40

* cited by examiner

*Primary Examiner* — Kyoung Lee
(74) *Attorney, Agent, or Firm* — Birch, Stewart, Kolasch & Birch, LLP

(57) ABSTRACT

Provided are an organic light emitting display device and a method of manufacturing the organic light emitting display device according to an exemplary embodiment of the present disclosure. The organic light emitting display device includes: a substrate including a display area and a pad area; a pad electrode structure on the substrate in the pad area and including a first pad electrode and a second pad electrode on the first pad electrode; and a protection conductive layer covering a lateral surface of the second pad electrode so as to reduce corrosion of the second pad electrode.

17 Claims, 39 Drawing Sheets

ORGANIC LIGHT EMITTING DISPLAY DEVICE AND METHOD OF MANUFACTURING THE SAME

CROSS-REFERENCE TO RELATED APPLICATIONS

This application claims the priority of Korean Patent Application No. 10-2014-0089511 filed on Jul. 16, 2014, Korean Patent Application No. 10-2014-0096248 filed on Jul. 29, 2014 and Korean Patent Application No. 10-2014-0100336 filed on Aug. 5, 2014 in the Korean Intellectual Property Office, the disclosures of which are incorporated herein by reference.

BACKGROUND

Field of the Invention

The present disclosure relates to an organic light emitting display device and a method of manufacturing the same, and more particularly, to an organic light emitting display device including a pad electrode structure improved in reliability and a method of manufacturing the same.

Description of the Related Art

An organic light emitting display device (OLED) is a self-light emitting display that does not need a separate light source as in a liquid crystal display device, and, thus, the organic light emitting display device can be manufactured into a lightweight and thin form. Further, the organic light emitting display device is advantageous in terms of power consumption since it is driven with a low voltage. Also, the organic light emitting display device has excellent color expression ability, a high response speed, a wide viewing angle, and a high contrast ratio (CR). Therefore, the organic light emitting display device has been receiving attention as a next-generation display device.

Organic light emitting display devices are categorized into a top-emission organic light emitting display device, a bottom-emission organic light emitting display device, and a dual-emission organic light emitting display device according to an emission direction of light.

In a top-emission organic light emitting display device, an anode may be formed of a conductive material having an excellent reflection and a proper work function. However, there is no existing single material satisfying such characteristics. Therefore, the anode in the top-emission organic light emitting display device is formed into a multi-layer structure including conductive layers, and may be formed into a structure in which, for example, an ITO (Indium Tin Oxide) layer, a silver alloy (Ag alloy) layer, and an ITO layer are laminated. Accordingly, a light emitted from an organic light emitting layer of an organic light emitting element is reflected at the Ag alloy layer, so that a top-emission organic light emitting display device is realized.

Meanwhile, a pad electrode in a general organic light emitting display device is bonded to an external module and configured to receive an electrical signal from the external module or output an electrical signal to the external module. An uppermost layer of a pad electrode in a general top-emission organic light emitting display device is formed of the same material as an anode. To be specific, the pad electrode is formed of the same material as the anode on an electrode formed of the same material as a source electrode and a drain electrode of a thin film transistor.

Herein, a layer formed of the same material as the anode, i.e., the uppermost layer of the pad electrode, is formed at the same time when the anode is formed. To be specific, the anode and the uppermost layer of the pad electrode are formed by performing an etching process in a state where an ITO material, an Ag alloy material, and an ITO material are laminated. Therefore, the uppermost layer of the pad electrode is also formed into a structure in which an ITO layer, an Ag alloy layer, and an ITO layer are laminated and a lateral side (surface) of the Ag alloy is exposed to the outside. When the Ag alloy layer with the exposed lateral side is damaged, a driving defect of the organic light emitting display device may be generated.

To be specific, in order to test reliability of the organic light emitting display device, a panel on which organic light emitting elements are formed is kept in a high-temperature chamber for a certain period of time. In this case, the Ag alloy layer of the pad electrode may be damaged due to a high temperature in the chamber, so that the pad electrode cannot be brought into contact with the external module and the organic light emitting display device may not be normally operated, thereby causing a driving defect.

Further, when the Ag alloy layer of the pad electrode is exposed to the outside, the Ag alloy layer may react with water (moisture) and air. In this case, a galvanic effect is generated between the Ag alloy layer and the ITO layer. A galvanic effect refers to a phenomenon occurring when two materials different in electromotive force (EMF) are exposed to a corrosive solution at the same time. A material having a high EMF is corroded, so that the pad electrode has an insulating property. Therefore, there may be generated a driving defect in which the pad electrode is not brought into contact with the external module and the organic light emitting display device is not normally operated.

Further, during a module process (or similar manufacturing procedure), the pad electrode may be in a high-temperature and high-pressure condition. In such a high-temperature and high-pressure condition, if water (moisture) is applied to the lateral side of the Ag alloy layer exposed to the outside, migration occurs in the Ag alloy layer. Therefore, a part of the Ag alloy layer increases, so that there may be generated a driving defect in which adjacent pad electrodes are shorted and the organic light emitting display device is not normally operated.

Accordingly, a method has been considered to form pad electrode only of the same material as the source electrode and the drain electrode without using the layer formed of the same material as the anode, i.e., the uppermost layer of the pad electrode. However, metal materials generally used for the source electrode and the drain electrode may be washed away by an etchant used in an etching process for forming the anode.

SUMMARY

Accordingly, the inventors of the present disclosure recognized such problems and invented an organic light emitting display device and a method of manufacturing the organic light emitting display device including a new pad electrode structure for suppressing damage which may occur in a pad electrode structure of a top-emission organic light emitting display device.

Thus, an object to be achieved by the present disclosure is to provide an organic light emitting display device and a method of manufacturing the organic light emitting display device capable of suppressing a pad electrode from being damaged or corroded.

Further, another object to be achieved by the present disclosure is to provide an organic light emitting display device and a method of manufacturing the organic light emitting display device with improved reliability.

Also, yet another object to be achieved by the present disclosure is to provide an organic light emitting display device capable of minimizing a voltage drop which may occur in a top-emission organic light emitting display device.

The objects of the present disclosure are not limited to the aforementioned objects, and other objects, which are not mentioned above, will be apparent to a person having ordinary skill in the art from the following description.

According to an aspect of the present disclosure, there is provided an organic light emitting display device including: a substrate including a display area and a pad area; a pad electrode structure on the substrate in the pad area and including a first pad electrode and a second pad electrode on the first pad electrode; and a protection conductive layer covering a lateral surface of the second pad electrode so as to reduce corrosion of the second pad electrode.

According to another feature of the present disclosure, the protection conductive layer is formed of one of transparent conductive oxide, molybdenum (Mo), and a molybdenum alloy (Mo alloy).

According to yet another feature of the present disclosure, the organic light emitting display device further includes: a thin film transistor on the substrate in the display area and including an active layer, a gate electrode, a source electrode, and a drain electrode; and an anode electrically connected with the thin-film transistor and including a plurality of conductive layers, and the first pad electrode is formed of the same material as the source electrode and the drain electrode and the second pad electrode is formed of the same material as the anode.

According to still another feature of the present disclosure, the anode has a structure in which a lower poly-ITO layer, a silver alloy layer, and an upper poly-ITO layer are laminated.

According to still another feature of the present disclosure, the source electrode and the drain electrode have a structure in which a copper (Cu) layer is laminated on a molybdenum-titanium (MoTi) alloy layer.

According to still another feature of the present disclosure, the protection conductive layer covers a lateral surface of the second pad electrode and at least a part of a top surface of the second pad electrode.

According to still another feature of the present disclosure, the organic light emitting display device further includes: a dummy layer covering the anode, and the dummy layer is formed of the same material as the protection conductive layer.

According to still another feature of the present disclosure, the organic light emitting display device further includes: a passivation layer covering an edge of the first pad electrode, and the second pad electrode is electrically connected with the first pad electrode through a contact hole in the passivation layer.

According to another aspect of the present disclosure, there is provided an organic light emitting display device including: a substrate including a display area and a pad area; a thin film transistor on the substrate in the display area and including an active layer, a gate electrode, a source electrode, and a drain electrode; an anode electrically connected with the thin film transistor and including a plurality of conductive layers; and a pad electrode structure on the substrate in the pad area and including a first pad electrode and a second pad electrode on the first pad electrode, and a material of the second pad electrode is different in etching selectivity from a material of the anode.

According to another feature of the present disclosure, the material of the second pad electrode and the material of the anode are different from each other in etching selectivity with respect to an etchant for etching the material of the anode.

According to yet another feature of the present disclosure, the second pad electrode is formed of a material which is not etched by an etchant for etching the anode.

According to still another feature of the present disclosure, the second pad electrode is formed of one of polymerized transparent conductive oxide, titanium (Ti), and a molybdenum-titanium (MoTi) alloy.

According to still another feature of the present disclosure, each of the source electrode and the drain electrode includes a first conductive layer formed of the same material as the first pad electrode and a second conductive layer formed of the same material as the second pad electrode. Further, the first conductive layer has a structure in which a copper (Cu) layer is laminated on a molybdenum-titanium (MoTi) alloy layer or a structure of which a molybdenum (Mo) layer, an aluminum (Al) layer, and a molybdenum layer are laminated.

According to still another feature of the present disclosure, the organic light emitting display device further includes: a passivation layer on the source electrode and the drain electrode and including a contact hole for revealing a part of a top surface of the second pad electrode; and an external module in direct contact with the second pad electrode via the contact hole.

According to yet another aspect of the present disclosure, there is provided an organic light emitting display device including: a substrate having a display area and a pad area; a thin film transistor on the substrate in the display area and including an active layer, a gate electrode, a source electrode, and a drain electrode; an anode electrically connected with the thin film transistor and including at least two layers; and a pad electrode structure on the substrate in the pad area and including a plurality of pad electrodes. Further, a first pad electrode of the pad electrode structure is formed of the same material as the source electrode and the drain electrode and a second pad electrode of the pad electrode structure and a third pad electrode of the pad electrode structure covers the first pad electrode.

According to another feature of the present disclosure, the anode has a structure in which a lower ITO (Indium Tin Oxide) layer, a silver alloy (Ag alloy) layer, and an upper ITO layer are laminated.

According to yet another feature of the present disclosure, the anode further includes a dummy layer which is in contact with a rear side of the lower ITO layer and electrically connected with the lower ITO layer.

According to still another feature of the present disclosure, the dummy layer includes a plurality of layers, and a lower layer of the plurality of layers has a structure in which a copper (Cu) layer is laminated on a molybdenum-titanium (MoTi) alloy layer and an upper layer of the plurality of layers is formed of molybdenum-titanium (MoTi) alloy and covers the lower layer.

According to still another feature of the present disclosure, the dummy layer is formed of the same material as the second pad electrode of the pad electrode structure and the third pad electrode of the pad electrode structure.

According to still another feature of the present disclosure, the organic light emitting display device further includes: a planarization layer that covers the thin film transistor; and a first auxiliary wiring on the planarization layer and on the same plane as the anode. Also, the second pad electrode of the pad electrode structure and the third pad electrode of the pad electrode structure are formed of the same material as the first auxiliary wiring.

Details of other exemplary embodiments will be included in the detailed description of the disclosure and the accompanying drawings.

According to the present disclosure, it is possible to minimize damage or corrosion of a pad electrode caused by external exposure of an Ag alloy layer of the pad electrode.

Further, according to the present disclosure, since a pad electrode is not formed of the same material as an anode, it is possible to minimize damage or corrosion of the pad electrode.

Furthermore, according to the present disclosure, it is possible to improve the reliability of a pad electrode and further possible to improve the reliability of an organic light emitting display device.

Also, according to the present disclosure, it is possible to minimize non-uniformity of luminance in a top-emission organic light emitting display device, particularly, a large-area top-emission organic light emitting display device.

The effects of the present disclosure are not limited to the aforementioned effects, and other various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

Figure 1:
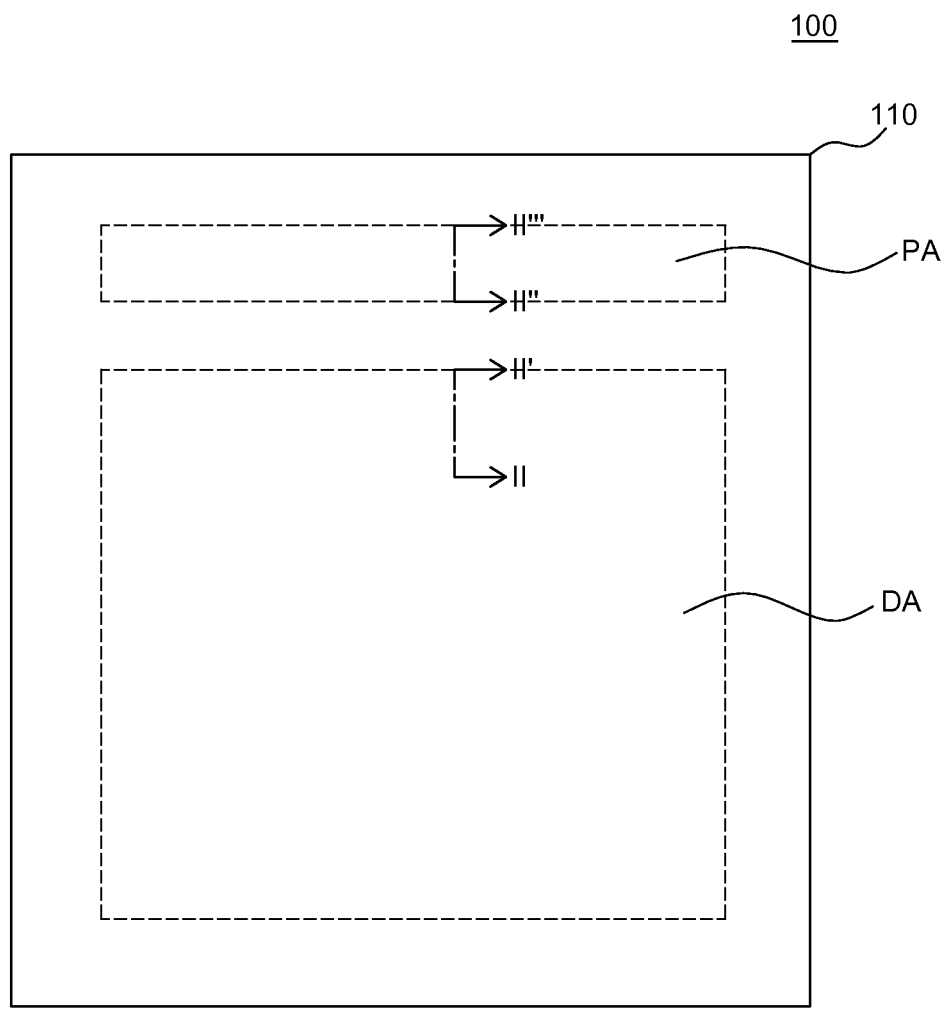
FIG. 1 is a schematic plan view of an organic light emitting display device according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components.

Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, various exemplary embodiments of the present disclosure will be described in detail with reference to the accompanying drawings.

Figure 2:
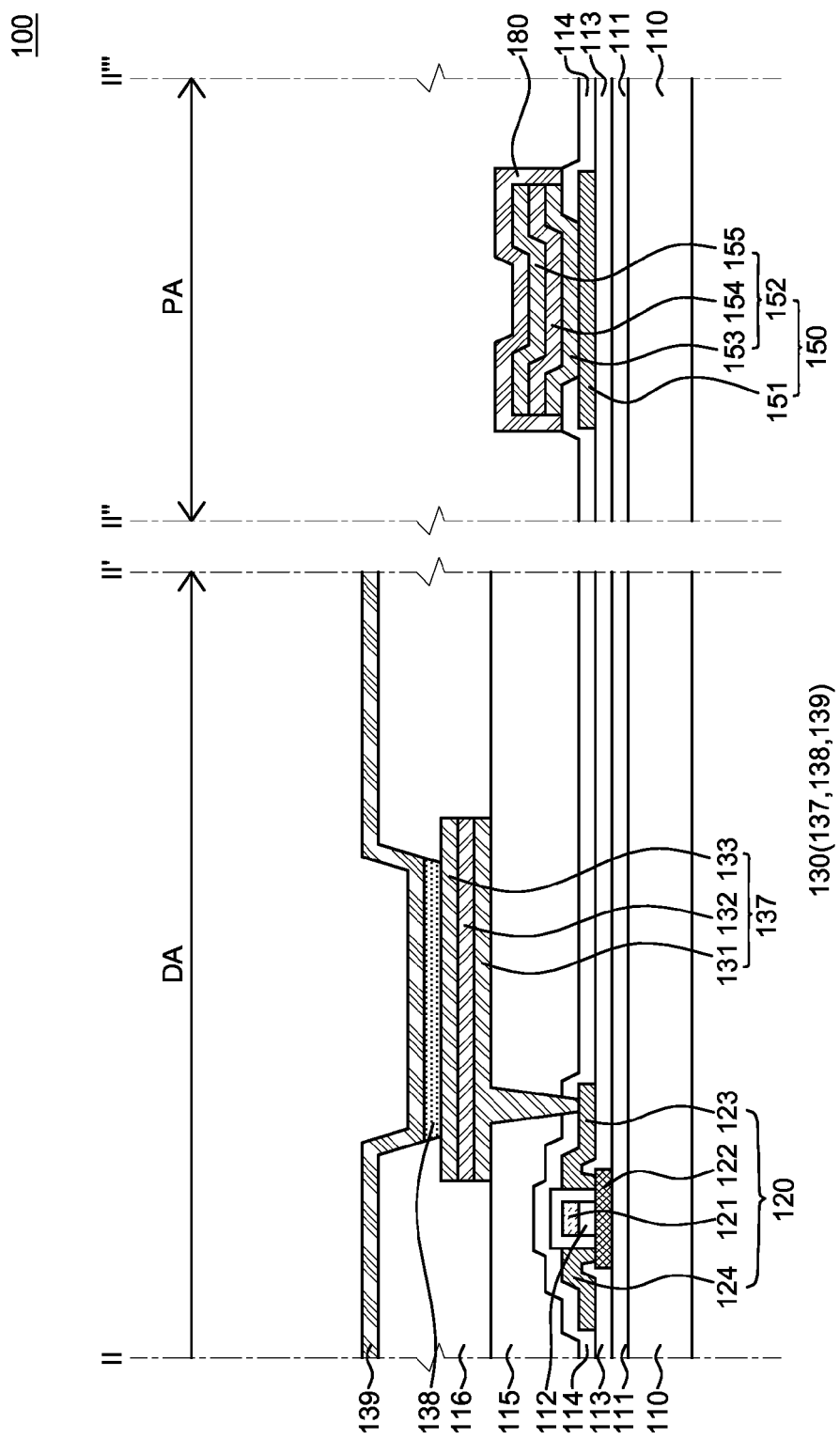
FIG. 2 is a schematic cross-sectional view of the organic light emitting display device taken along lines II-II' and II"-II'" of FIG. 1.

FIG. 1 is a schematic plan view of an organic light emitting display device according to an exemplary embodiment of the present disclosure. FIG. 2 is a schematic cross-sectional view of the organic light emitting display device taken along lines II-II' and II"-II'" of FIG. 1. Referring to FIG. 1 and FIG. 2, an organic light emitting display device 100 includes a substrate 110, a thin film transistor 120, an organic light emitting element 130, a pad electrode structure 150, and a protection conductive layer 180. For convenience in explanation, FIG. 1 schematically illustrates only a pad area PA and a display area DA of the substrate 110. In the present specification, the organic light emitting display device will be described as a top-emission organic light emitting display device.

The substrate 110 supports and protects various components of the organic light emitting display device 100. The substrate 110 may be formed of an insulating material, for example, glass or plastic, but is not limited thereto, and may be formed of various materials.

The substrate 110 includes a display area DA and a pad area PA. The display area DA refers to an area where an image is displayed in the organic light emitting display device 100. In the display area DA, the organic light emitting element 130 and various driving elements for driving the organic light emitting element 130 are disposed. For convenience in explanation, FIG. 2 illustrates only the driving thin film transistor 120 among various driving elements. The pad area PA refers to an area where the pad electrode structure 150 is formed and the pad electrode structure 150 is in contact with an external module such as an FPCB (Flexible Printed Circuit Board), a COF (Chip On Film). The pad area PA may be defined on one side of the display area DA as illustrated in FIG. 1 or may be defined on both sides of the display area DA.

The thin film transistor 120 is formed on the substrate 110. The thin film transistor 120 is formed in the display area DA of the substrate 110. To be specific, a buffer layer 111 is formed on the substrate 110, and an active layer 122, in which a channel of the thin film transistor 120 is formed, is formed on the buffer layer 111. The active layer 122 may be formed on the buffer layer 111 as illustrated in FIG. 2, or may be directly formed on the substrate 110 if the buffer layer 111 is not used. A gate insulating layer 112 is formed on the active layer 122 in order to insulate the active layer 122 from a gate electrode 121. The gate electrode 121 is formed on the gate insulating layer 112. An interlayer insulating layer 113 is formed on the gate electrode 121. The interlayer insulating layer 113 is formed on the entire surface of the substrate 110 and includes a contact hole for opening a partial area of the active layer 122. A source electrode 123 and a drain electrode 124 are formed on the interlayer insulating layer 113, and each of the source electrode 123 and the drain electrode 124 is electrically connected with the active layer 122 through the contact hole. The source electrode 123 and the drain electrode 124 may be formed of various conductive materials, and may have a structure in which, for example, a copper (Cu) layer is laminated on a molybdenum-titanium (MoTi) alloy layer. A passivation layer 114 for protecting the thin film transistor 120 is formed on the source electrode 123 and the drain electrode 124. For convenience in explanation, FIG. 2 illustrates that the thin film transistor 120 has a coplanar structure, but is not limited thereto. The thin film transistor 120 may have an inverted staggered structure.

A planarization layer 115 is formed on the thin film transistor 120. The planarization layer 115 is an insulating layer for planarizing an upper part of the thin film transistor 120. The planarization layer 115 is formed only in the display area DA but not formed in the pad area PA.

The organic light emitting element 130 is formed on the planarization layer 115. The organic light emitting element 130 includes an anode 137, an organic light emitting layer 138, and a cathode 139.

The anode 137 is electrically connected with the thin film transistor 120. As illustrated in FIG. 2, the anode 137 may be electrically connected with the source electrode 123 of the thin film transistor 120, or although not illustrated in FIG. 2, the anode 137 may be electrically connected with the drain electrode 124 of the thin film transistor 120.

The anode 137 includes a plurality of conductive layers. The anode 137 includes an upper ITO layer 133 configured to transfer a hole to the organic light emitting layer 138. However, a material of the upper ITO layer 133 is not limited to ITO, and another transparent conductive oxide, such as IZO (Indium Zinc Oxide), having a high work function may be used as a material for the upper ITO layer 133. Since the organic light emitting display device 100 according to an exemplary embodiment of the present disclosure is a top-emission organic light emitting display device, a reflective layer for reflecting light emitted from the organic light emitting layer 138 toward an upper side of the organic light emitting display device 100 is needed. Thus, the anode 137 includes the Ag alloy layer 132 formed on a bottom side of the upper ITO layer 133. However, the reflective layer is not limited to the Ag alloy layer 132, and various conductive materials having an excellent reflectance may be used as the reflective layer.

The anode 137 further includes a lower ITO layer 131 in order to improve an adhesion force with respect to the planarization layer 115. Even when the anode 137 includes only the Ag alloy layer 132 and the upper ITO layer 133, the anode 137 can serve as an anode. However, the Ag alloy layer 132 serving as a reflective layer has a weak adhesion force with respect to the planarization layer 115 generally formed of an organic insulating material. Therefore, in the organic light emitting display device 100 according to an exemplary embodiment of the present disclosure, the anode 137 further includes the lower ITO layer 131, and, thus, an adhesion force between the anode 137 and the planarization layer 115 can be improved. A material of the lower ITO layer 131 is not limited to ITO, and another transparent conductive oxide, such as IZO, having a high work function may be used as a material of the lower ITO layer 131.

A bank layer 116 (or similar structure) is formed on the planarization layer 115. The bank layer 116 may be formed to cover an edge of the anode 137. A partial area of the anode 137 opened (revealed) by the bank layer 116 may be defined as an emission area.

The organic light emitting layer 138 is formed on the anode 137. The organic light emitting layer 138 is formed on the partial area of the anode 137 opened by the bank layer 116. In this case, the organic light emitting layer 138 may be one of a red organic light emitting layer, a green organic light emitting layer, and a blue organic light emitting layer. Although not illustrated in FIG. 2, the organic light emitting layer 138 may be a white organic light emitting layer. In this case, the white organic light emitting layer may be formed on the entire surface of the substrate 110 in the display area DA, and a color filter may be additionally used.

The cathode 139 is formed on the organic light emitting layer 138. The cathode 139 is configured to transfer an electron to the organic light emitting layer 138 and is formed on the entire surface of the substrate 110 in the display area DA. The cathode 139 may be formed of a metallic material or transparent conductive oxide having a low work function.

Referring to FIG. 2, the buffer layer 111 and the interlayer insulating layer 113 are formed on the substrate 110 in the pad area PA. If the buffer layer 111 is omitted, the interlayer insulating layer 113 may be directly formed on the substrate 110.

The pad electrode structure 150 is formed on the substrate 110 in the pad area PA. To be specific, the pad electrode structure 150 is formed on the interlayer insulating layer 113. The pad electrode structure 150 includes a plurality of conductive layers. Referring to FIG. 2, the pad electrode structure 150 includes a first pad electrode 151 and a second pad electrode 152 on the first pad electrode 151.

The first pad electrode 151 of the pad electrode structure 150 is formed of the same material as the source electrode 123 and the drain electrode 124 of the thin film transistor 120 formed in the display area DA. That is, a first conductive layer 153 may have a structure in which a copper (Cu) layer is laminated on a molybdenum-titanium (MoTi) alloy layer.

The passivation layer 114 is formed on the first pad electrode 151. To be specific, the passivation layer 114 is formed on an edge of the first pad electrode 151 so as to cover the edge of the first electrode 151. The passivation layer 114 includes a contact hole, and opens a partial area of the first pad electrode 151 through the contact hole of the passivation layer 114.

The second pad electrode 152 of the pad electrode structure 150 is formed of the same material as the anode 137 of the organic light emitting element 130 formed in the display area DA. That is, the second pad electrode 152 includes the first conductive layer 153 formed of the same material as the lower ITO layer 131 of the anode 137, a second conductive layer 154 formed of the same material as the Ag alloy layer 132 of the anode 137, and a third conductive layer 155 formed of the same material as the upper ITO layer 133 of the anode 137. The second pad electrode 152 is electrically connected with the first pad electrode 151 through the contact hole formed in the passivation layer 114. Therefore, the passivation layer 114 is disposed between the edge of the first pad electrode 151 and an edge of the second pad electrode 152.

The protection conductive layer 180 is formed to cover the second pad electrode 152 in the pad area PA. The protection conductive layer 180 is formed to cover a top side and a lateral side of the second pad electrode 152. In the organic light emitting display device 100, the pad electrode structure 150 needs to transfer an external signal to the organic light emitting element 130 and the thin film transistor 120, and, thus, the pad electrode structure 150 needs to be unaffected by exposure to air or moisture (water). However, in the top-emission organic light emitting display device 100, if an uppermost layer of the pad electrode structure 150 is formed of the same material as the anode 137, the second conductive layer 154 of the second pad electrode 152 formed of the same material as the Ag alloy layer 132 of the anode 137 may react with air or moisture (water), resulting in damage or corrosion. Therefore, a driving defect of the organic light emitting display device 100 may be generated. Accordingly, in the organic light emitting display device 100 according to an exemplary embodiment of the present disclosure, by blocking a contact of the pad electrode structure 150, particularly, the second conductive layer 154 of the second pad electrode 152 formed of the same material as the anode 137 with air or moisture (water), corrosion of the second pad electrode 152 can be reduced. In order to reduce corrosion of the second pad electrode 152, the protection conductive layer 180 may be formed of any one of material, such as transparent conductive oxide, molybdenum (Mo), and a molybdenum alloy (Mo alloy), which is not likely to be corroded even when in contact with air or water. Therefore, the reliability of the pad electrode structure 150 can be improved, and the reliability of the organic light emitting display device 100 can also be improved.

Figure 3:
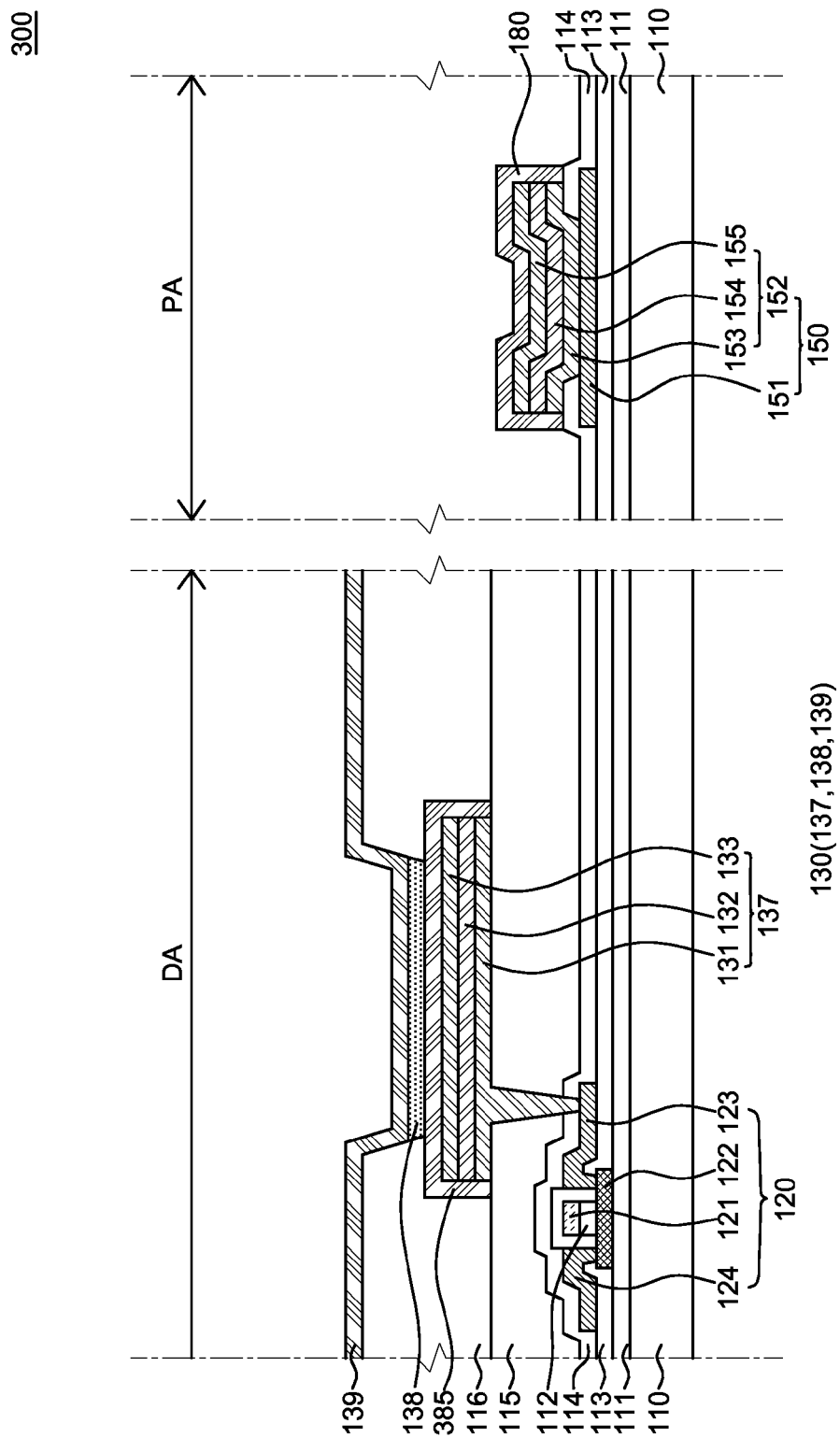
FIG. 3 to FIG. 10 are schematic cross-sectional views of an organic light emitting display device according to various exemplary embodiments of the present disclosure.

FIG. 3 is a schematic cross-sectional view of an organic light emitting display device according to another exemplary embodiment of the present disclosure. An organic light emitting display device 300 illustrated in FIG. 3 is substantially the same as the organic light emitting display device 100 illustrated in FIG. 1 and FIG. 2 except a dummy layer 385 (or some other equivalent structure) is added, and, thus, redundant explanation thereof will be omitted.

Referring to FIG. 3, the dummy layer 385 is formed to cover the anode 137 on the planarization layer 115. The dummy layer 385 is formed to cover all of a top side (surface) and a lateral side (surface) of the anode 137. Since the dummy layer 385 is formed to cover the anode 137, the bank layer 116 is formed to cover an edge of the anode 137 and an edge of the dummy layer 385 and the organic light emitting layer 138 is formed on the dummy layer 385.

The dummy layer 385 is formed of transparent conductive oxide. As illustrated in FIG. 3, as the dummy layer 385 is formed to be in contact with the organic light emitting layer 138, it needs to transfer holes to the organic light emitting layer 138. Therefore, the dummy layer 385 is formed of transparent conductive oxide having a high work function. The dummy layer 385 may be formed of the same material as the protection conductive layer 180. If the dummy layer 385 and the protection conductive layer 180 are formed of the same material, the protection conductive layer 180 is also formed of transparent conductive oxide. A process of manufacturing the dummy layer 385 and the protection conductive layer 180 will be described below with reference to FIG. 12a to FIG. 12d.

In the organic light emitting display device 300 according to another exemplary embodiment of the present disclosure, since the dummy layer 385 formed to cover the anode 137 is used together with the protection conductive layer 180, the reliability of the pad electrode structure 150 can be improved and also, damage to the anode 137 during a process of manufacturing the organic light emitting display device can be minimized.

Figure 4:
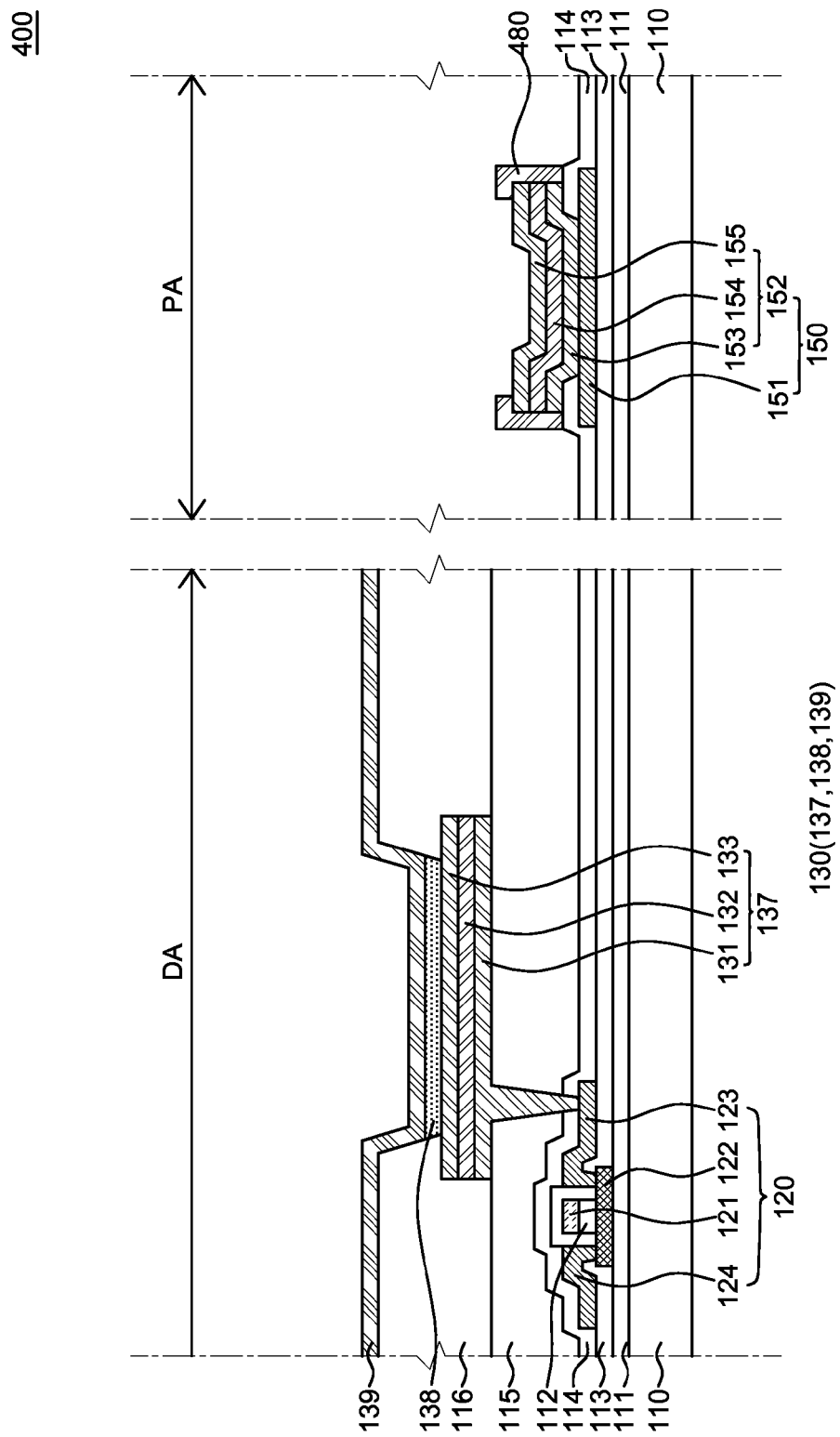

FIG. 4 is a schematic cross-sectional view of an organic light emitting display device according to yet another exemplary embodiment of the present disclosure. An organic light emitting display device 400 illustrated in FIG. 4 is substantially the same as the organic light emitting display device 100 illustrated in FIG. 1 and FIG. 2 except for a shape of a protection conductive layer 480, and, thus, redundant explanation thereof will be omitted.

Referring to FIG. 4, the protection conductive layer 480 is formed to cover a lateral side of the second pad electrode 152 of the pad electrode structure 150. To be specific, the protection conductive layer 480 is formed to cover the lateral side of the second pad electrode 152 and at least a part of a top side of the second pad electrode 152. That is, the protection conductive layer 480 covers the lateral side of the second pad electrode 152, yet it may selectively cover the top side of the second pad electrode 152.

As described above, if the second pad electrode 152 of the pad electrode structure 150 is formed of the same material as the anode 137, the second conductive layer 152 of the second pad electrode 152 formed of the same material as the Ag alloy layer 132 of the anode 137 may react with air or water, resulting in damage or corrosion, unlike the first conductive layer 153 and the third conductive layer 155 of the second pad electrode 152. In particular, a top side and a bottom side of the second conductive layer 154 of the second pad electrode 152 are in contact with the first conductive layer 153 and the third conductive layer 155 of the second pad electrode 152 formed of ITO and are not brought into contact with air or water. However, a lateral side of the second conductive layer 154 of the second pad electrode 152 may be brought into contact with air or water. Therefore, it is very important to protect the lateral side of the second pad electrode 152 for improving the reliability of the pad electrode structure 150. Thus, in the organic light emitting display device 400 according to yet another exemplary embodiment of the present disclosure, since the protection conductive layer 480 covers at least a part of the top side of the second pad electrode 152 but covers the entire lateral side of the second pad electrode 152, it is possible to block a contact of the lateral side of the second conductive layer 154 of the second pad electrode 152 with air or water.

Figure 5:
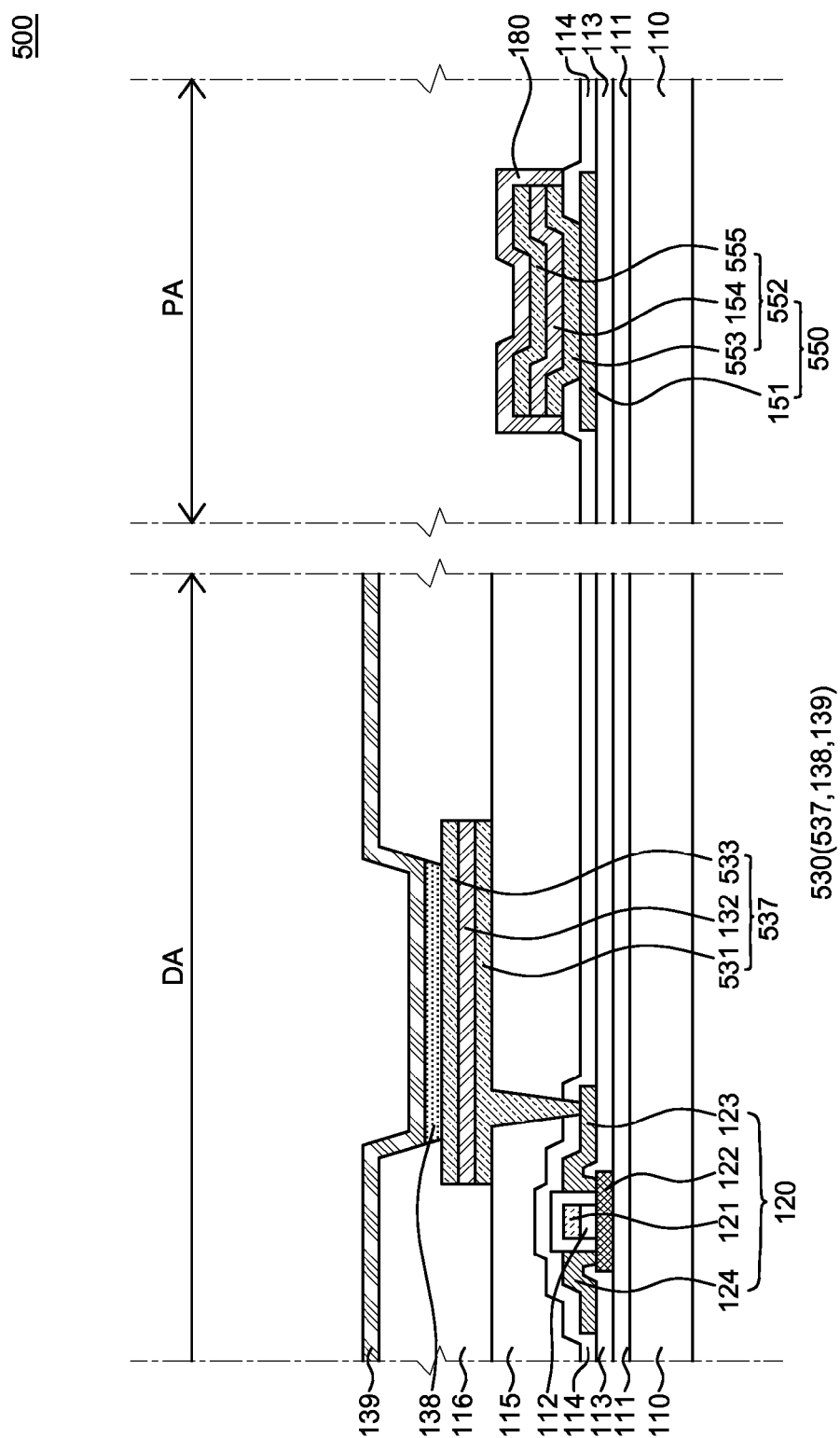

FIG. 5 is a schematic cross-sectional view of an organic light emitting display device according to still another exemplary embodiment of the present disclosure. An organic light emitting display device 500 illustrated in FIG. 5 is substantially the same as the organic light emitting display device 100 illustrated in FIG. 1 and FIG. 2 except for properties of an anode 537 and a pad electrode structure 550, and, thus, redundant explanation thereof will be omitted.

Referring to FIG. 5, the anode 537 has a lower poly-ITO layer and a structure in which the Ag alloy layer 132 and an upper poly-ITO layer 533 are laminated on a lower poly-ITO layer. Herein, a poly-ITO layer refers to a layer formed of an ITO material polymerized by performing an annealing process or the like to an ITO layer.

A second pad electrode 552 of a pad electrode structure 550 is formed of the same material as the anode 537 of an organic light emitting element 530 formed in the display area DA. That is, the second pad electrode 552 includes a first conductive layer 553 formed of the same material as the lower poly-ITO layer 531 of the anode 537, the second conductive layer 154 formed of the same material as the Ag alloy layer 132 of the anode 537, and a third conductive layer 555 formed of the same material as the upper poly-ITO layer 533 of the anode 537.

In the organic light emitting display device 500 according to still another exemplary embodiment of the present disclosure, the uppermost layer and the lowermost layer of the anode 537 are formed of poly-ITO layers and the uppermost layer and the lowermost layer of the second pad electrode 552 are also formed of poly-ITO layers. Therefore, it is possible to suppress damage to the anode 537 and the second pad electrode 552 while the protection conductive layer 180 configured to cover the pad electrode structure 550 is formed. The suppression of damage to the second pad electrode 552 will be described below in more detail with reference to FIG. 13a to FIG. 13d.

Figure 6:
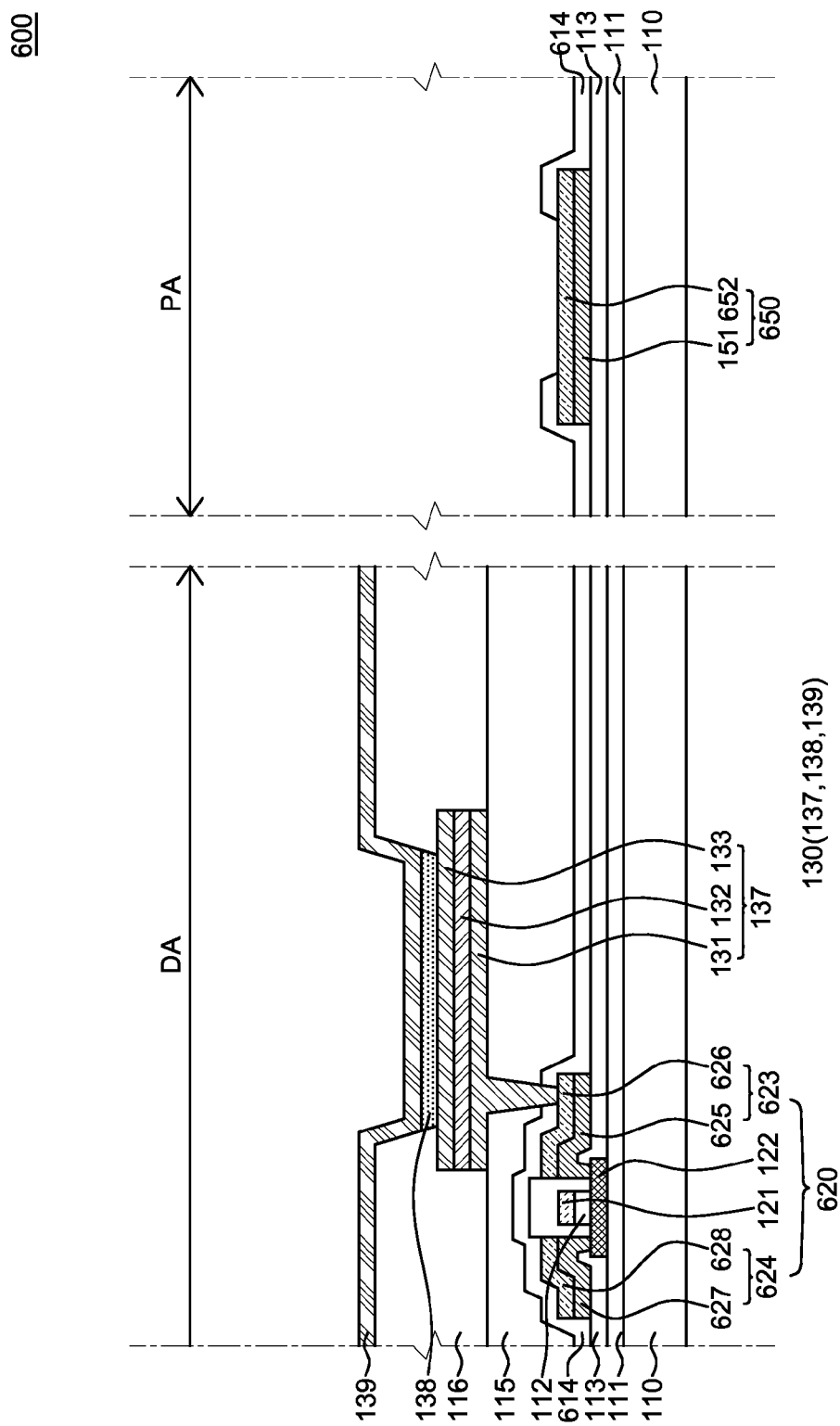

FIG. 6 is a schematic cross-sectional view of an organic light emitting display device according to still another exemplary embodiment of the present disclosure. An organic light emitting display device 600 illustrated in FIG. 6 is substantially the same as the organic light emitting display device 100 illustrated in FIG. 1 and FIG. 2 except for a configuration of a passivation layer 614, a thin film transistor 620, and a pad electrode structure 650, and, thus, redundant explanation thereof will be omitted.

A source electrode 623 and a drain electrode 624 of the thin film transistor 620 include first conductive layers 625 and 627 and second conductive layers 626 and 628 on the first conductive layers 625 and 627, respectively.

The first conductive layers 625 and 627 of the source electrode 623 and the drain electrode 624, respectively, are formed of a material generally used for the source electrode 623 and the drain electrode 624 of the thin film transistor 620. That is, each of the first conductive layers 625 and 627 has a structure in which a copper (Cu) layer is laminated on a molybdenum-titanium (MoTi) alloy layer or a structure of which a molybdenum (Mo) layer, an aluminum (Al) layer, and a molybdenum layer are laminated.

The second conductive layers 626 and 628 of the source electrode 623 and the drain electrode 624, respectively, are formed of a material different in etching selectivity from the material of the anode 137. That is, as a material of the second conductive layers 626 and 628 is different from the material of the anode 137 in etching selectivity with respect to an etchant for etching the anode 137, it is not etched by the etchant for etching the anode 137. For example, each of the second conductive layers 626 and 628 is formed of one of polymerized transparent conductive oxide, titanium (Ti), and a molybdenum-titanium (MoTi) alloy. Since the second conductive layers 626 and 628 of the source electrode 623 and the drain electrode 624, respectively, are formed of the same material as a second pad electrode 652 of the pad electrode structure 650, more details of the second conductive layers 626 and 628 of the source electrode 623 and the drain electrode 624, respectively, will be described below together with the pad electrode structure 650.

The pad electrode structure 650 includes the first pad electrode 151 and the second pad electrode 652 on the first pad electrode 151.

The first pad electrode 151 of the pad electrode structure 650 is formed of the same material as the first conductive layers 625 and 627 of the source electrode 623 and the drain electrode 624, respectively, of the thin film transistor 620 formed in the display area DA. That is, the first pad electrode 151 has a structure in which a copper layer is laminated on a molybdenum-titanium alloy layer or a structure of which a molybdenum layer, an aluminum layer, and a molybdenum layer are laminated.

The second pad electrode 652 of the pad electrode structure 650 is formed of a material different in etching selectivity from the material of the anode 137. That is, as the material of the second pad electrode 652 is different from the material of the anode 137 in etching selectivity with respect to the etchant for etching the anode 137, it is not etched by the etchant for etching the anode 137. That is, the second conductive layers 626 and 628 are formed of a material that is not etched by an etchant for etching ITO and an Ag alloy constituting the anode 137. For example, the second conductive layers 626 and 628 may be formed of one of polymerized transparent conductive oxide, titanium, and a molybdenum-titanium alloy. The second pad electrode 652 of the pad electrode structure 650 may be formed of the same material as the second conductive layers 626 and 628 of the source electrode 623 and the drain electrode 624, respectively, of the thin film transistor 620 formed in the display area DA.

The passivation layer 614 is formed to cover a lateral side of the pad electrode structure 650 in the pad area PA. To be specific, the passivation layer 614 is formed to be in contact with a lateral side of the first pad electrode 151 and a part of a lateral side and top side of the second pad electrode 652 so as to cover an edge of the second pad electrode 652. That is, the passivation layer 614 seals the first pad electrode 151 from the outside. Further, the passivation layer 614 includes a contact hole for opening a part of the top side of the second pad electrode 652. Therefore, the second pad electrode 652 may be brought into contact with an external module such as an FPCB and COF through the contact hole of the passivation layer 614. In other words, the second pad electrode 652 is electrically connected with the external module in a direct manner without forming an additional pad electrode formed of the same material as the anode 137 on the second pad electrode 652.

In the organic light emitting display device 600, the pad electrode 650 needs to transfer an external signal to the organic light emitting element 130 and the thin film transistor 620, and, thus, the pad electrode structure 650 needs to be unaffected by exposure to air or water. However, if an uppermost layer of a pad electrode is formed of the same material as an anode like a top-emission organic light emitting display device of the prior art, the pad electrode formed of an Ag alloy layer of the anode may react with air or water, resulting in damage or corrosion. Therefore, a driving defect of the organic light emitting display device may be generated. Accordingly, a method has been considered to form the pad electrode only of the same material as a source electrode and a drain electrode generally formed of a metal material without using a layer formed of the same material as the anode, i.e., the uppermost layer of the pad electrode. However, metal materials, such as copper, generally used for the source electrode and the drain electrode may be washed away by an etchant used in an etching process for forming the anode.

Accordingly, in the organic light emitting display device 600 according to still another exemplary embodiment of the present disclosure, the second conductive layers 626 and 628 as the uppermost layers of the source electrode 623 and the drain electrode 624 of the thin film transistor 620 are formed of a material different from the material of the anode 137 in etching selectivity, and the pad electrode structure 650 is formed of the same material as the source electrode 623 and the drain electrode 624 of the thin film transistor 620 as described above. That is, the pad electrode structure 650 does not include an uppermost layer formed of the same material as the anode 137, and the second pad electrode 652 as an uppermost layer of the pad electrode structure 650 is formed of a material different from the material of the anode 137 in etching selectivity. Therefore, in a process of forming the anode 137 performed after the pad electrode structure 650 is formed, the second pad electrode 652 of the pad electrode structure 650 is not etched by an etchant used for forming the anode 137. Further, a material, such as polymerized transparent conductive oxide, titanium, and a molybdenum-titanium alloy, used for the second pad electrode 652 is not corroded even when in contact with air or water. Therefore, the reliability of the pad electrode structure 650 can be improved, and the reliability of the organic light emitting display device 600 can also be improved.

Further, in the organic light emitting display device 600 according to still another exemplary embodiment of the present disclosure, the passivation layer 614 is used to protect an edge of the first pad electrode 651 of the pad electrode structure 650 formed of copper, aluminum, or molybdenum against an etchant used in a process of etching the anode 137, so that the edge of the first pad electrode 651 is sealed. Therefore, it is possible to reduce damage to the first pad electrode 651 by the etchant during the process of etching the anode 137.

Figure 7:
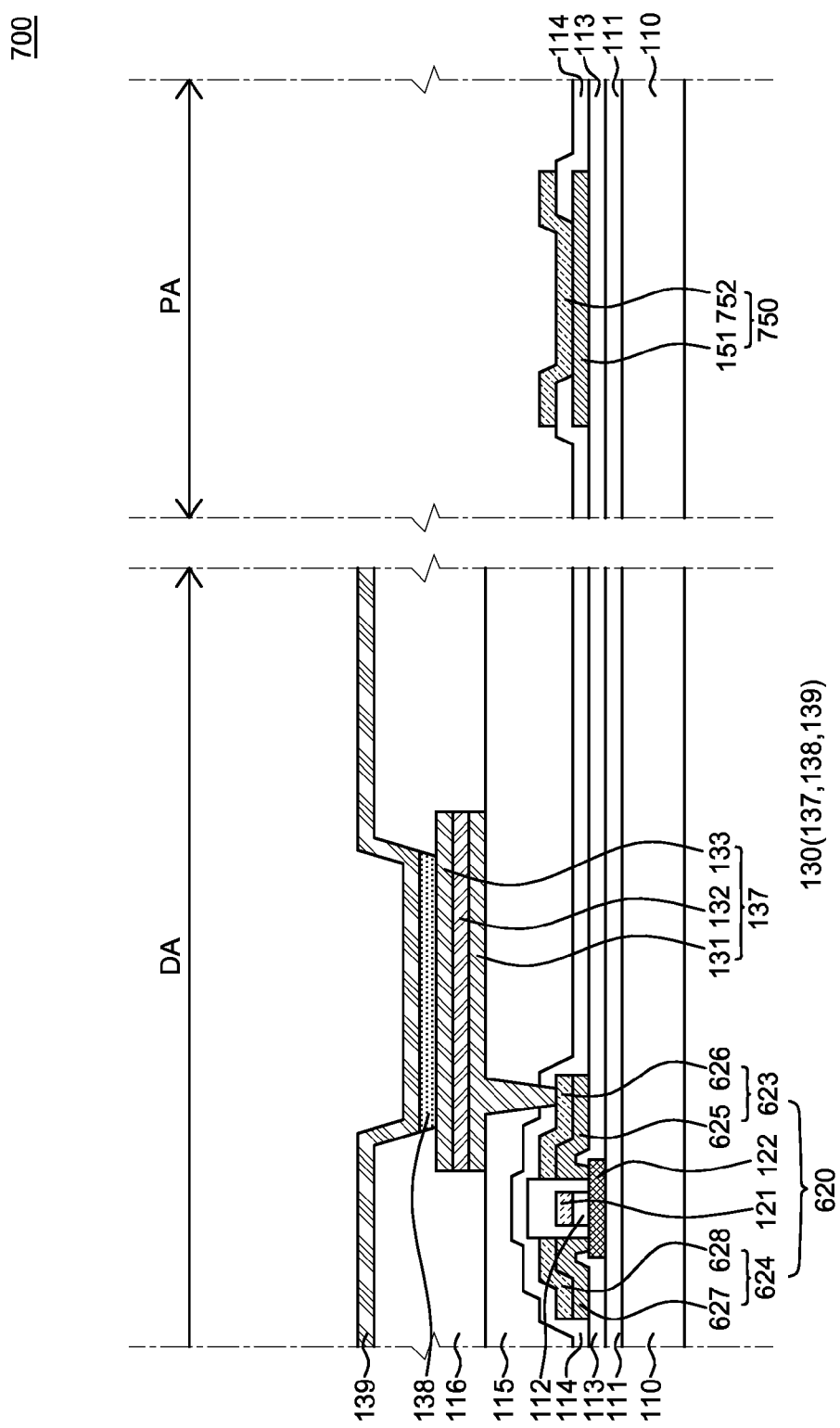

FIG. 7 is a schematic cross-sectional view of an organic light emitting display device according to still another exemplary embodiment of the present disclosure. An organic light emitting display device 700 illustrated in FIG. 7 is substantially the same as the organic light emitting display device 600 illustrated in FIG. 6 except for a shape of the passivation layer 114 and a shape and a position of the pad electrode structure 750, and, thus, redundant explanation thereof will be omitted.

The first pad electrode 151 of a pad electrode structure 750 is formed in the pad area PA, and the passivation layer 114 is formed to cover an edge of the first pad electrode 151. That is, the passivation layer 114 is formed to cover the lateral side and a part of the top side of the first pad electrode 151. A second pad electrode 752 of the pad electrode structure 750 is formed on the first pad electrode 151 and the passivation layer 114. An edge portion of the second pad electrode 752 is formed on the passivation layer 114, and a central portion of the second pad electrode 752 is electrically connected with the first pad electrode 151 through the contact hole formed in the passivation layer 114.

In the organic light emitting display device 700 according to still another exemplary embodiment of the present disclosure, the pad electrode structure 750 does not include an uppermost layer formed of the same material as the anode 137, and the second pad electrode 752 as an uppermost layer of the pad electrode structure 750 is formed of a material different from the material of the anode 137 in etching selectivity. Therefore, in a process of forming the anode 137 performed after the pad electrode structure 750 is formed, the second pad electrode 752 of the pad electrode structure 750 is not etched by an etchant used for forming the anode 137. Further, a material, such as polymerized transparent conductive oxide, titanium, and a molybdenum-titanium alloy, used for the second pad electrode 752 is not likely to be corroded even when being in contact with air or water. Therefore, the reliability of the pad electrode structure 750 can be improved, and the reliability of the organic light emitting display device 700 can also be improved.

Further, in the organic light emitting display device 700 according to still another exemplary embodiment of the present disclosure, the passivation layer 114 is used to seal the edge of the first pad electrode 151 in order to protect the edge of the first pad electrode 151 of the pad electrode structure 750 formed of copper, aluminum, or molybdenum against an etchant used in a process of etching the anode 137. Further, as described above, the second pad electrode 752 which is not etched by the etchant used for etching the anode 137 seals the top side of the first pad electrode 151.

Therefore, it is possible to reduce damage to the first pad electrode 151 by the etchant during the process of etching the anode 137.

Figure 8:
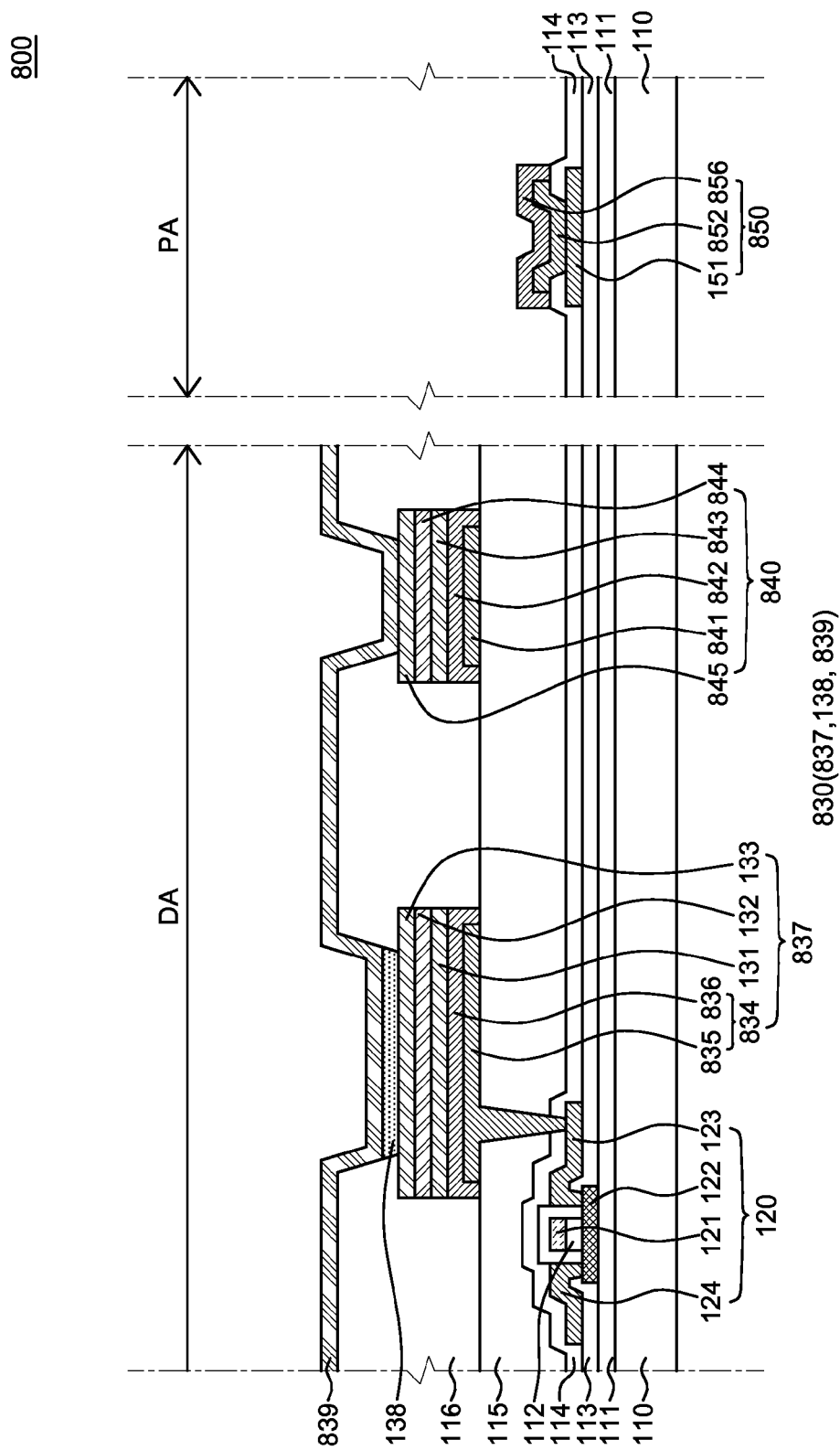

FIG. 8 is a schematic cross-sectional view of an organic light emitting display device according to still another exemplary embodiment of the present disclosure. An organic light emitting display device 800 illustrated in FIG. 8 is substantially the same as the organic light emitting display device 100 illustrated in FIG. 1 except that an organic light emitting element 830 and a pad electrode structure 850 are modified and a first auxiliary wiring 840 is added, and, thus, redundant explanation thereof will be omitted.

The organic light emitting element 830 is formed on the planarization layer 115. The organic light emitting element 830 includes an anode 837, the organic light emitting layer 138, and a cathode 839.

The anode 837 has a structure in which the lower ITO layer 131, the Ag alloy layer 132, and the upper ITO layer 133 are laminated and includes a dummy layer 834 (or similar structure) which is in contact with a rear side of the lower ITO layer 131 and electrically connected with the lower ITO layer 131. The dummy layer 834 is electrically connected with the thin film transistor 120 through the contact hole in the planarization layer 115. That is, the dummy layer 834 electrically connects the thin film transistor 120 with the lower ITO layer 131.

The dummy layer 834 includes a plurality of layers. Referring to FIG. 8, the dummy layer 834 includes a lower layer 835 and an upper layer 836. The lower layer 835 may have a structure in which a copper (Cu) layer is laminated on a molybdenum-titanium (MoTi) alloy layer, and the lower layer 835 may be formed of the same material as the source electrode 123 and the drain electrode 124. The upper layer 836 is formed on the lower layer 835 and may be formed to cover the lower layer 835 as illustrated in FIG. 2, but is not limited thereto. The upper layer 836 may be formed only on a top side of the lower layer 835. The upper layer 836 may be formed of a molybdenum-titanium (MoTi) alloy.

The first auxiliary wiring 840 is formed on the planarization layer 115. To be specific, the first auxiliary wiring 840 is positioned on the same plane as the anode 837 on the planarization layer 115. Referring to FIG. 8, the first auxiliary wiring 840 includes a first layer 841, a second layer 842 on the first layer 841, a third layer 843 on the second layer 842, a fourth layer 844 on the third layer 843, and a fifth layer 845 on the fourth layer 844. The first layer 841 of the first auxiliary wiring 840 may be formed of the same material as the lower layer 835 of the dummy layer 834 of the anode 837, the second layer 842 of the first auxiliary wiring 840 may be formed of the same material as the upper layer 836 of the dummy layer 834 of the anode 837, the third layer 843 of the first auxiliary wiring 840 may be formed of the same material as the lower ITO layer 131 of the anode 837, the fourth layer 844 of the first auxiliary wiring 840 may be formed of the same material as the Ag alloy layer 132 of the anode 837, and the fifth layer 845 of the first auxiliary wiring 840 may be formed of the same material as the upper ITO layer 133 of the anode 837.

A top-emission organic light emitting display device uses a transparent electrode or a transflective electrode as a cathode in order to upwardly emit light emitted from an organic light emitting layer. In order to obtain a sufficient transmittance of light passing through the cathode, the cathode needs to be formed to a very small thickness. Therefore, in order for the cathode to be transparent, the cathode is formed of ITO having sufficiently small thickness or an alloy of silver (Ag) and magnesium (Mg). However, a decrease in thickness of the cathode causes an increase in electrical resistance of the cathode. Thus, a decrease in thickness of the cathode causes a voltage drop (i.e. an IR drop) in a portion, particularly, a central portion, of the organic light emitting display device and also causes non-uniformity of luminance throughout a screen. In particular, the voltage drop is increased as a size of the display device is increased. Thus, in the organic light emitting display device 800 according to still another exemplary embodiment of the present disclosure, by employing the first auxiliary wiring 840 electrically connected with the cathode 839, it is possible to minimize a voltage drop in the top-emission organic light emitting display device 800.

The cathode 839 is formed on the organic light emitting layer 138. The cathode 839 is electrically connected with the first auxiliary wiring 840. FIG. 8 illustrates that a partial area of the first auxiliary wiring 840 is opened by the bank layer 116 and the cathode 839 and the first auxiliary wiring 840 are electrically connected with each other through the partial area, but is not limited thereto. The cathode 839 and the first auxiliary wiring 840 may be electrically connected with each other in various ways.

The pad electrode structure 850 is formed on the substrate 110 in the pad area PA. To be specific, the pad electrode structure 850 is formed on the interlayer insulating layer 113. The pad electrode structure 850 includes a plurality of pad electrodes. Referring to FIG. 2, the pad electrode structure 850 includes the first pad electrode 151, a second pad electrode 852 on the first pad electrode 151, and a third pad electrode 853 on the second pad electrode 852.

The first pad electrode 151 of the pad electrode structure 850 is formed of the same material as the source electrode 123 and the drain electrode 124 of the thin film transistor 120 formed in the display area DA.

The second pad electrode 852 in the pad area PA is formed to cover the first pad electrode 151 in the pad area PA. The second pad electrode 852 is electrically connected with the first pad electrode 151 through an opening of the passivation layer 114. The second pad electrode 852 may be formed of the same material as the lower layer 835 of the dummy layer 834 of the anode 837 and the first layer 841 of the first auxiliary wiring 840. That is, the second pad electrode 852 may have a structure in which a copper (Cu) layer is laminated on a molybdenum-titanium (MoTi) alloy layer.

The third pad electrode 853 in the pad area PA is formed to cover the first pad electrode 151 in the pad area PA. Further, the third pad electrode 853 in the pad area PA is formed to cover the second pad electrode 852 in the pad area PA. Referring to FIG. 8, the third pad electrode 853 is formed to cover a lateral side of the second pad electrode 852 in order not to expose the second pad electrode 852 to the outside. The third pad electrode 853 may be formed of the same material as the upper layer 836 of the dummy layer 834 of the anode 837 and the second layer 842 of the first auxiliary wiring 840. That is, the third pad electrode 853 may be formed of a molybdenum-titanium (MoTi) alloy layer.

In the organic light emitting display device 800 according to still another exemplary embodiment of the present disclosure, a conductive material used for the source electrode 123, the drain electrode 124, and the first auxiliary wiring 840 is used for the pad electrode structure 850 instead of the Ag alloy layer and the ITO layer used in the anode 837. Further, the third pad electrode 853 as an uppermost layer of the pad electrode structure 850 is formed to cover the first pad electrode 151 and the second pad electrode 852 of the pad electrode structure 850. In particular, the third pad electrode 853 is formed to cover all of a top side and a lateral side of the second pad electrode 852. Herein, a molybdenum-titanium (MoTi) alloy used as a material of the third pad electrode 853 covers the entire second pad electrode 852 in which an uppermost layer is formed of copper (Cu), so that the second pad electrode 852 is not washed away during a process of etching all of the upper ITO layer 133, the Ag alloy layer 132, and the lower ITO layer 131 of the anode 837. Further, it is possible to suppress a reaction of the second pad electrode 852 with moisture (water) or the like and thus suppress production of inferior defective pad electrode structure 850. Further, the second pad electrode 852 and the third pad electrode 853 of the pad electrode structure 850 are formed of the same material as the first auxiliary wiring 840, so that it is possible to more easily form the pad electrode structure 850.

Figure 9:
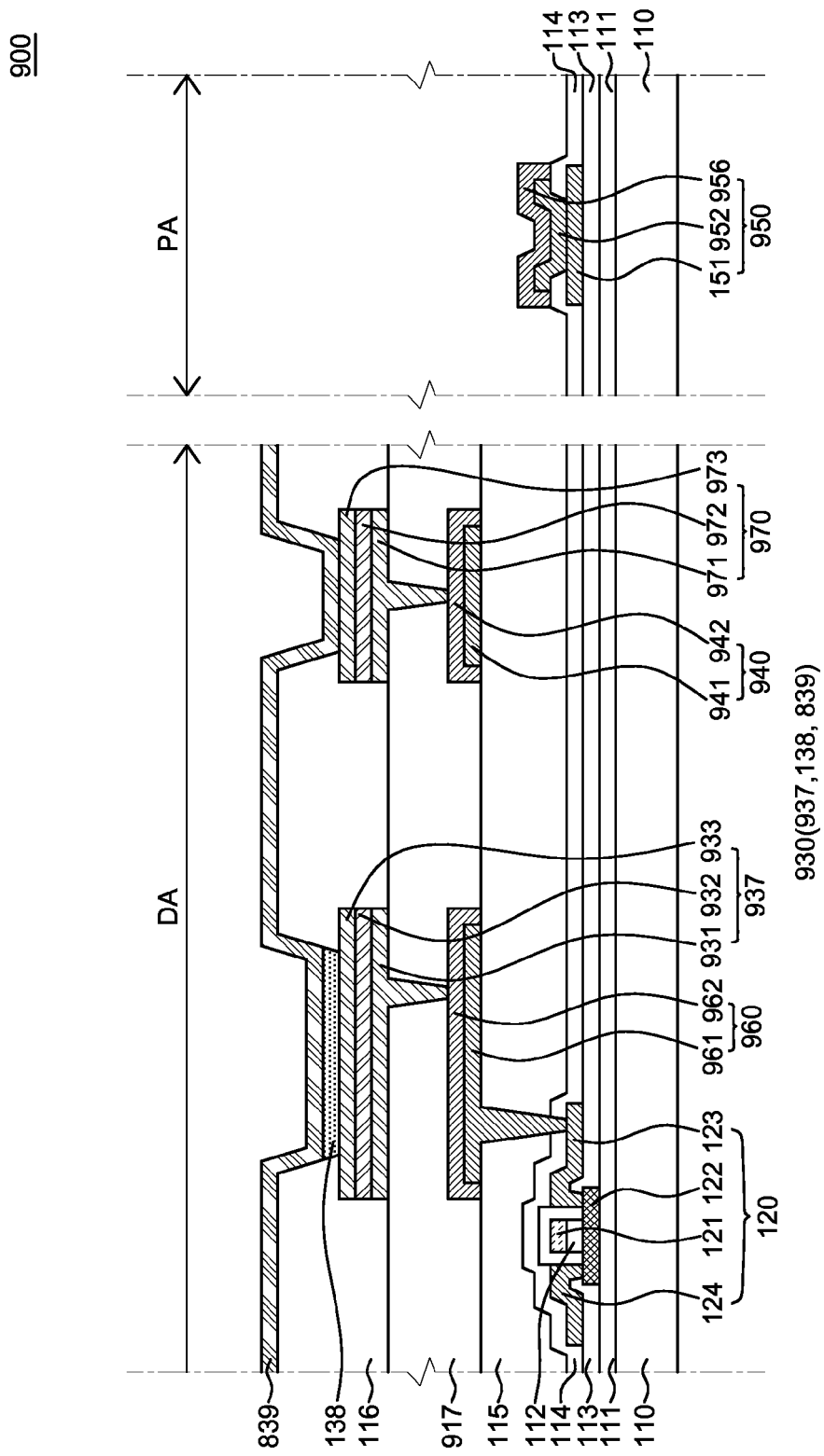

FIG. 9 is a schematic cross-sectional view of an organic light emitting display device according to still another exemplary embodiment of the present disclosure. An organic light emitting display device 900 illustrated in FIG. 9 is substantially the same as the organic light emitting display device 800 illustrated in FIG. 8 except that an anode 937, a dummy electrode 960 (or similar structure), and a first auxiliary wiring 940 are different and a second auxiliary wiring 270 and an additional planarization layer 917 are added, and, thus, redundant explanation thereof will be omitted.

Referring to FIG. 9, the dummy electrode 960 is formed on the planarization layer 115. The dummy electrode 960 is formed on a top side of the planarization layer 115 so as to electrically connect the thin film transistor 120 with the anode 937. The dummy electrode 960 includes a plurality of electrodes. Referring to FIG. 9, the dummy electrode 960 includes a lower dummy electrode 961 and an upper dummy electrode 962. The lower dummy electrode 961 may have a structure in which a copper (Cu) layer is laminated on a molybdenum-titanium (MoTi) alloy layer. The lower dummy electrode 961 may be formed of the same material as the source electrode 123 and the drain electrode 124. The upper dummy electrode 962 is formed on the lower dummy electrode 961, and may be formed to cover the lower dummy electrode 961 as illustrated in FIG. 9, but is not limited thereto. The upper dummy electrode 962 may be formed only on a top side of the lower dummy electrode 961. The upper dummy electrode 962 may be formed of a molybdenum-titanium (MoTi) alloy.

The first auxiliary wiring 940 is formed on the planarization layer 115. The first auxiliary wiring 940 is formed on the planarization layer 115 and formed of the same material on the same plane as the dummy electrode 960. The first auxiliary wiring 940 includes a first layer 941 and a second layer 942 on the first layer 941. The first layer 941 of the first auxiliary wiring 940 may be formed of the same material as the lower dummy electrode 961 of the dummy electrode 960, and the second layer 942 of the first auxiliary wiring 940 may be formed of the same material as the upper dummy electrode 962 of the dummy electrode 960.

The additional planarization layer 917 is formed on the dummy electrode 960 and the first auxiliary wiring 940. The additional planarization layer 917 is an insulating layer for planarizing an upper part of the dummy electrode 960 and the first auxiliary wiring 940. The additional planarization layer 917 may be formed of the same material as the planarization layer 115. The additional planarization layer 917 is formed only in the display area DA but not formed in the pad area PA.

The anode 937 of an organic light emitting element 930 is formed on the additional planarization layer 917. The anode 937 is formed on a top side of the additional planarization layer 917 and is electrically connected with a thin film transistor 920 through the dummy electrode 960. The anode 937 has a structure in which a lower ITO layer 931, an Ag alloy layer 932, and an upper ITO layer 933 are laminated.

A second auxiliary wiring 970 is formed on the additional planarization layer 917. To be specific, the second auxiliary wiring 970 is formed on the top side of the additional planarization layer 917 and electrically connected with the first auxiliary wiring 940. The second auxiliary wiring 970 includes a first layer 971, a second layer 972 on the first layer 971, and a third layer 973 on the second layer 972. The second auxiliary wiring 970 may be formed of the same material on the same plane as the anode 937. That is, the first layer 971 of the second auxiliary wiring 970 may be formed of the same material as the lower ITO layer 931 of the anode 937, the second layer 972 of the second auxiliary wiring 970 may be formed of the same material as the Ag alloy layer 932 of the anode 937, and the third layer 973 of the second auxiliary wiring 970 may be formed of the same material as the upper ITO layer 933 of the anode 937. In the organic light emitting display device 900 according to still another exemplary embodiment of the present disclosure, since the first auxiliary wiring 940 and the second auxiliary wiring 970 electrically connected with a cathode 939 are employed, it is possible to minimize a voltage drop in the top-emission organic light emitting display device 900, thereby securing a uniform image quality.

The bank layer 116 is formed on the additional planarization layer 917, and the organic light emitting layer 138 of the organic light emitting element 930 is formed on a partial area of the anode 937 opened by the bank layer 116. The cathode 839 of the organic light emitting element 930 is formed on the organic light emitting layer 138, and the cathode 839 is electrically connected with the second auxiliary wiring 970 through a partial area of the second auxiliary wiring 970 opened by the bank layer 916.

A pad electrode structure 950 is formed on the substrate 110 in the pad area PA. To be specific, the pad electrode structure 950 is formed on the interlayer insulating layer 113. The pad electrode structure 950 includes a plurality of pad electrodes. Referring to FIG. 3, the pad electrode structure 950 includes the first pad electrode 151, a second pad electrode 952 on the first pad electrode 151, and a third pad electrode 953 on the second pad electrode 952. The first pad electrode 151 of the pad electrode structure 950 is formed of the same material as the source electrode 123 and the drain electrode 124 of the thin film transistor 920 formed in the display area DA. The second pad electrode 952 in the pad area PA is formed of the same material as the lower dummy electrode 961 of the dummy electrode 960 and the first layer 941 of the first auxiliary wiring 940. Further, the third pad electrode 953 in the pad area PA is formed of the same material as the upper dummy electrode 962 of the dummy electrode 960 and the second layer 942 of the first auxiliary wiring 940. The pad electrode structure 950 illustrated in FIG. 9 is substantially the same as the pad electrode structure 850 illustrated in FIG. 8 except for a component formed of the same material as the second pad electrode 952 and the third pad electrode 953 of the pad electrode structure 950, and, thus, redundant explanation thereof will be omitted.

In the organic light emitting display device 900 according to still another exemplary embodiment of the present disclosure, the Ag alloy layer used in the anode 937 and ITO layer are not used as the pad electrode structure 950. However, a conductive material which is identical in materials to the source electrode 123 and the drain electrode 124 used as the first auxiliary wiring 940 is used as the pad electrode structure 950. Further, the third pad electrode 953 as an uppermost layer of the pad electrode structure 950 is formed to cover the first pad electrode 151 and the second pad electrode 952 of the pad electrode structure 950. In particular, the third pad electrode 953 is formed to cover all of a top side and a lateral side of the second pad electrode 952. Herein, a molybdenum-titanium (MoTi) alloy used as a material of the third pad electrode 953 covers the entire second pad electrode 952 in which an uppermost layer is formed of copper (Cu), so that the second pad electrode 952 is not washed away during a process of etching all of the upper ITO layer 933, the Ag alloy layer 932, and the lower ITO layer 931 of the anode 937. It is possible to suppress a reaction of the second pad electrode 952 with water or the like and thus suppress production of a defective second pad electrode structure 950. Further, the second pad electrode 952 and the third pad electrode 953 of the pad electrode structure 950 are formed of the same material as the first auxiliary wiring 940, so that it is possible to more easily form the pad electrode structure 950.

Figure 10:
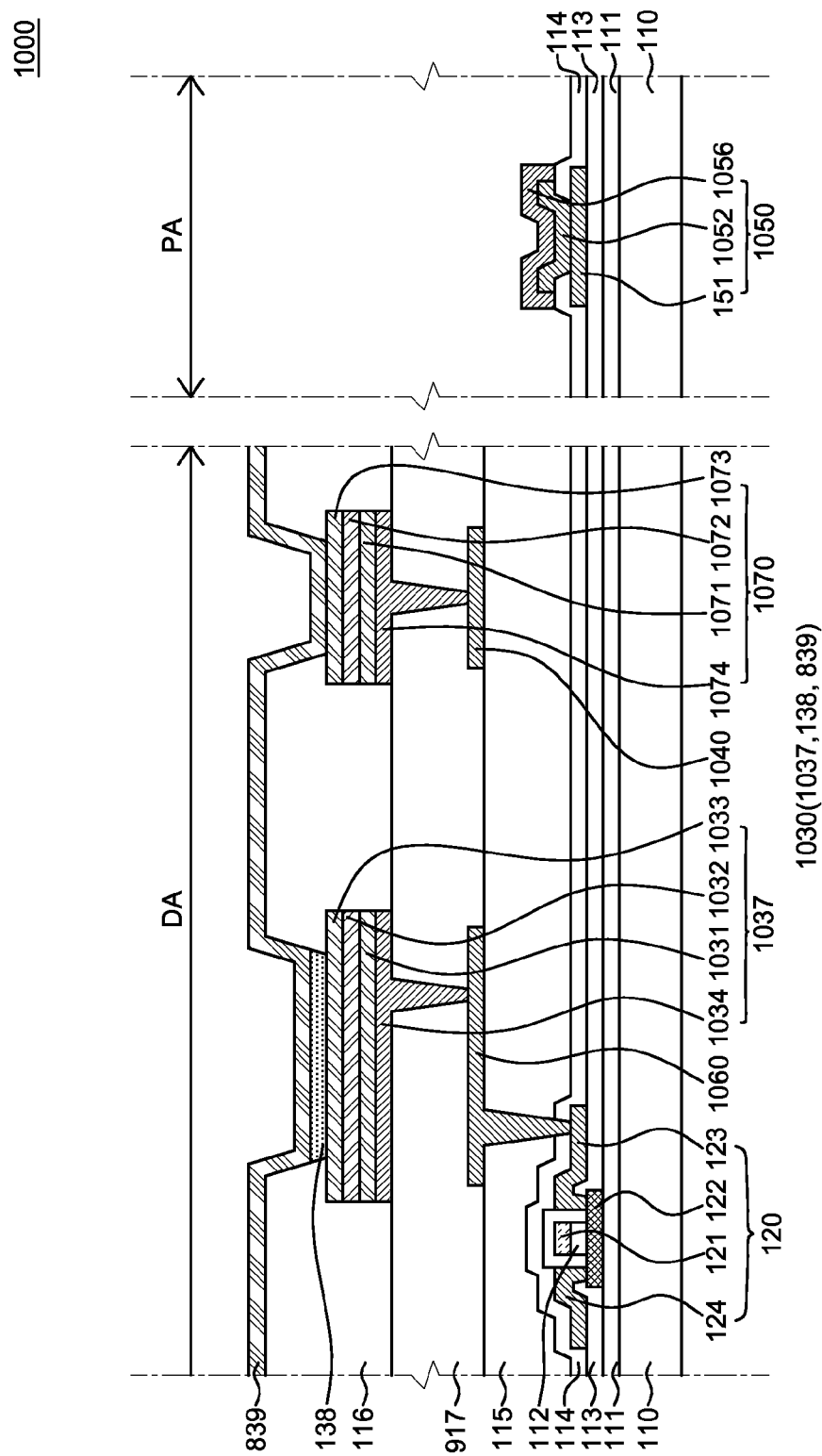

FIG. 10 is a schematic cross-sectional view of an organic light emitting display device according to still another exemplary embodiment of the present disclosure. An organic light emitting display device 1000 illustrated in FIG. 10 is substantially the same as the organic light emitting display device 900 illustrated in FIG. 9 except for an anode 1037, a dummy electrode 1060, a first auxiliary wiring 1040, and a second auxiliary wiring 1070, and, thus, redundant explanation thereof will be omitted.

Referring to FIG. 10, the dummy electrode 1060 is formed on the planarization layer 115. The dummy electrode 1060 is formed on a top side of the planarization layer 115 so as to electrically connect the thin film transistor 120 with the anode 1037. The dummy electrode 1060 includes a single electrode. The dummy electrode 1060 may have a structure in which a molybdenum-titanium (MoTi) alloy layer, a copper (Cu) layer, and a molybdenum-titanium (MoTi) alloy layer are laminated, and the dummy electrode 1060 may be formed of the same material as the source electrode 123 and the drain electrode 124.

The first auxiliary wiring 1040 is formed on the planarization layer 115. The first auxiliary wiring 1040 is formed on a top side of the planarization layer 115 and is formed of the same material on the same plane as the dummy electrode 1060. The first auxiliary wiring 1040 is formed of a single layer. The first auxiliary wiring 1040 may be formed of the same material as the dummy electrode 1060.

The additional planarization layer 917 is formed on the dummy electrode 1060 and the first auxiliary wiring 1040. The additional planarization layer 917 is an insulating layer for planarizing an upper part of the dummy electrode 1060 and the first auxiliary wiring 1040. The additional planarization layer 917 may be formed of the same material as a planarization layer 1015. The additional planarization layer 917 is formed only in the display area DA but not formed in the pad area PA.

The anode 1037 of an organic light emitting element 1030 is formed on the additional planarization layer 917. The anode 1037 is formed on a top side of the additional planarization layer 917 and is electrically connected with a thin film transistor 1020 through the dummy electrode 1060. The anode 1037 has a structure in which a dummy layer 1034, a lower ITO layer 1031, an Ag alloy layer 1032, and an upper ITO layer 1033 are laminated. The dummy layer 1034 of the anode 1037 is formed to be in contact with a rear side of the lower ITO layer 1031 and is electrically connected with the dummy electrode 1060. The dummy layer 1034 of the anode 1037 may be formed of a molybdenum-titanium (MoTi) alloy.

The second auxiliary wiring 1070 is formed on the additional planarization layer 917. To be specific, the second auxiliary wiring 1070 is formed on the top side of the additional planarization layer 917 and electrically connected with the first auxiliary wiring 1040. The second auxiliary wiring 1070 includes a first layer 1071, a second layer 1072 on the first layer 1071, a third layer 1073 on the second layer 1072, and a fourth layer 1074 on the third layer 1073. The second auxiliary wiring 1070 may be formed of the same material on the same plane as the anode 1037. That is, the first layer 1071 of the second auxiliary wiring 1070 may be formed of the same material as the lower ITO layer 1031 of the anode 1037, the second layer 1072 of the second auxiliary wiring 1070 may be formed of the same material as the Ag alloy layer 1032 of the anode 1037, the third layer 1073 of the second auxiliary wiring 1070 may be formed of the same material as the upper ITO layer 1033 of the anode 1037, and the fourth layer 1074 of the second auxiliary wiring 1070 may be formed of the same material as the dummy layer 1034 of the anode 1037. In the organic light emitting display device 1000 according to still another exemplary embodiment of the present disclosure, since the first auxiliary wiring 1040 and the second auxiliary wiring 1070 electrically connected with a cathode 1039 are employed, it is possible to solve non-uniformity of luminance in the top-emission organic light emitting display device 1000, thereby securing a uniform image quality.

The bank layer 116 is formed on the additional planarization layer 917, and the organic light emitting layer 138 of the organic light emitting element 1030 is formed on a partial area of the anode 1037 opened by the bank layer 116. The cathode 839 of the organic light emitting element 1030 is formed on the organic light emitting layer 138, and the cathode 839 is electrically connected with the second auxiliary wiring 1070 through a partial area of the second auxiliary wiring 1070 opened by the bank layer 916.

A pad electrode structure 1050 is formed on the substrate 110 in the pad area PA. To be specific, the pad electrode structure 1050 is formed on the interlayer insulating layer 113. The pad electrode structure 1050 includes the first pad electrode 151, a second pad electrode 1052 on the first pad electrode 151, and a third pad electrode 1053 on the second pad electrode 1052. The first pad electrode 151 of the pad electrode structure 1050 is formed of the same material as the source electrode 123 and the drain electrode 124 of the thin film transistor 1020 formed in the display area DA. The second pad electrode 1052 in the pad area PA is formed of the same material as the dummy electrode 1060 and the first auxiliary wiring 1040, and the third pad electrode 1053 in the pad area PA is formed of the same material as the dummy layer 1034 of the anode 1037 and the fourth layer 1074 of the second auxiliary wiring 1070. The pad electrode structure 1050 illustrated in FIG. 10 is substantially the same as the pad electrode structure 350 illustrated in FIG. 3 except for a component formed of the same material as the second pad electrode 1052 and the third pad electrode 1053 of the pad electrode structure 1050, and, thus, redundant explanation thereof will be omitted.

In the organic light emitting display device 1000 according to still another exemplary embodiment of the present disclosure, the same material as a source electrode 1023 and a drain electrode 1024 and a conductive material used for the first auxiliary wiring 1040 are used for the pad electrode structure 1050 instead of the Ag alloy layer 1032 and the ITO layer used in the anode 1037. Further, the third pad electrode 1053 as an uppermost layer of the pad electrode structure 1050 is formed to cover the first pad electrode 151 and the second pad electrode 1052 of the pad electrode structure 1050. In particular, the third pad electrode 1053 is formed to cover all of a top side and a lateral side of the second pad electrode 1052. Herein, as a molybdenum-titanium (MoTi) alloy used as a material of the third pad electrode 1053 covers the entire second pad electrode 1052 in which an uppermost layer is formed of copper (Cu), the second pad electrode 1052 is not washed away during a process of etching all of the upper ITO layer 1033, the Ag alloy layer 1032, and the lower ITO layer 1031 of the anode 1037. Further, it is possible to suppress a reaction of the second pad electrode 1052 with water or the like and thus suppress production of inferior defective second pad electrode structure 1050. Further, the second pad electrode 1052 and the third pad electrode 1053 of the pad electrode structure 1050 are formed of the same material as the first auxiliary wiring 1040 and the second auxiliary wiring 1070, so that it is possible to more easily form the pad electrode structure 1050.

Figure 11:
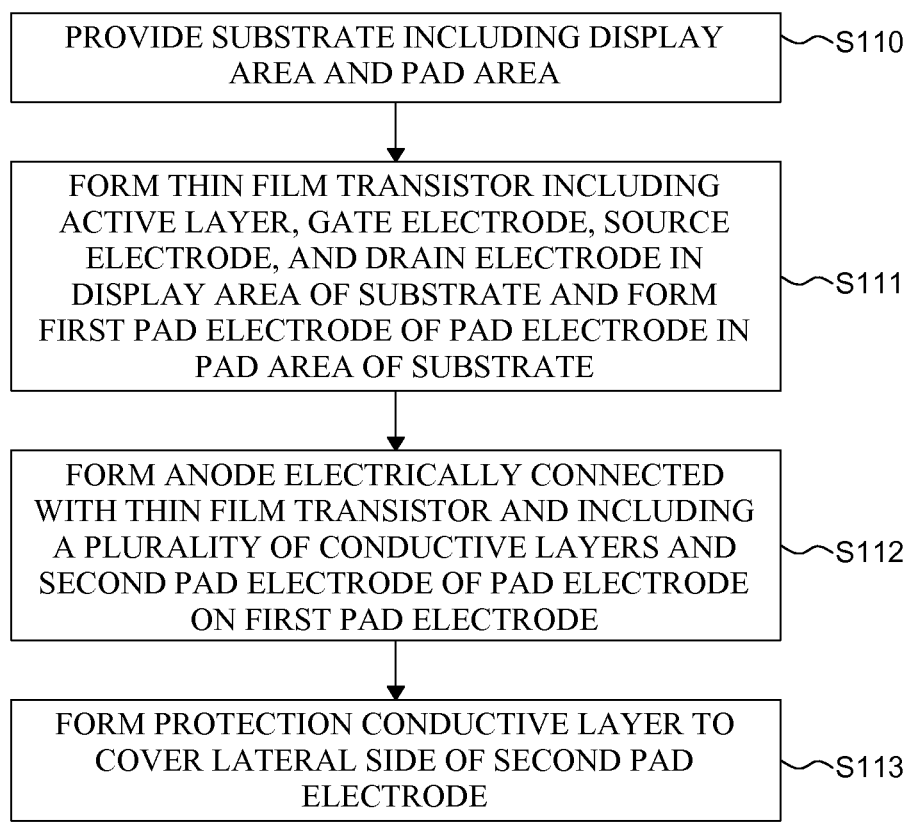
FIG. 11 is a flowchart for describing a method of manufacturing an organic light emitting display device according to an exemplary embodiment of the present disclosure.

FIG. 11 is a flowchart for describing a method of manufacturing an organic light emitting display device according to an exemplary embodiment of the present disclosure. FIG. 12*a* to FIG. 12*d* are schematic process cross-sectional views for describing a method of manufacturing an organic light emitting display device according to an exemplary embodiment of the present disclosure. FIG. 12*a* to FIG. 12*d* are process cross-sectional views for describing a method of manufacturing the organic light emitting display device 300 illustrated in FIG. 3, and, thus, redundant explanation of the components described above with reference to FIG. 3 will be omitted.

First, the substrate 110 including the display area DA and the pad area PA is provided (S110), and the thin film transistor 120 including the active layer 122, the gate electrode 121, the source electrode 123, and the drain electrode 124 is formed in the display area DA of the substrate 110. Further, the first pad electrode 151 of the pad electrode (structure) 150 is formed in the pad area PA of the substrate 110 (S111).

Figure 12A:
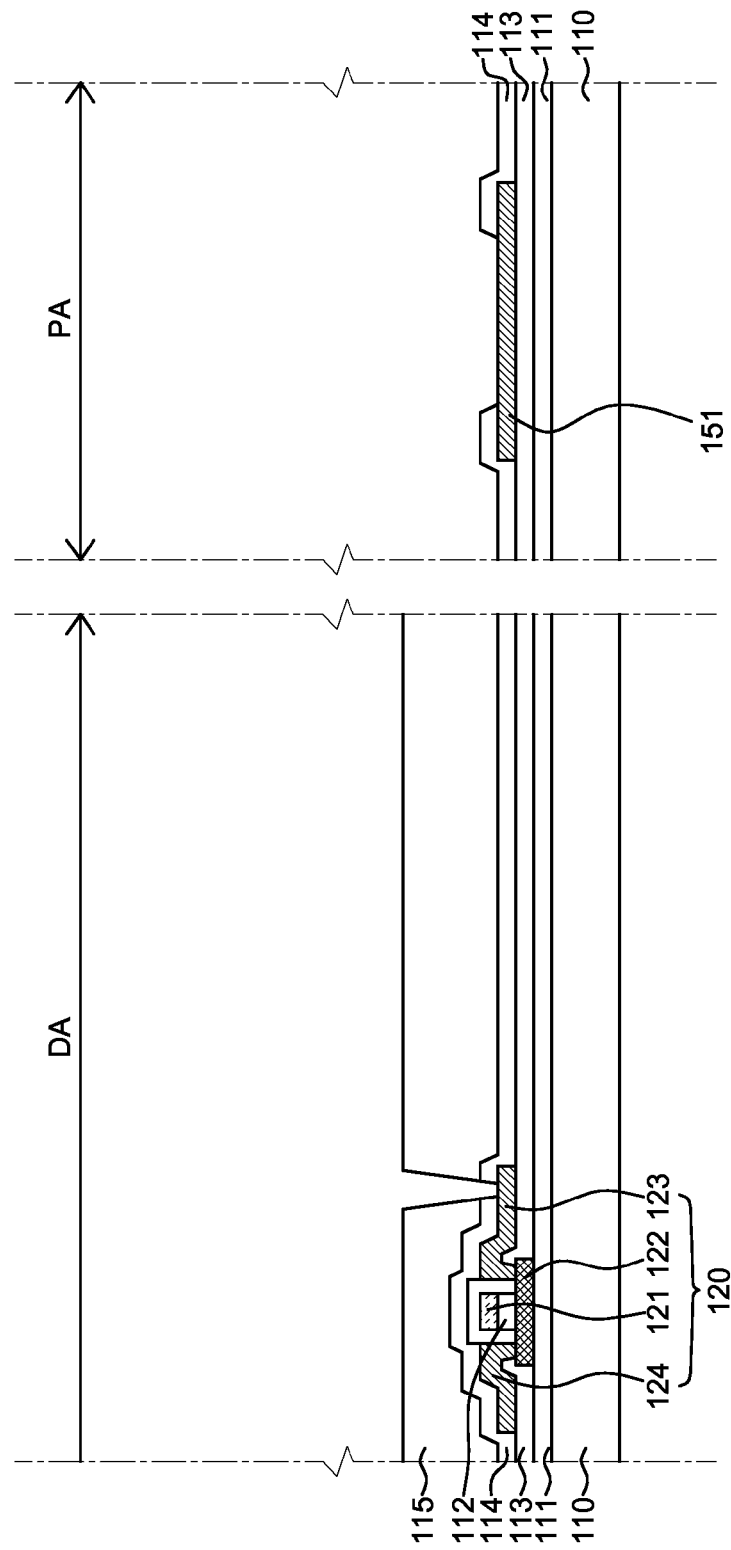
FIG. 12a to FIG. 12d are schematic process cross-sectional views for describing a method of manufacturing an organic light emitting display device according to an exemplary embodiment of the present disclosure.

Referring to FIG. 12*a*, the thin film transistor 120 is formed on the display area DA of the substrate 110. The active layer 122 is formed on the buffer layer 111, and the gate insulating layer 112 and the gate electrode 121 are formed on the active layer 122. When the gate insulating layer 112 and the gate electrode 121 are formed, a material for a gate insulating layer and a material for a gate electrode are formed on the entire surface of the substrate 110. Then, the gate insulating layer 112 and the gate electrode 121 are formed by patterning the material for a gate insulating layer and the material for a gate electrode at the same time. The interlayer insulating layer 113 is formed on the gate insulating layer 112 and the gate electrode 121. The interlayer insulating layer 113 is formed on the display area DA and the pad area PA. A contact hole for electrically connecting the source electrode 123 and the drain electrode 124 with the active layer 122 is formed in the interlayer insulating layer 113. Then, a material for a source electrode and a drain electrode is formed on the entire surface of the substrate 110, and the source electrode 123 and the drain electrode 124 are formed by patterning the material for a source electrode and a drain electrode. At this time, the first pad electrode 151 of the pad electrode (structure) 150 is formed on the pad area PA of the substrate 110. That is, when the material for a source electrode and a drain electrode formed on the entire surface of the substrate 110 is patterned, the first pad electrode 151 of the pad electrode (structure) 150 is left in the pad area PA, so that the source electrode 123, the drain electrode 124, and the first pad electrode 151 of the pad electrode (structure) 150 can be formed of the same material at the same time.

Then, the passivation layer 114 for protecting the thin film transistor 120 is formed on the thin film transistor 120. The passivation layer 114 is formed on both of the display area DA and the pad area PA. When the passivation layer 114 is formed, a material for a passivation layer is formed to cover the first pad electrode 151 and then, a contact hole for opening a top side of the first pad electrode 151 is formed in the passivation layer 114 by patterning the material for a passivation layer.

Then, the planarization layer 115 for planarizing an upper part of the thin film transistor 120 is formed on the passivation layer 114. The planarization layer 115 is formed only in the display area DA of the substrate 110. After the planarization layer 115 is formed, a contact hole for electrically connecting the anode 137 with the source electrode 123 of the thin film transistor 120 is formed in the planarization layer 115 and the passivation layer 114. That is, the contact holes can be formed in the planarization layer 115 and the passivation layer 114 at the same time.

Then, the anode 137 electrically connected with the thin film transistor 120 and including a plurality of conductive layers is formed, and the second pad electrode 152 of the pad electrode (structure) 150 is formed on the first pad electrode 151 (S112).

Figure 12B:
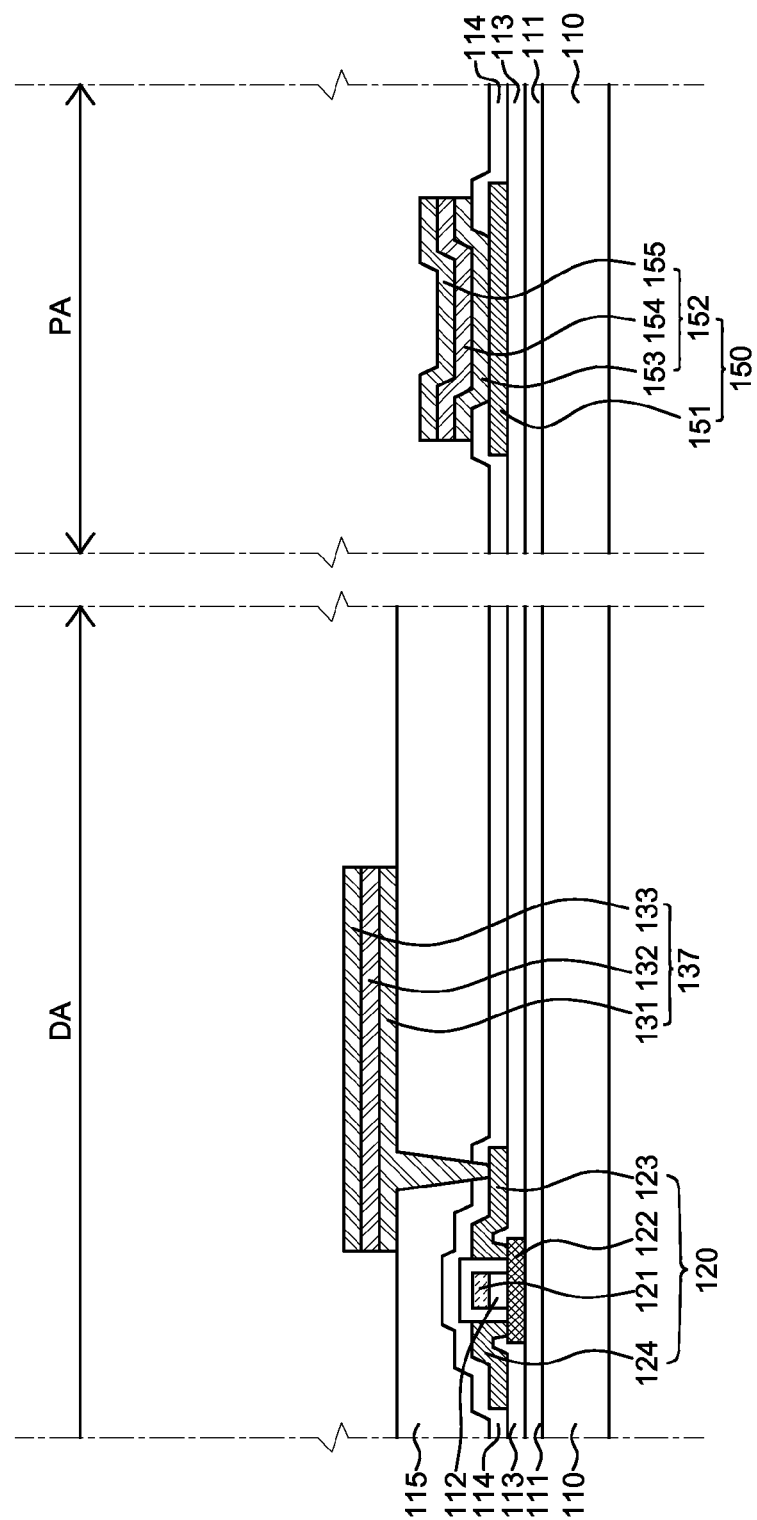

In order to form the anode 137 and the second pad electrode 152, an ITO material, an Ag alloy material, and an ITO material are formed in sequence on the entire surface of the substrate 110. That is, the ITO material, the Ag alloy material, and the ITO material are formed in the display area DA of the substrate 110 and are also formed in the pad area PA of the substrate 110. Thereafter, by etching the ITO material, the Ag alloy material, and the ITO material, the anode 137 and the second pad electrode 152 are formed at the same time as illustrated in FIG. 12*b*. The anode 137 is formed on the planarization layer 115 so as to be electrically connected with the source electrode 123 of the thin film transistor 120. The second pad electrode 152 is formed on the first pad electrode 151 and the passivation layer 114 so as to be electrically connected with the first pad electrode 151.

Then, the protection conductive layer 180 is formed to cover a lateral side of the second pad electrode 152 (S113).

Figure 12C:
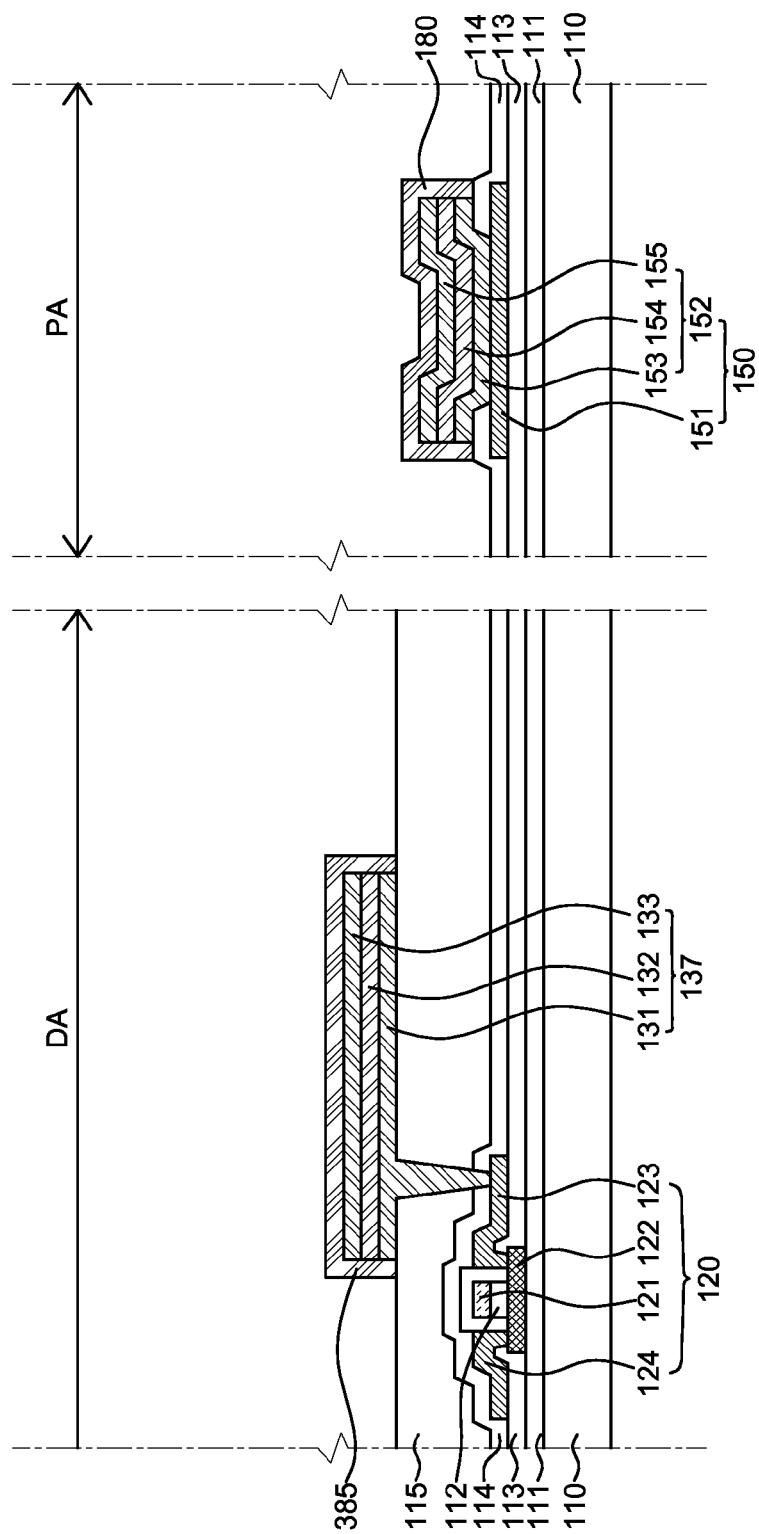

In order to form the protection conductive layer 180, a material for a protection conductive layer is formed on the entire surface of the substrate 110. That is, the material for a protection conductive layer is formed in the pad area PA of the substrate 110 and also in the display area DA of the substrate 110. Thereafter, by etching the material for a protection conductive layer, the protection conductive layer 180 is formed to cover the lateral side of the second pad electrode 152 and a top side of the second pad electrode 152 as illustrated in FIG. 12*c*. In some exemplary embodiments, the protection conductive layer 180 may be formed to cover a part of the top side of the second pad electrode 152 and the lateral side of the second pad electrode 152 as illustrated in FIG. 4.

The dummy layer 385 configured to cover the anode 137 may be formed of the same material as the protection conductive layer 180 at the same time when the protection conductive layer 180 is formed. That is, when the material for a protection conductive layer formed in the pad area PA of the substrate 110 and also in the display area DA of the substrate 110 is etched, the material for a protection conductive layer is left to cover the anode 137, so that the dummy layer 385 configured to cover the anode 137 and the protection conductive layer 180 can be formed at the same time as illustrated in FIG. 12c. If the dummy layer 385 is formed, the material for a protection conductive layer may be transparent conductive oxide.

Although not illustrated in FIG. 12c, the dummy layer 385 may not be formed when the protection conductive layer 180 is formed, as described above with reference to FIG. 1 and FIG. 2. If the dummy layer 385 is not formed but only the protection conductive layer 180 is formed, the material for a protection conductive layer may be one of transparent conductive oxide, molybdenum, and a molybdenum alloy.

Figure 12D:
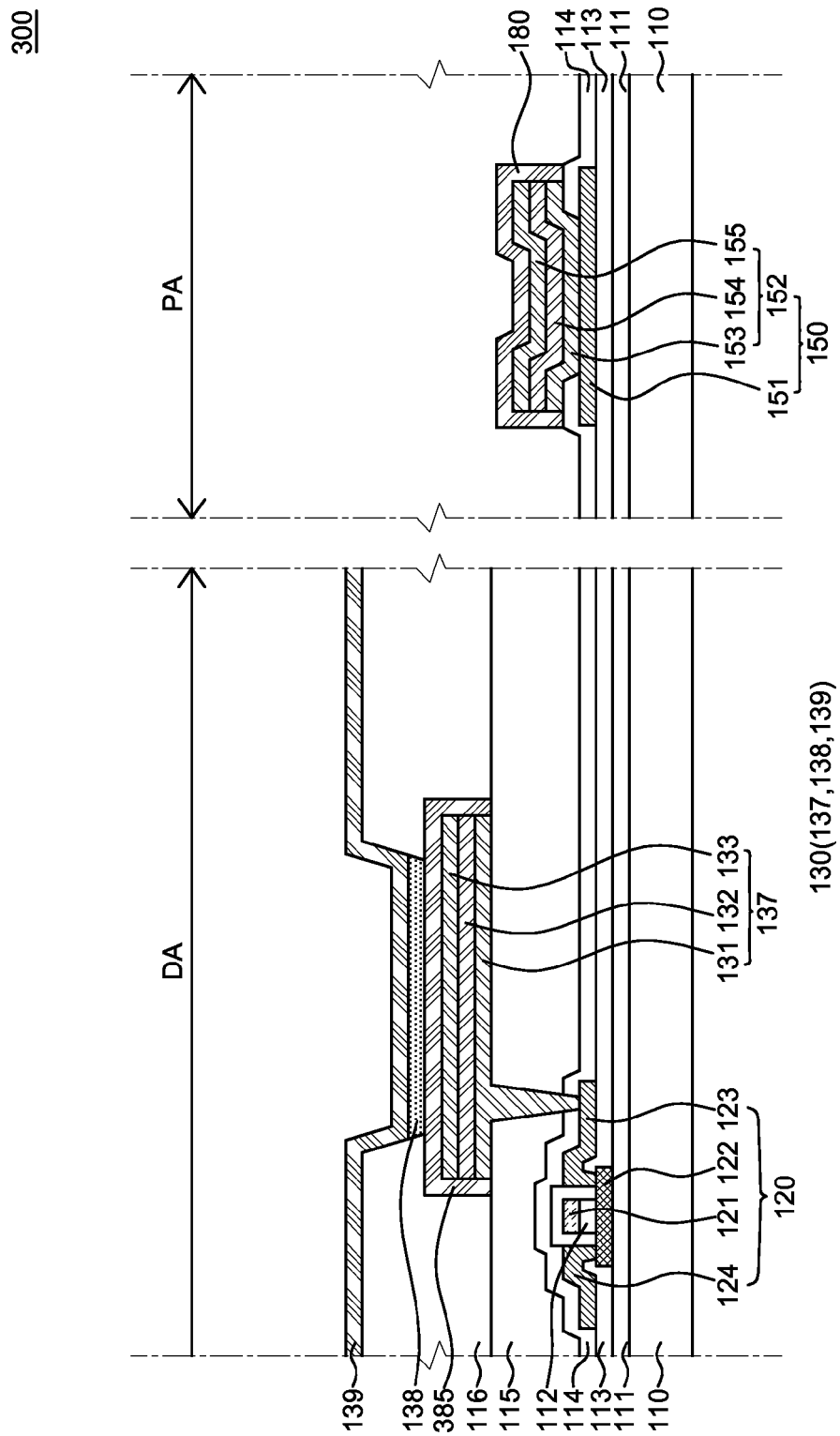

Then, referring to FIG. 12d, the bank layer 116 is formed to cover an edge of the anode 137, and the organic light emitting layer 138 and the cathode 139 are formed in sequence on the anode 137.

In the method of manufacturing an organic light emitting display device according to an exemplary embodiment of the present disclosure, the protection conductive layer 180 configured to reduce a contact of air or water with the second conductive layer 154 of the second pad electrode 152 formed of the same material as the anode 137 is formed. Thus, it is possible to minimize corrosion or damage to the pad electrode (structure) 150 and also possible to improve the reliability of the organic light emitting display device 300.

Further, in the method of manufacturing an organic light emitting display device according to an exemplary embodiment of the present disclosure, the dummy layer 385 configured to cover the anode 137 is formed at the same time when the protection conductive layer 180 is formed. When the protection conductive layer 180 is formed, the material for a protection conductive layer formed on the anode 137 can be removed by etching. However, if the material for a protection conductive layer is formed of the same material as the anode 137, it may be difficult to accurately remove the material for a protection conductive layer formed on the anode 137. Thus, in the method of manufacturing an organic light emitting display device according to an exemplary embodiment of the present disclosure, during a process of removing the material for a protection conductive layer, not only the protection conductive layer 180 but also the dummy layer 385 are formed. Therefore, it is possible to provide a manufacturing process to be more easily realized.

FIG. 13a to FIG. 13d are schematic process cross-sectional views for describing a method of manufacturing an organic light emitting display device according to another exemplary embodiment of the present disclosure. FIG. 13a to FIG. 13d are schematic process cross-sectional views for describing a method of manufacturing the organic light emitting display device 500 illustrated in FIG. 5, and, thus, redundant explanation of the components described above with reference to FIG. 5 will be omitted. Hereinafter, in order to omit the redundant explanation, a process after the anode and the pad electrode illustrated in FIG. 12b are formed will be mainly described.

Figure 13A:
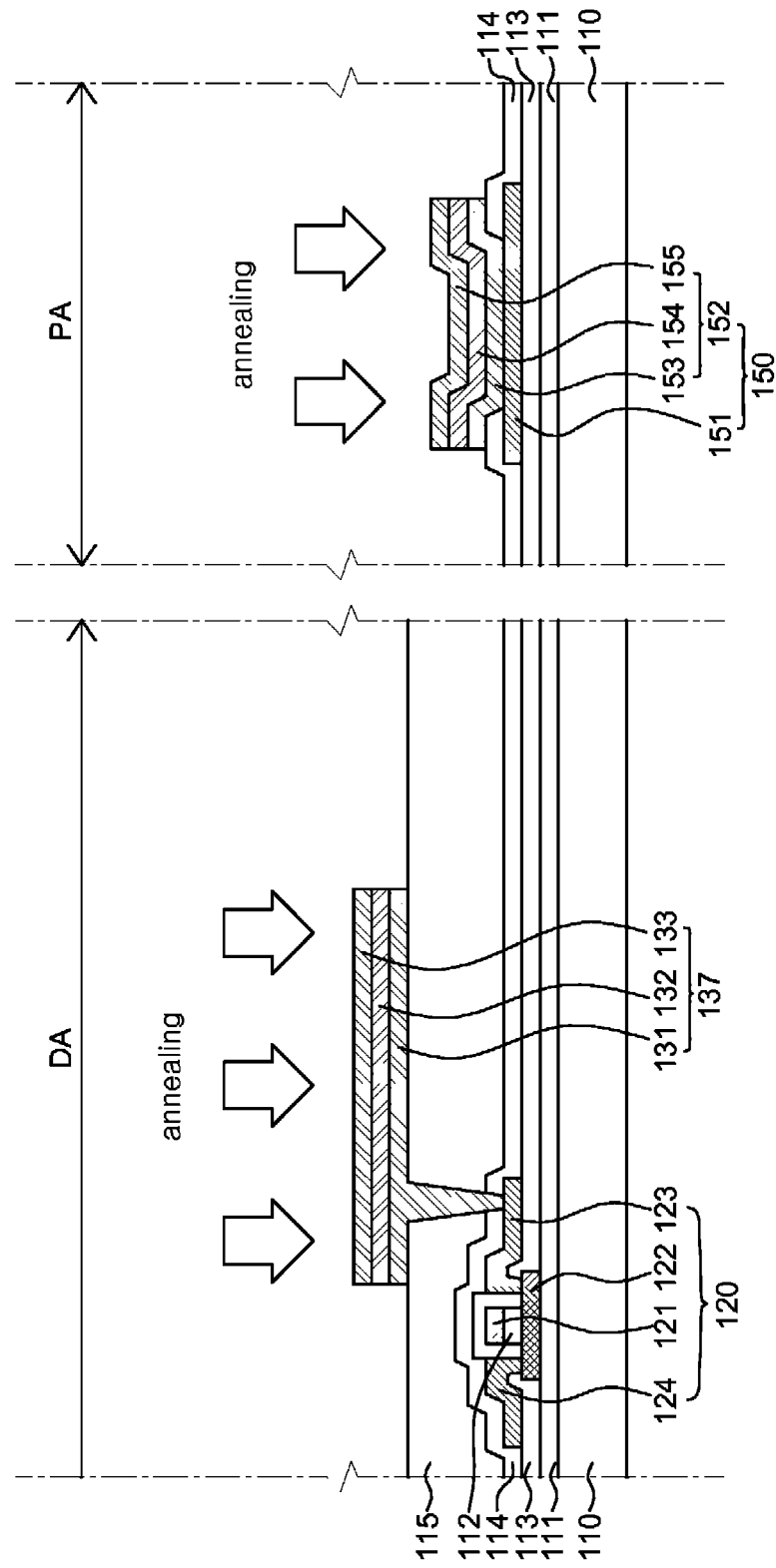
FIG. 13a to FIG. 13d are schematic process cross-sectional views for describing a method of manufacturing an organic light emitting display device according to another exemplary embodiment of the present disclosure.

Referring to FIG. 13a, before the protection conductive layer 180 is formed, the anode 537 and the second pad electrode 552 may be annealed. That is, after the ITO material, the Ag alloy material, and the ITO material are formed in the display area DA of the substrate 110 and the pad area PA of the substrate 110, the ITO material, the Ag alloy material, and the ITO material are etched, so that the anode 537 and the second pad electrode 552 may be formed at the same time. Then, the anode 537 and the second pad electrode 552 may be annealed.

Figure 13B:
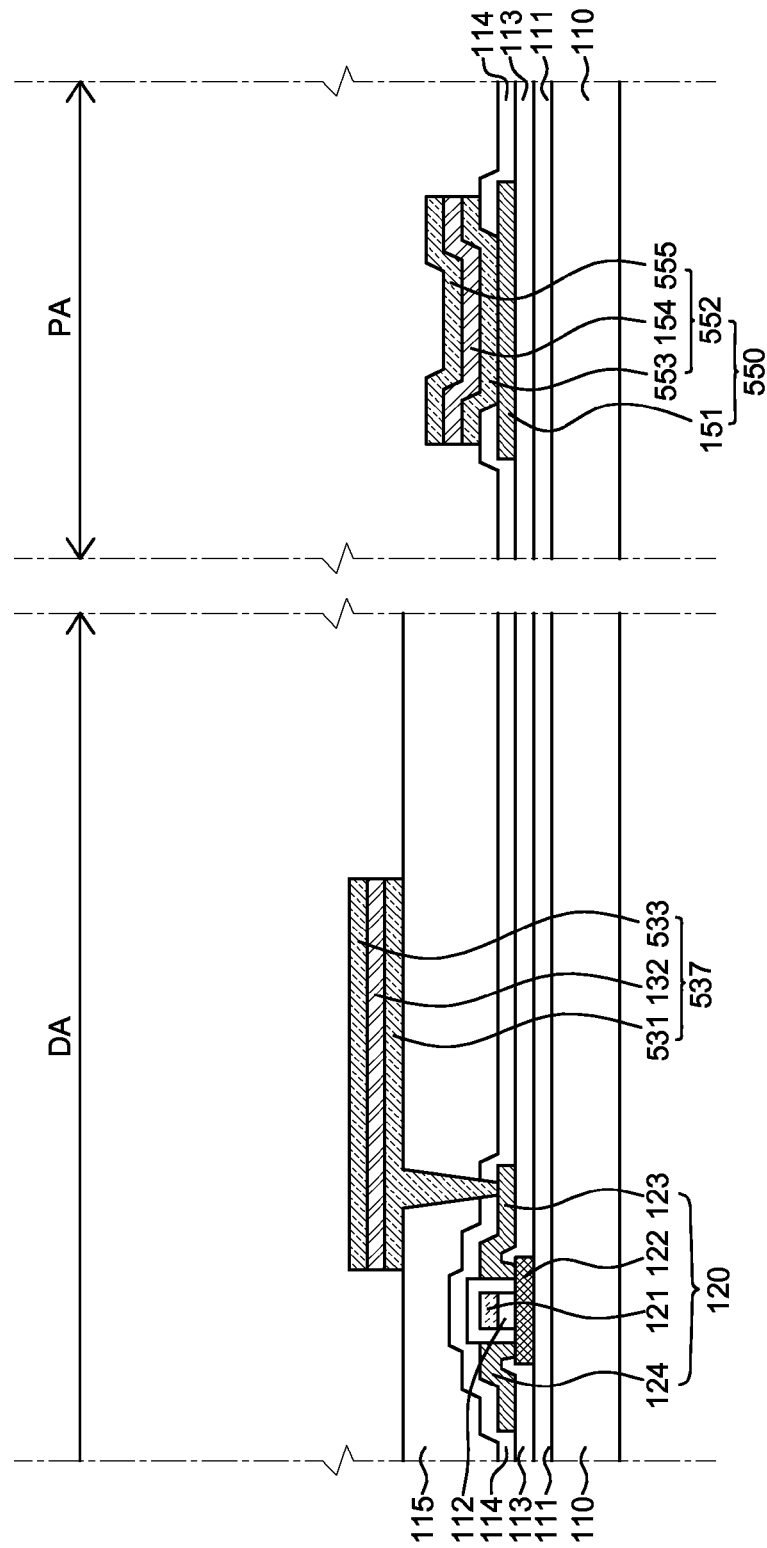

After the annealing process is completed, as illustrated in FIG. 13b, the lower ITO layer 131 and the upper ITO layer 133 of the anode 537 are polymerized, so that the anode 537 comprises the lower poly-ITO layer 531, the Ag alloy layer 132, and the upper poly-ITO layer 533. Further, the first conductive layer 533 and the third conductive layer 555 of the second pad electrode 552 are polymerized, so that the first conductive layer 553 of the second pad electrode 552 is formed of the same material as the lower poly-ITO layer 531 and the third conductive layer 555 of the second pad electrode 552 is formed of the same material as the upper poly-ITO layer 533.

Figure 13C:
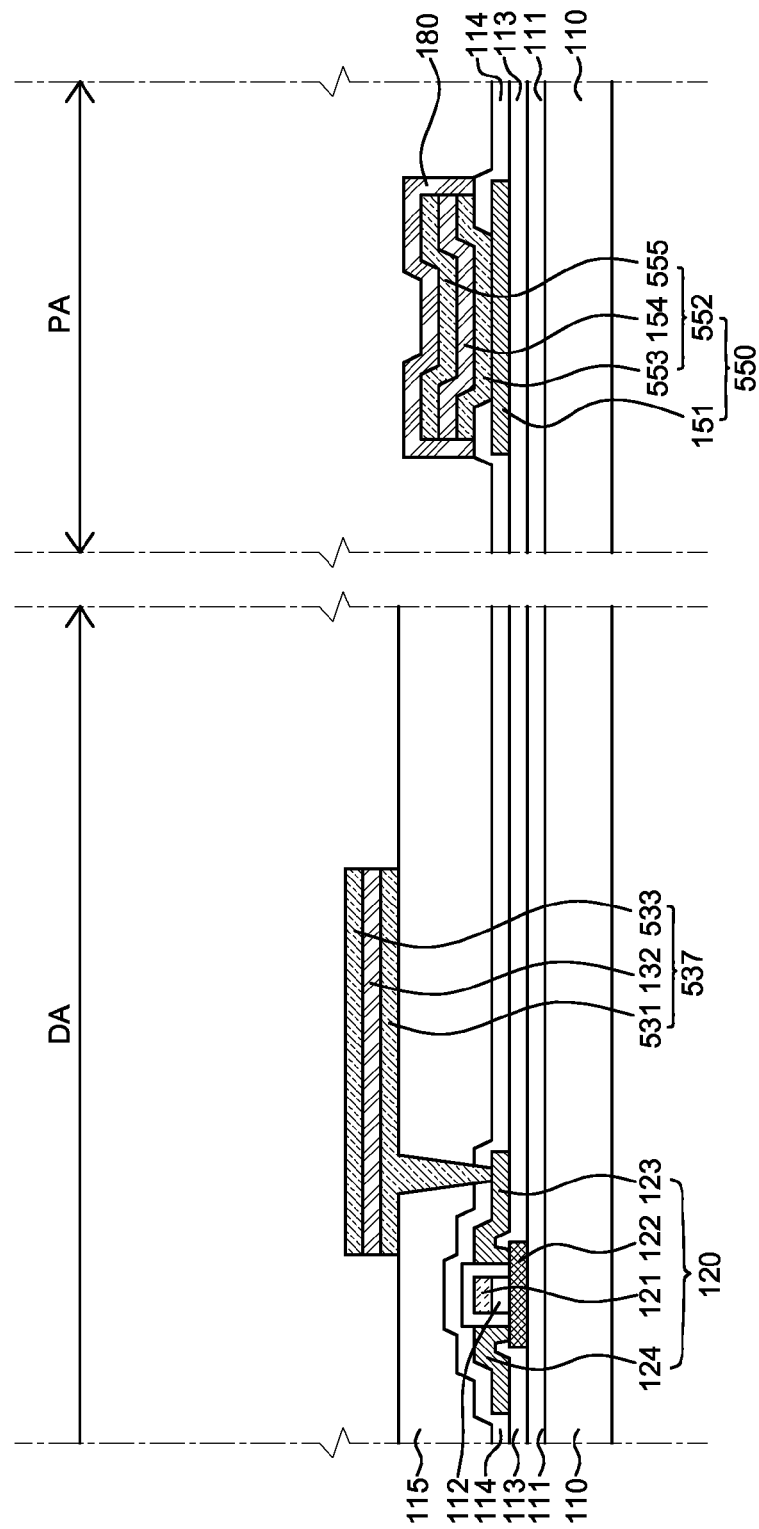

Then, the protection conductive layer 180 is formed to cover a lateral side of the second pad electrode 552. The protection conductive layer 180 may be formed to cover the second pad electrode 552 of the pad electrode (structure) 550 as illustrated in FIG. 13c. That is, the material for a protection conductive layer is formed on the entire surface of the substrate 110. Further, the material for a protection conductive layer is etched, so that the protection conductive layer 180 configured to cover the lateral side of the second pad electrode 552 and a top side of the second pad electrode 552 is formed as illustrated in FIG. 13c.

Figure 13D:
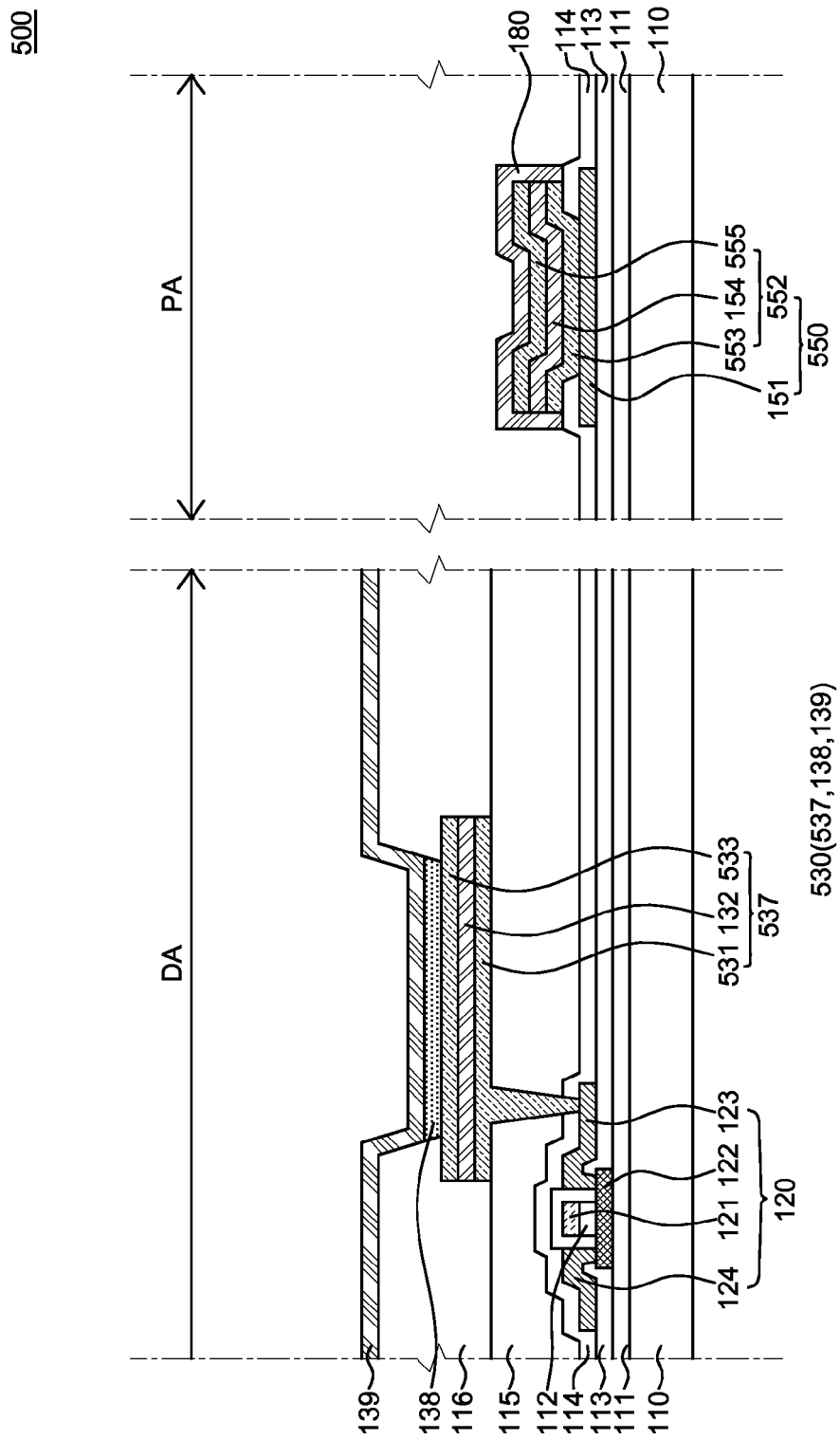

Then, referring to FIG. 13d, the bank layer 116 is formed to cover an edge of the anode 537, and the organic light emitting layer 138 and the cathode 139 are formed in sequence on the anode 537.

In the method of manufacturing an organic light emitting display device according to another exemplary embodiment of the present disclosure, by performing an annealing process to the anode 537 and the second pad electrode 552, the anode 537 includes the upper poly-ITO layer 533 formed of polymerized ITO. Therefore, if the material for a protection conductive layer formed on the anode 537 is etched in order to form the protection conductive layer 180, the upper poly-ITO layer 533 has a different etching selectivity from the material for a protection conductive layer. Therefore, when the material for a protection conductive layer formed on the anode 537 is etched in order to form the protection conductive layer 180, the upper poly-ITO layer 533 of the anode 537 may not be damaged. Accordingly, it is possible to improve the reliability of the organic light emitting display device and also provide an easier method of manufacturing the organic light emitting display device.

Figure 14:
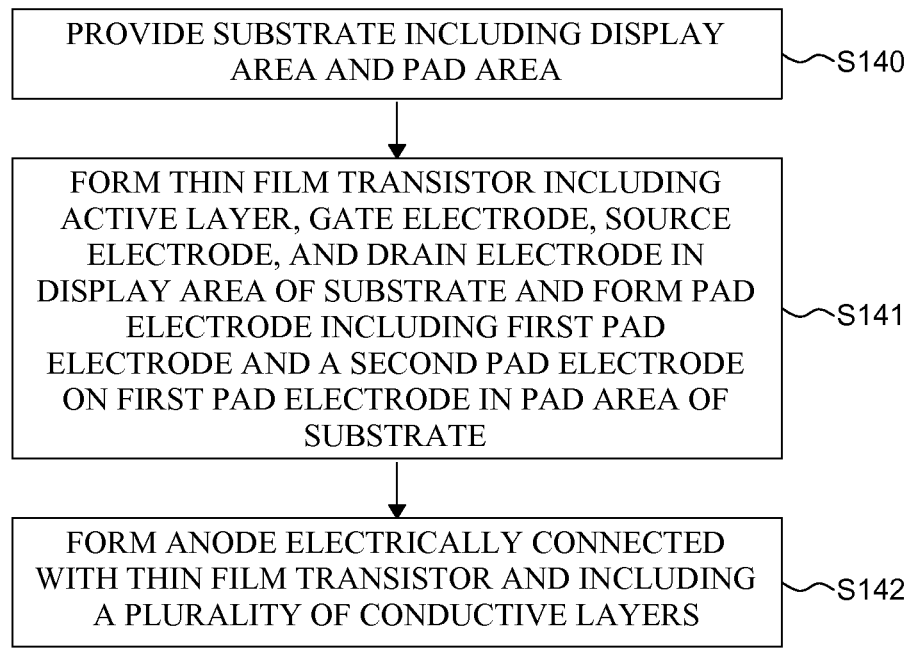
FIG. 14 is a flowchart for describing a method of manufacturing an organic light emitting display device according to yet another exemplary embodiment of the present disclosure.

FIG. 14 is a flowchart for describing a method of manufacturing an organic light emitting display device according to yet another exemplary embodiment of the present disclosure. FIG. 15a to FIG. 15d are schematic process cross-sectional views for describing a method of manufacturing an organic light emitting display device according to still another exemplary embodiment of the present disclosure. FIG. 15a to FIG. 15d are process cross-sectional views for describing a method of manufacturing the organic light emitting display device 600 illustrated in FIG. 6, and, thus, redundant explanation of the components described above with reference to FIG. 6 will be omitted.

First, the substrate 110 including the display area DA and the pad area PA is provided (S140), and the thin film transistor 620 including the active layer 122, the gate electrode 121, the source electrode 623, and the drain electrode 624 is formed in the display area DA of the substrate 110 and the pad electrode structure 650 including the first pad electrode 151 and the second pad electrode 652 on the first pad electrode 151 is formed in the pad area PA of the substrate 110 (S141).

Figure 15A:
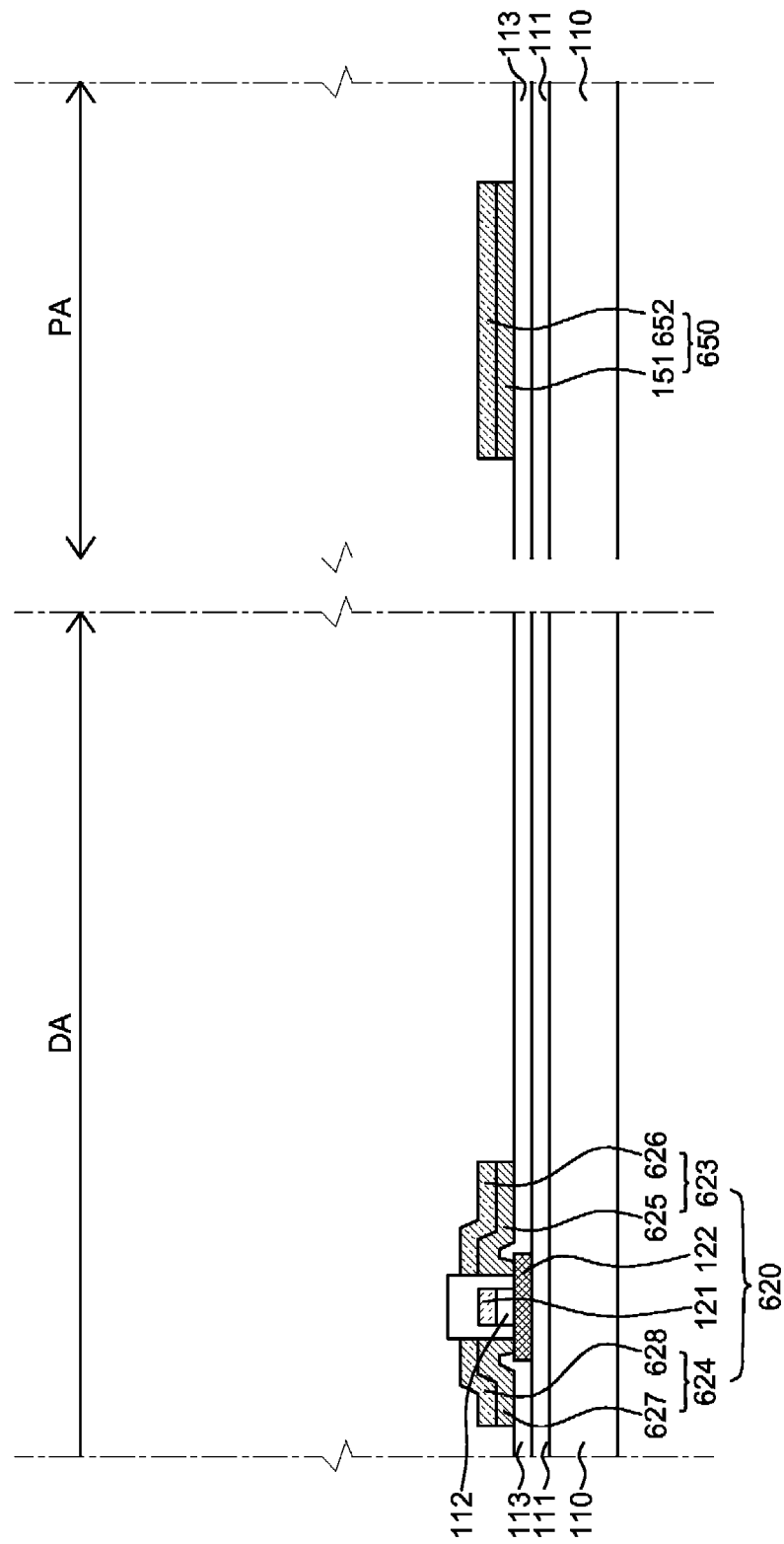
FIG. 15a to FIG. 15d are schematic process cross-sectional views for describing a method of manufacturing an organic light emitting display device according to still another exemplary embodiment of the present disclosure.

Referring to FIG. 15a, the thin film transistor 620 is formed on the display area DA of the substrate 110. The active layer 122 is formed on the buffer layer 111, and the gate insulating layer 112 and the gate electrode 121 are formed on the active layer 122. When the gate insulating layer 112 and the gate electrode 121 are formed, a material for a gate insulating layer and a material for a gate electrode are formed on the entire surface of the substrate 110. Then, the gate insulating layer 112 and the gate electrode 121 are formed by patterning the material for a gate insulating layer and the material for a gate electrode at the same time. The interlayer insulating layer 113 is formed on the gate insulating layer 112 and the gate electrode 121. The interlayer insulating layer 113 is formed on the display area DA and the pad area PA. A contact hole for electrically connecting the source electrode 623 and the drain electrode 624 with the active layer 122 is formed in the interlayer insulating layer 113. Then, a material for a first conductive layer and a material for a second conductive layer of the source electrode 623 and the drain electrode 624 are formed on the entire surface of the substrate 110, and the source electrode 623 and the drain electrode 624 are formed by patterning the material for a first conductive layer and the material for a second conductive layer. At this time, the first pad electrode 151 and the second pad electrode 652 of the pad electrode (structure) 650 are formed on the pad area PA of the substrate 110. That is, when the material for a first conductive layer and the material for a second conductive layer of the source electrode 623 and the drain electrode 624 formed on the entire surface of the substrate 110 are patterned, the first pad electrode 151 and the second pad electrode 652 of the pad electrode (structure) 650 are left in the pad area PA, so that the source electrode 623 and the drain electrode 624 can be formed of the same material at the same time as the first pad electrode 151 and the second pad electrode 652 of the pad electrode (structure) 650. As described with reference to FIG. 6, a material of the second pad electrode 652 is different in etching selectivity from a material of the anode 137.

As described above, if the second conductive layers 626 and 628 of the source electrode 623 and the drain electrode 624 are formed of titanium and a molybdenum-titanium alloy, the material for a first conductive layer and the material for a second conductive layer are formed on the entire surface of the substrate 110 and patterned. Thus, as illustrated in FIG. 15a, the source electrode 623 and the drain electrode 624 can be formed of the same material at the same time as the first pad electrode 151 and the second pad electrode 652 of the pad electrode (structure) 650.

However, if the second conductive layers 626 and 628 of the source electrode 623 and the drain electrode 624 are formed of polymerized transparent conductive oxide, an annealing process for polymerizing the material for a second conductive layer which is transparent conductive oxide is needed. Thus, the material for a first conductive layer is formed on the entire surface of the substrate 110, transparent conductive oxide as the material for a second conductive layer is formed on the entire surface of the substrate 110, and the material for a second conductive layer and the material for a second conductive layer are patterned, and then, an annealing process is performed. As such, the source electrode 623 and the drain electrode 624 can be formed of the same material at the same time as the first pad electrode 151 and the second pad electrode 652 of the pad electrode (structure) 650.

Figure 15B:
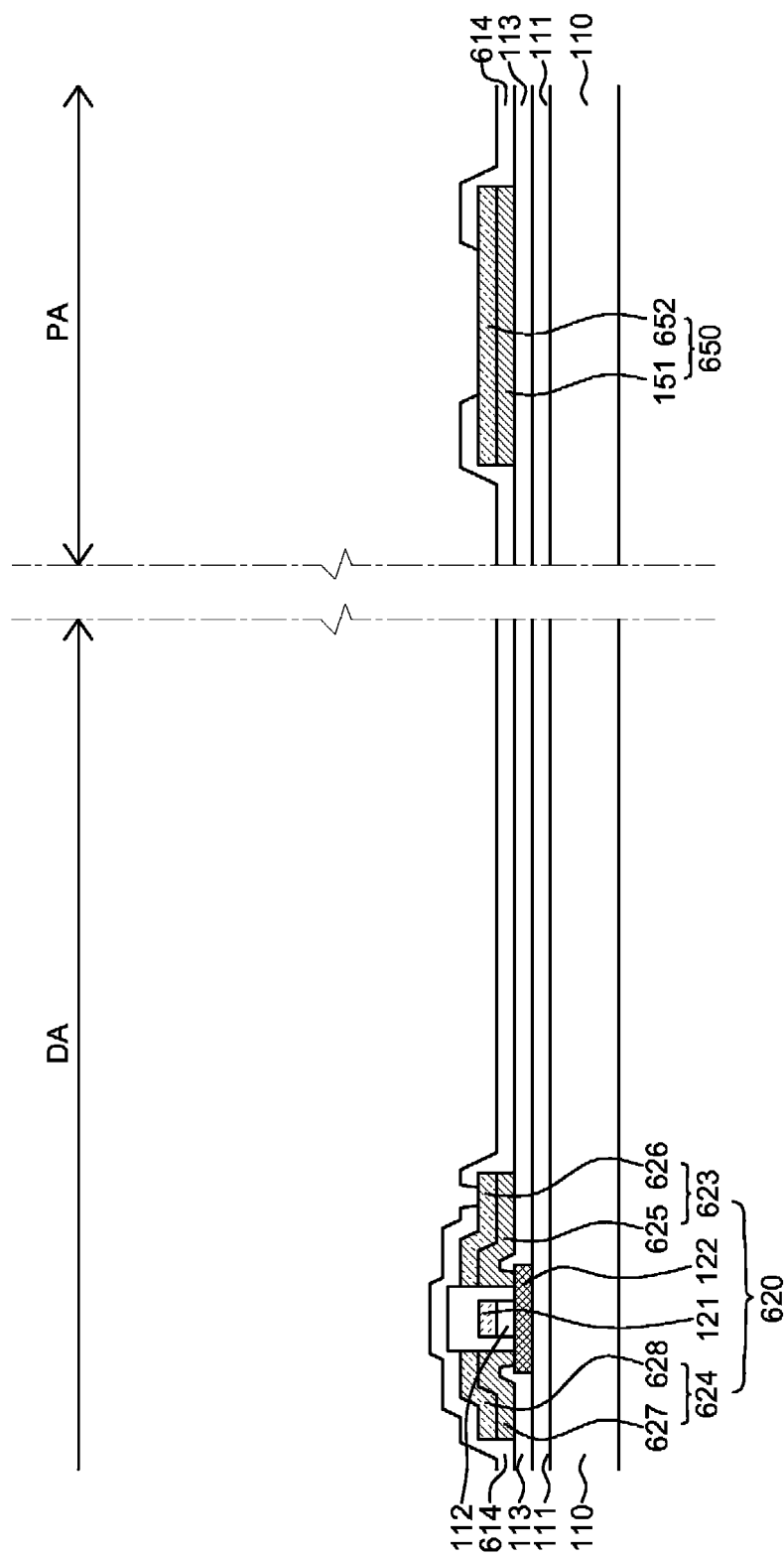

Then, referring to FIG. 15b, the passivation layer 614 for protecting the thin film transistor 620 is formed on the thin film transistor 620. The passivation layer 614 is formed on both of the display area DA and the pad area PA. When the passivation layer 614 is formed, a material for a passivation layer is formed to cover the source electrode 623, the drain electrode 624, and the pad electrode (structure) 650. Then, a contact hole for opening a part of a top side of the second pad electrode 652 is formed in the passivation layer 614 by patterning the material for a passivation layer. In this case, if a dry etching process is performed to the passivation layer 614 to form the contact hole in the passivation layer 614, transparent conductive oxide on a lower part of the passivation layer 614 may be damaged. Therefore, if the contact hole is formed in the passivation layer 614 by dry etching, the annealing process to the material for a second conductive layer as transparent conductive oxide is performed before the passivation layer 614 is formed.

Figure 15C:
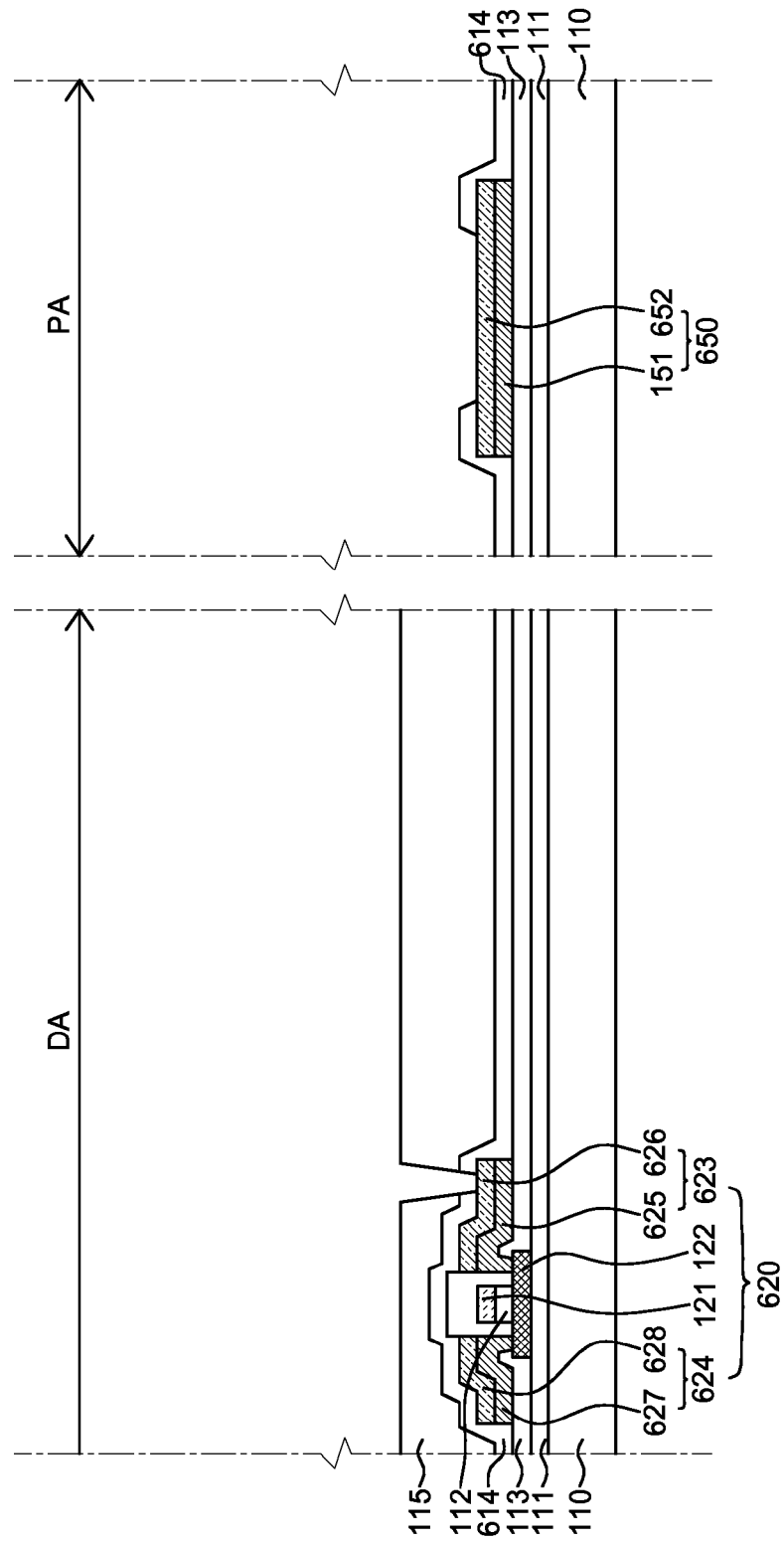

Then, referring to FIG. 15c, the planarization layer 115 for planarizing an upper part of the thin film transistor 620 is formed on the passivation layer 614. The planarization layer 115 is formed only in the display area DA of the substrate 110. After the planarization layer 115 is formed, a contact hole for electrically connecting the anode 137 with the source electrode 623 of the thin film transistor 620 is formed in the planarization layer 115.

In some exemplary embodiments, an annealing process for polymerizing the material for a second conductive layer which is transparent conductive oxide may be performed during a process of forming the planarization layer 115. When the planarization layer 115 is formed, an annealing process is performed to the planarization layer 115 at about 230° C. for about 1 hour in order to cure a material of the planarization layer 115. Therefore, the annealing process of the material for a second conductive layer as transparent conductive oxide is not performed right after the material for a first conductive layer and the material for a second conductive layer are patterned, but the annealing process to the material for a second conductive layer as transparent conductive oxide may be performed at the same time when the annealing process of forming the planarization layer 115 is performed. In this case, an annealing process for polymerizing the material for a second conductive layer as transparent conductive oxide is not separately performed, but the annealing process to the material for a second conductive layer as transparent conductive oxide is performed at the same time when the planarization layer 115 is formed. Resultantly, it is possible to polymerize the material for a second conductive layer as transparent conductive oxide without undergoing an additional process.

Then, the anode 137 electrically connected with the thin film transistor 620 and including a plurality of conductive layers is formed (S142).

Figure 15D:
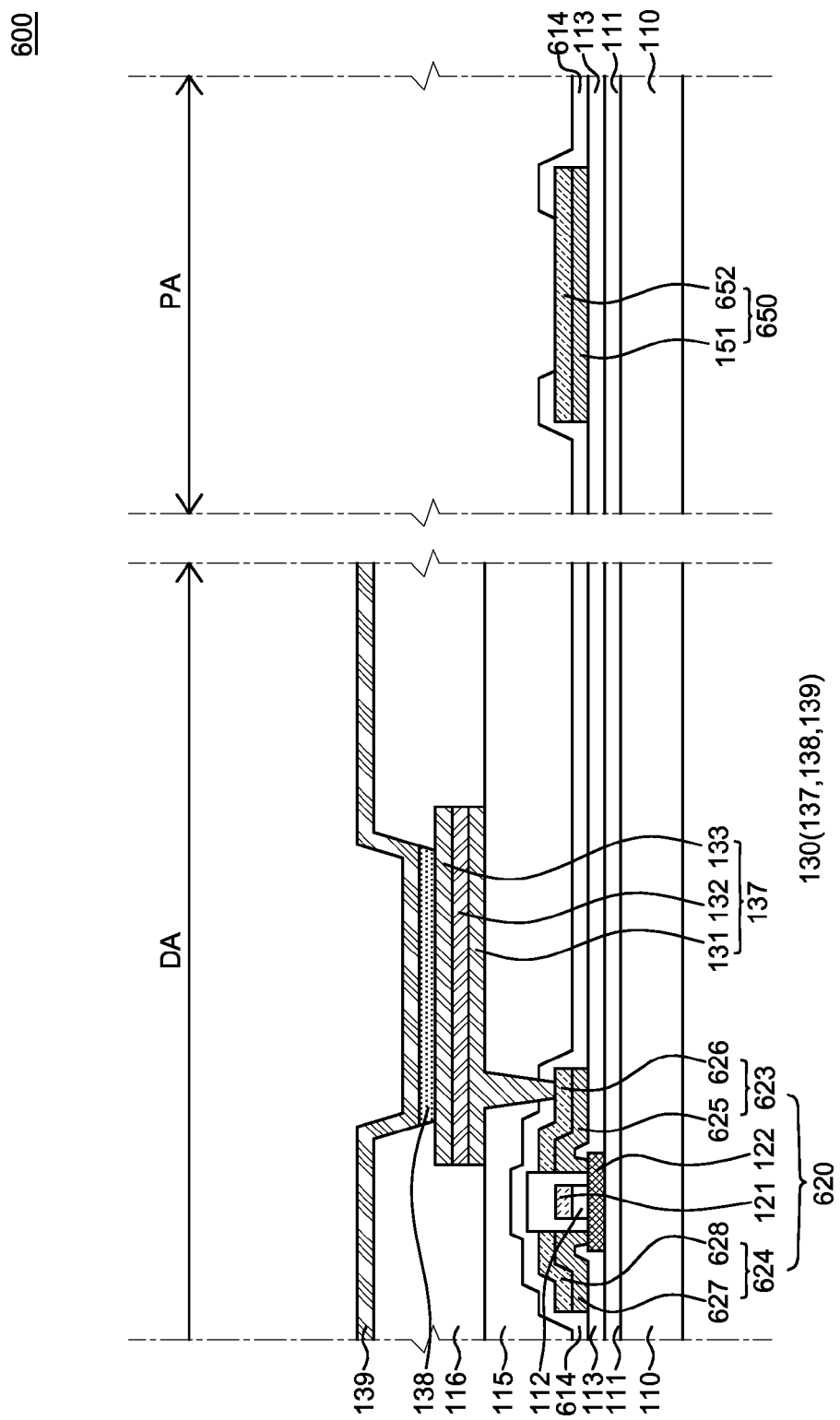

Referring to FIG. 15d, in order to form the anode 137, an ITO material, an Ag alloy material, and an ITO material are formed in sequence on the entire surface of the substrate 110. That is, the ITO material, the Ag alloy material, and the ITO material are formed in the display area DA of the substrate 110 and are also formed in the pad area PA of the substrate 110. Thereafter, by etching the ITO material, the Ag alloy material, and the ITO material, the anode 137 is formed as illustrated in FIG. 15d. At this time, a material of the second pad electrode 652 of the pad electrode (structure) 650 is different in etching selectivity from a material of the anode 137. Thus, a material of the second pad electrode 656 of the pad electrode (structure) 650 is not etched by an etchant for etching the anode 137, and all of the ITO material, the Ag alloy material, and the ITO material in the upper part of the pad electrode (structure) 650 are removed. The anode 137 is electrically connected with the source electrode 623 of the thin film transistor 620.

Then, the bank layer 116 is formed to cover an edge of the anode 137, and the organic light emitting layer 138 and the cathode 139 are formed in sequence on the anode 137.

In the method of manufacturing an organic light emitting display device according to yet another exemplary embodiment of the present disclosure, the pad electrode (structure) 650 formed of the same material as the anode 137 in the pad area PA is not used, but the pad electrode (structure) 650 is formed of the same material as the source electrode 623 and the drain electrode 624 of the thin film transistor 620. In particular, the second pad electrode 652 as an uppermost layer of the pad electrode (structure) 650 is formed of a material different in etching selectivity from a material of the anode 137, so that the second pad electrode 652 of the pad electrode (structure) 650 is not damaged by an etchant used for forming the anode 137 in a process of forming the anode 137 performed after the pad electrode (structure) 650 is formed. Further, a material, such as polymerized transparent conductive oxide, titanium, and a molybdenum-titanium alloy, used for the second pad electrode 652 is not likely to be corroded even when in contact with air or water. Therefore, the reliability of the pad electrode (structure) 650 can be improved, and the reliability of the organic light emitting display device 600 can also be improved.

Further, in the method of manufacturing an organic light emitting display device according to still another exemplary embodiment of the present disclosure, the passivation layer 614 is used to seal the edge of the first pad electrode 151 in order to protect the edge of the first pad electrode 151 of the pad electrode (structure) 650 formed of copper, aluminum, or molybdenum against an etchant used in a process of etching the anode 137. Therefore, it is possible to reduce damage to the first pad electrode 151 by the etchant during the process of etching the anode 137.

Further, if the second conductive layers 626 and 628 of the source electrode 623 and the drain electrode 624 and the second pad electrode 652 of the pad electrode (structure) 650 are formed of polymerized transparent conductive oxide, an annealing process is not separately performed on the required transparent conductive oxide. However, an annealing process may be performed on the transparent conductive oxide at the same time when the planarization layer 115 is cured. Accordingly, it is possible to polymerize the material for a second conductive layer as transparent conductive oxide without undergoing an additional process.

Figure 16A:
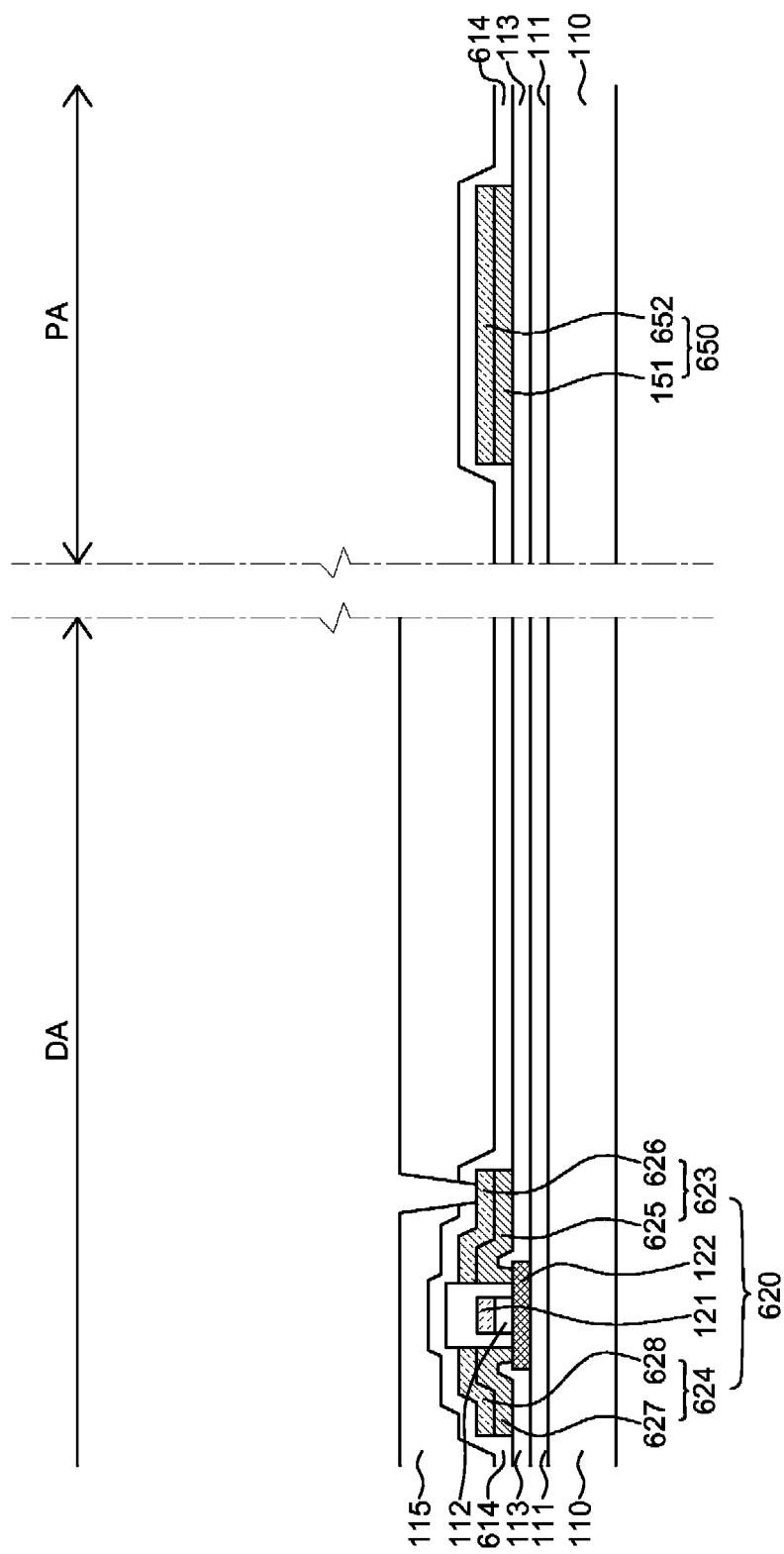
FIG. 16a to FIG. 16c are schematic process cross-sectional views for describing a method of manufacturing an organic light emitting display device according to still another exemplary embodiment of the present disclosure.
Figure 16B:
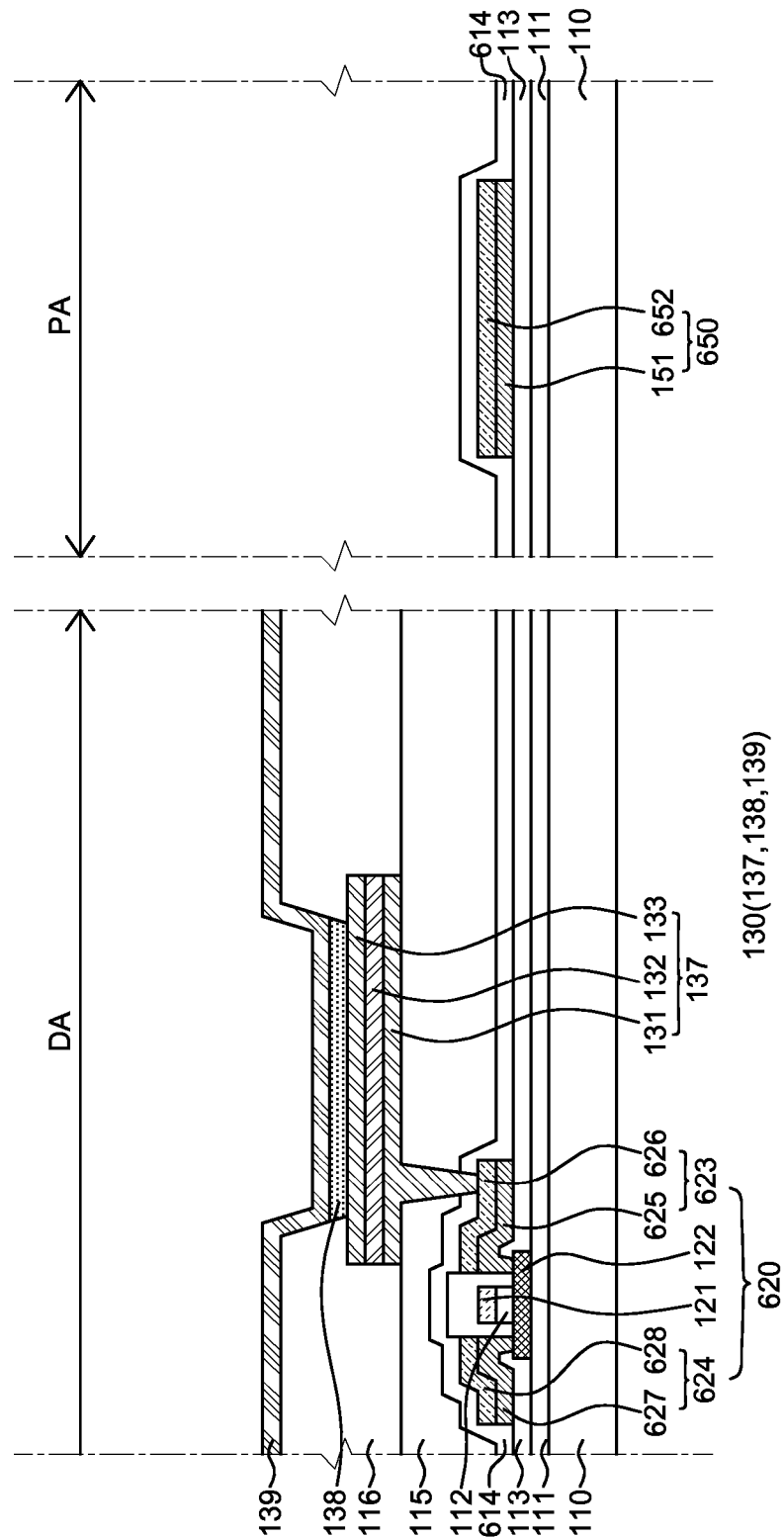
Figure 16C:
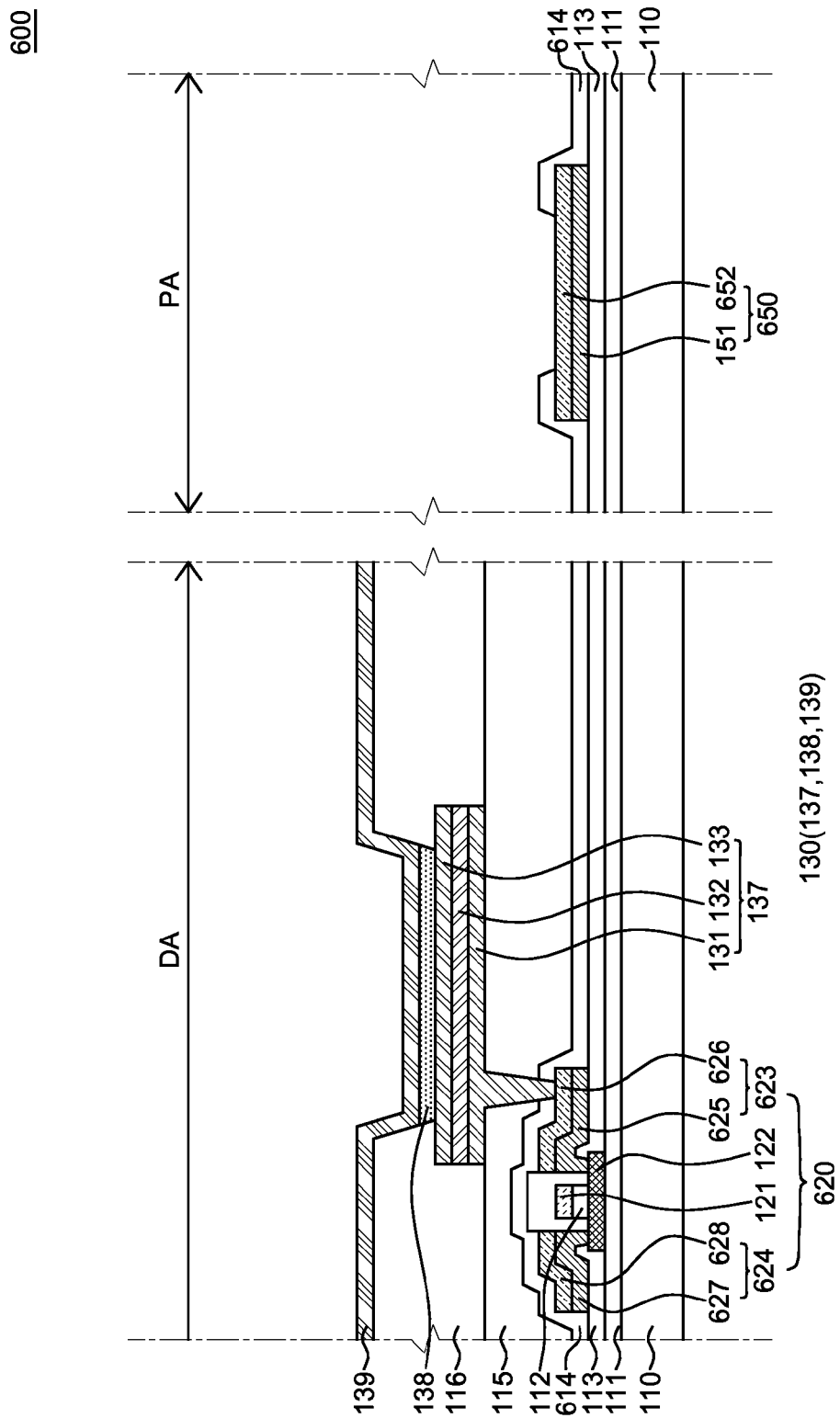

FIG. 16a to FIG. 16c are schematic process cross-sectional views for describing a method of manufacturing an organic light emitting display device according to still another exemplary embodiment of the present disclosure. The process cross-sectional views illustrated in FIG. 16a to FIG. 16c are the same as the process cross-sectional views illustrated in FIG. 15a to FIG. 15d except for a time for forming a contact hole in the passivation layer 614, and, thus, redundant explanation thereof will be omitted.

Referring to FIG. 16a to FIG. 16c, a contact hole for opening a part of a top side of the second pad electrode 152 of the pad electrode (structure) 150 may be formed after the organic light emitting display device 600 is completely manufactured. That is, the contact hole for opening a part of the top side of the second pad electrode 152 may be formed before an external module is bonded to the pad electrode (structure) 150.

Referring to FIG. 16a, the passivation layer 614 is formed in both of the display area DA and the pad area PA of the substrate 110, and the planarization layer 115 is formed on the passivation layer 614 only in the display area DA of the substrate 110. Then, a contact hole for opening the source electrode 623 of the thin film transistor 620 may be formed in the passivation layer 614 and the planarization layer 115. However, during the present process, a contact hole for opening a part of the top side of the second pad electrode 152 is not formed in the passivation layer 614 configured to cover the pad electrode (structure) 150.

Then, referring to FIG. 16b, the anode 137, the bank layer 116, the organic light emitting layer 138, and the cathode 139 are formed in the display area DA of the substrate 110. The passivation layer 614 configured to cover the pad electrode (structure) 150 is not formed until the cathode 139 is completely formed. Further, in some exemplary embodiments, the passivation layer 614 may not be formed until the organic light emitting display device 600 is completely manufactured.

Then, referring to FIG. 16c, after the cathode 139 is completely formed, a contact hole for opening a part of the top side of the second pad electrode 152 is formed in the passivation layer 614. That is, the contact hole for opening apart of the top side of the second pad electrode 152 is formed in the passivation layer 614 before an external module is bonded to the pad electrode (structure) 150.

In the method of manufacturing an organic light emitting display device according to still another exemplary embodiment of the present disclosure, the contact hole for opening a part of the top side of the second pad electrode 152 is not formed when the passivation layer 614 is formed, but the passivation layer 614 is maintained to cover the pad electrode (structure) 150 until a process of manufacturing the organic light emitting display device is completed. Therefore, in the method of manufacturing an organic light emitting display device according to still another exemplary embodiment of the present disclosure, it is possible to reduce damage to the pad electrode (structure) 150 by using various processes performed while the organic light emitting display device 600 is manufactured.

Figure 17:
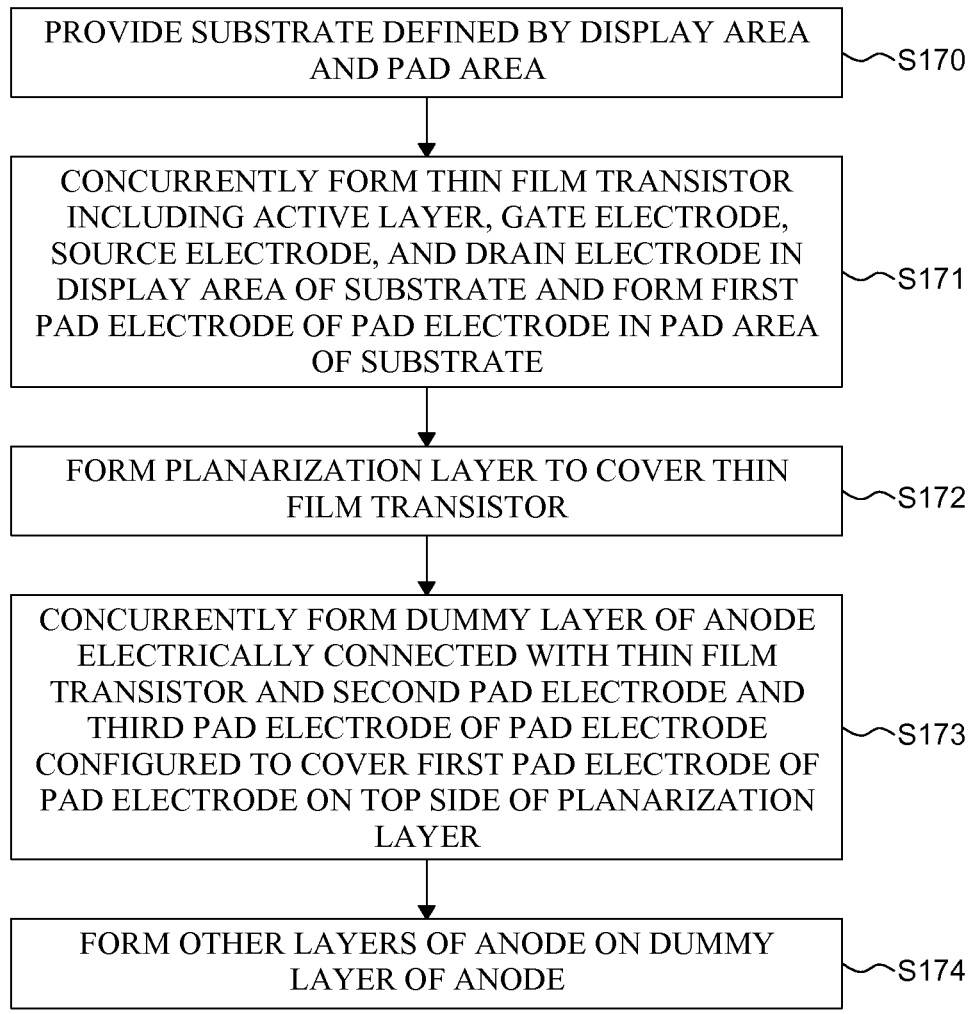
FIG. 17 is a flowchart for describing a method of manufacturing an organic light emitting display device according to still another exemplary embodiment of the present disclosure.

FIG. 17 is a flowchart for describing a method of manufacturing an organic light emitting display device according to still another exemplary embodiment of the present disclosure. FIG. 18a to FIG. 18d are schematic process cross-sectional views for describing a method of manufacturing an organic light emitting display device according to still another exemplary embodiment of the present disclosure. FIG. 18a to FIG. 18d are process cross-sectional views for describing a method of manufacturing the organic light emitting display device 800 illustrated in FIG. 8, and, thus, redundant explanation of the components described above with reference to FIG. 8 will be omitted.

First, the substrate 110 defined by the display area DA and the pad area PA is provided (S170). Further, the thin film transistor 120 including the active layer 122, the gate electrode 121, the source electrode 123, and the drain electrode 124 is formed on the display area DA of the substrate 110 at the same time when the first pad electrode 151 of the pad electrode (structure) 850 is formed on the pad area PA of the substrate 110 (S171).

Figure 18A:
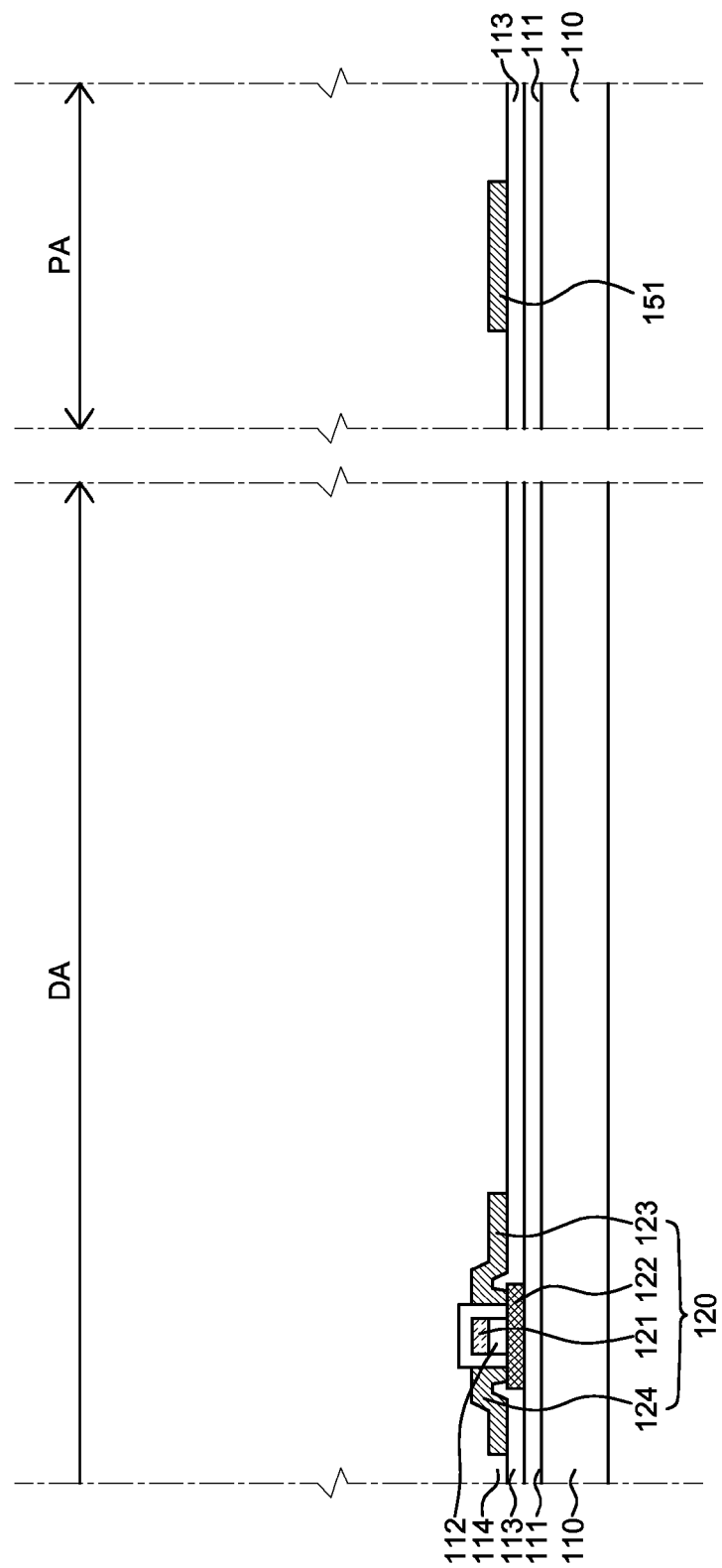
FIG. 18a to FIG. 18d are schematic process cross-sectional views for describing a method of manufacturing an organic light emitting display device according to still another exemplary embodiment of the present disclosure.

Referring to FIG. 18a, the buffer layer 111 is formed on the substrate 110 defined by the display area DA and the pad area PA. The buffer layer 111 is formed on the display area DA and the pad area PA.

The thin film transistor 120 is formed on the display area DA of the substrate 110. The active layer 122 is formed on the buffer layer 111, and the gate insulating layer 112 and the gate electrode 121 are formed on the active layer 112. When the gate insulating layer 112 and the gate electrode 121 are formed, a material for a gate insulating layer and a material for a gate electrode are formed on the entire surface of the substrate 110, and then, by patterning the material for a gate insulating layer and the material for a gate electrode at the same time, the gate insulating layer 112 and the gate electrode 121 are formed. The interlayer insulating layer 113 is formed on the gate insulating layer 112 and the gate electrode 121. The interlayer insulating layer 113 is formed on the display area DA and the pad area PA. A contact hole for electrically connecting the source electrode 123 and the drain electrode 124 with the active layer 122 is formed in the interlayer insulating layer 113. Then, a material for a source electrode and a drain electrode is formed on the entire surface of the substrate 110, and then, by patterning the material for a source electrode and a drain electrode, the source electrode 123 and the drain electrode 124 are formed. At this time, the first pad electrode 151 of the pad electrode (structure) 850 is formed on the pad area PA of the substrate 110. That is, when the material for a source electrode and a drain electrode formed on the entire surface of the substrate 110 is patterned, the first pad electrode 151 of the pad electrode (structure) 850 is left in the pad area PA, so that the source electrode 123, the drain electrode 124, and the first pad electrode 151 of the pad electrode (structure) 850 can be formed of the same material at the same time.

Then, the planarization layer 115 is formed to cover the thin film transistor 120 (S172), and the dummy layer 834 of the anode 837 electrically connected with the thin film transistor 120 and the second pad electrode 852 and the third pad electrode 856 of the pad electrode (structure) 850 configured to cover the first pad electrode 151 of the pad electrode (structure) 850 are formed at the same time (S173).

Figure 18B:
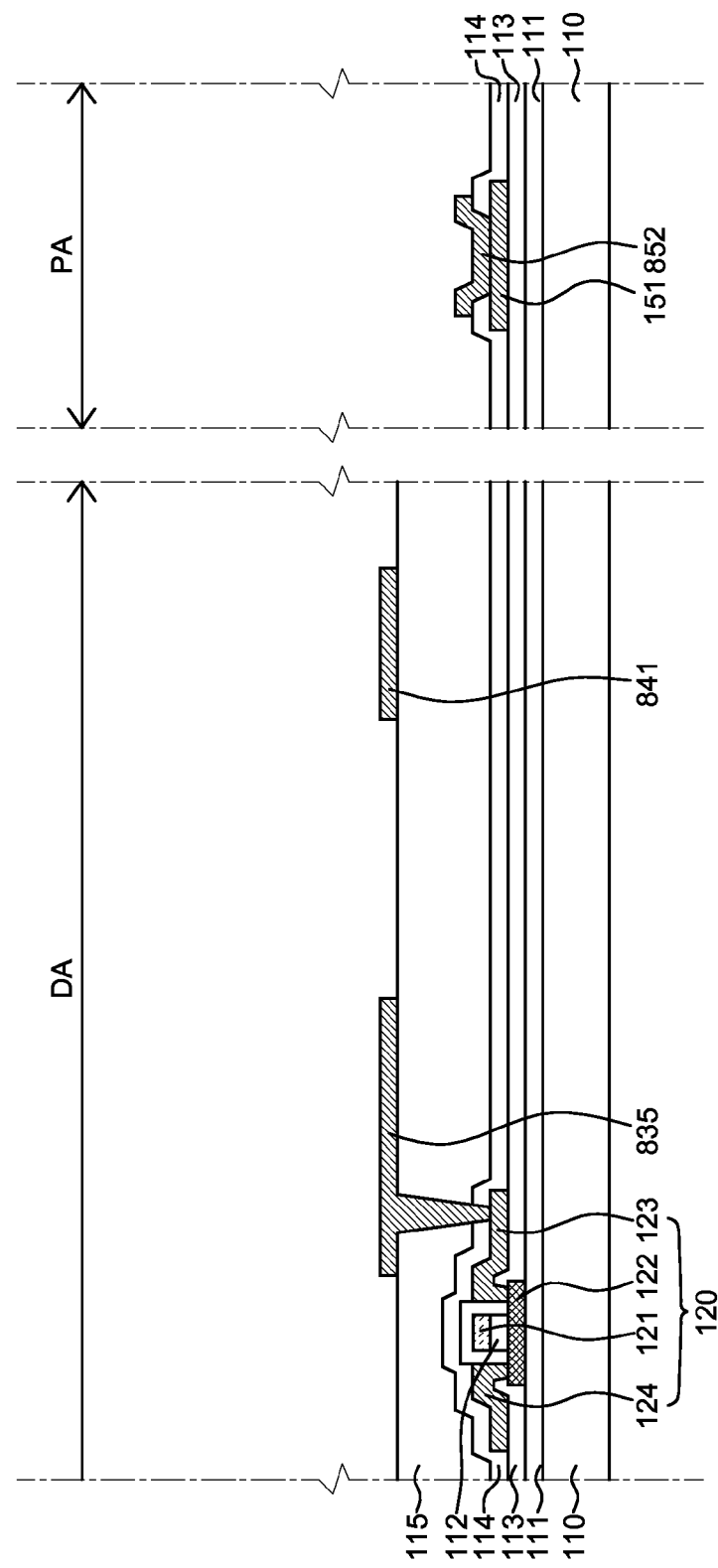

Referring to FIG. 18b, the passivation layer 114 for protecting the thin film transistor 120 is formed on the thin film transistor 120. The passivation layer 114 is formed on both of the display area DA and the pad area PA.

Then, the planarization layer 115 for planarizing an upper part of the thin film transistor 120 is formed on the thin film transistor 120. The planarization layer 115 is formed only in the display area DA of the substrate 110.

Then, the lower layer 835 of the dummy layer 834 of the anode 837 and the first layer 841 of the first auxiliary wiring 840 are formed on the planarization layer 115 in the display area DA. Also, the second pad electrode 852 of the pad electrode (structure) 850 is formed on the interlayer insulating layer 113 in the pad area PA. To be specific, a material for a lower layer of the dummy layer 834 is formed on the planarization layer 115 in the display area DA and the interlayer insulating layer 113 in the pad area PA. That is, the material for a lower layer of the dummy layer 834 is formed on the entire surface of the substrate 110. Then, by patterning the material for a lower layer of the dummy layer 834, the lower layer 835 of the dummy layer 834, the first layer 841 of the first auxiliary wiring 840, and the second pad electrode 852 of the pad electrode (structure) 850 are formed of the same material at the same time.

Figure 18C:
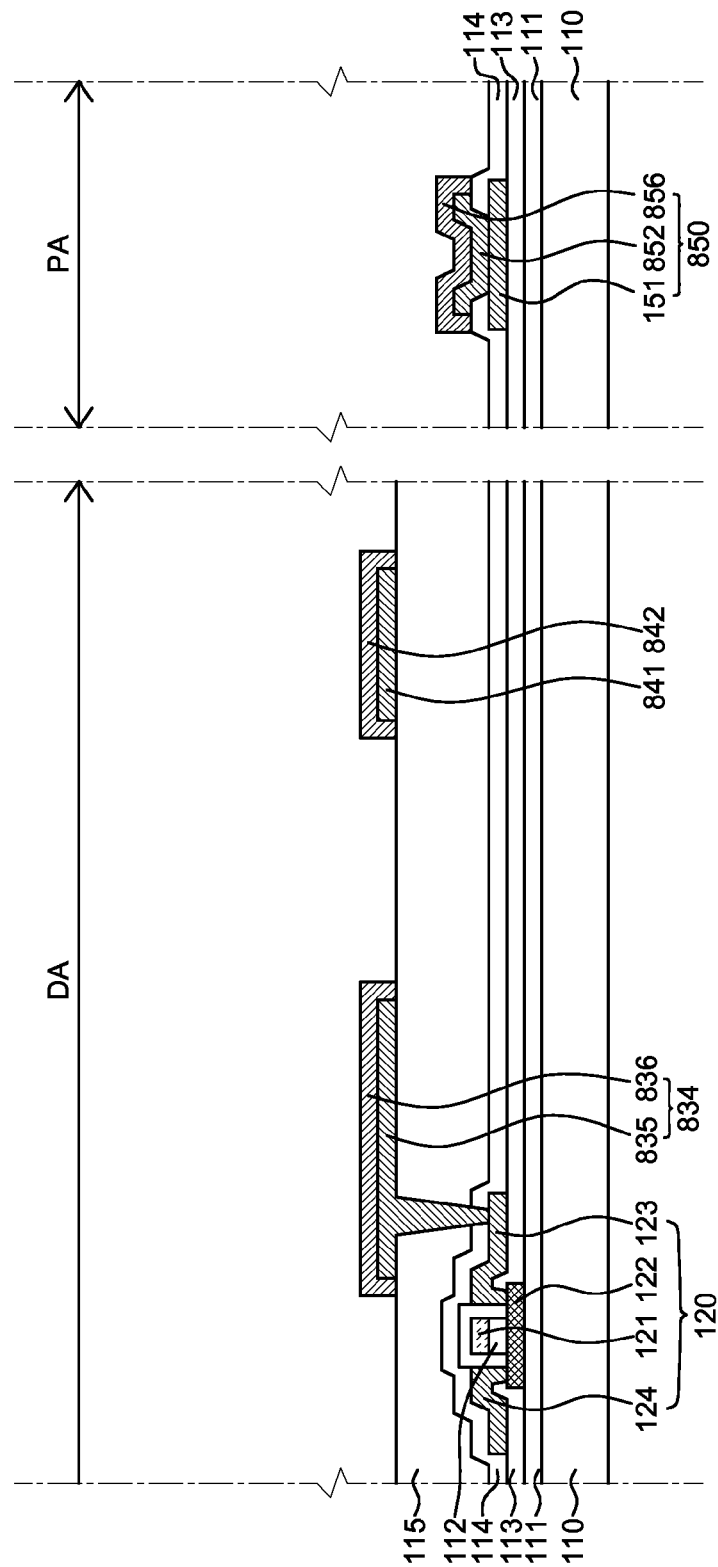

Then, referring to FIG. 18c, the upper layer 836 of the dummy layer 834 is formed on the lower layer 835 of the dummy layer 834 and the second layer 842 is formed on the first layer 841 of the first auxiliary wiring 840 in the display area DA. Further, the third pad electrode 856 is formed on the second pad electrode 852 of the pad electrode (structure) 850 in the pad area PA. To be specific, a material for an upper layer of the dummy layer 834 is formed on the planarization layer 115, the lower layer 835 of the dummy layer 834, and the first layer 841 of the first auxiliary wiring 840 in the display area DA and the passivation layer 114 and the second pad electrode 852 of the pad electrode (structure) 850 in the pad area PA. That is, the material for an upper layer of the dummy layer 834 is formed on the entire surface of the substrate 110. Then, by patterning the material for an upper layer of the dummy layer 834, the upper layer 836 of the dummy layer 834, the second layer 842 of the first auxiliary wiring 840, and the third pad electrode 856 of the pad electrode (structure) 850 are formed of the same material at the same time. The third pad electrode 856 of the pad electrode (structure) 850 is formed to cover the second pad electrode 852 of the pad electrode (structure) 850.

Then, the other layers of the anode 837 are formed on the dummy layer 834 of the anode 837 (S174).

Figure 18D:
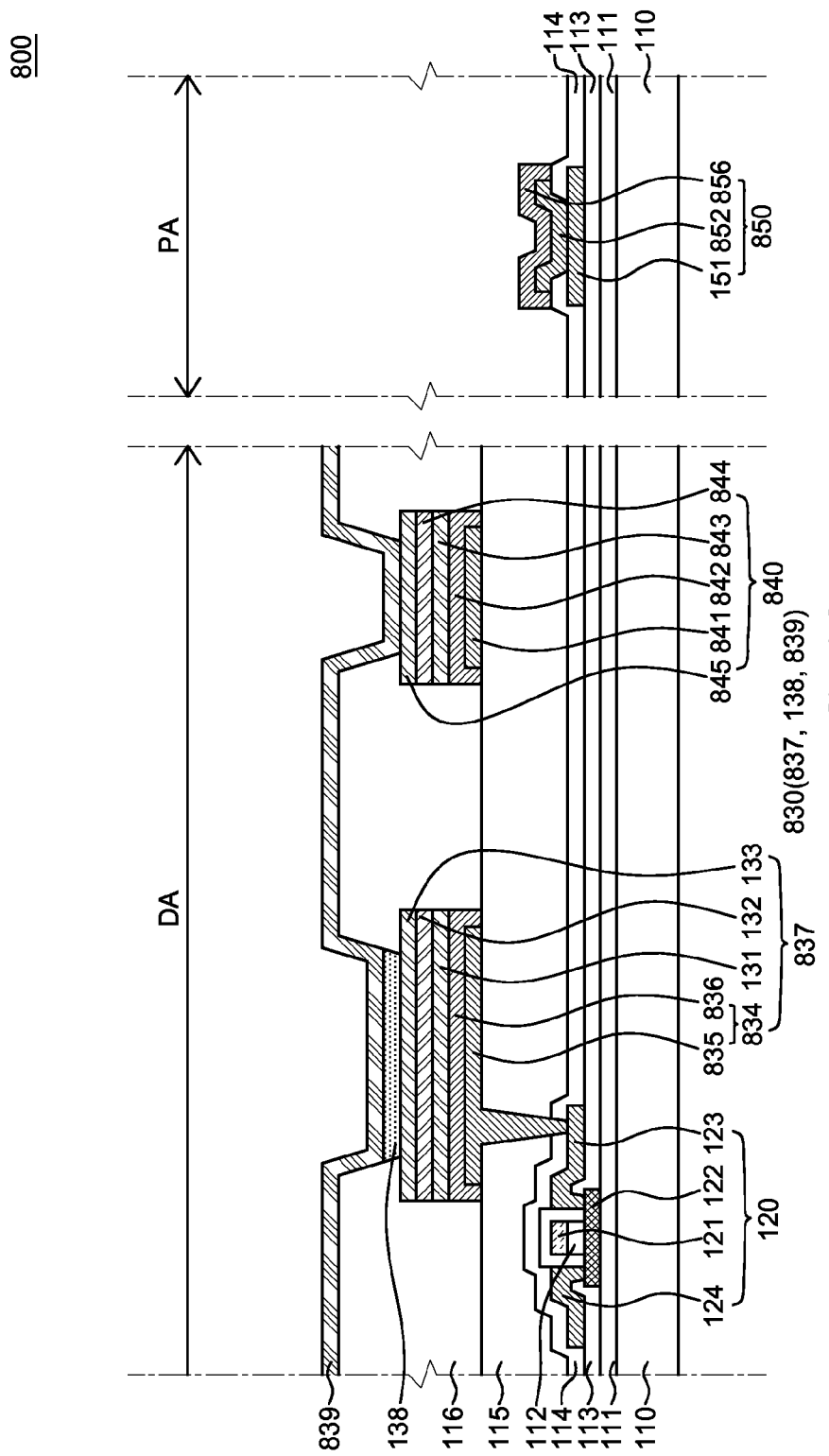

Referring to FIG. 18d, an ITO material, an Ag alloy material, and an ITO material are formed in sequence on the dummy layer 834 of the anode 837 and the second layer 842 of the first auxiliary wiring 840. Herein, the ITO material, the Ag alloy material, and the ITO material are formed in the display area DA of the substrate 110 and also formed in the pad area PA of the substrate 110. Thereafter, by etching the ITO material, the Ag alloy material, and the ITO material in a batch manner, the lower ITO layer 131, the Ag alloy layer 132, and the upper ITO layer 133 as the other layers of the anode 837 are formed on the dummy layer 834 of the anode 837. Further, during the etching process, the third layer 843, the fourth layer 844, and the fifth layer 845 of the first auxiliary wiring 840 are formed at the same time as the lower ITO layer 131, the Ag alloy layer 132, and the upper ITO layer 133 of the anode 837.

Then, the bank layer 116 is formed to cover the anode 837 and an edge of the first auxiliary wiring 840, and the organic light emitting layer 138 and the cathode 839 are formed in sequence.

In the method of manufacturing an organic light emitting display device according to still another exemplary embodiment of the present disclosure, the pad electrode (structure) 850 can be formed at the same time when the first auxiliary wiring 840 is formed. Therefore, the pad electrode (structure) 850 can be formed without undergoing an additional process for forming the pad electrode (structure) 850. Further, the Ag alloy layer 132 is not used for the pad electrode (structure) 850, but the third pad electrode 856 of the pad electrode (structure) 850 formed of a molybdenum-titanium (MoTi) alloy is formed to cover the second pad electrode 852 of the pad electrode (structure) 850. Therefore, it is possible to obtain the pad electrode (structure) 850 with improved reliability.

Figure 19:
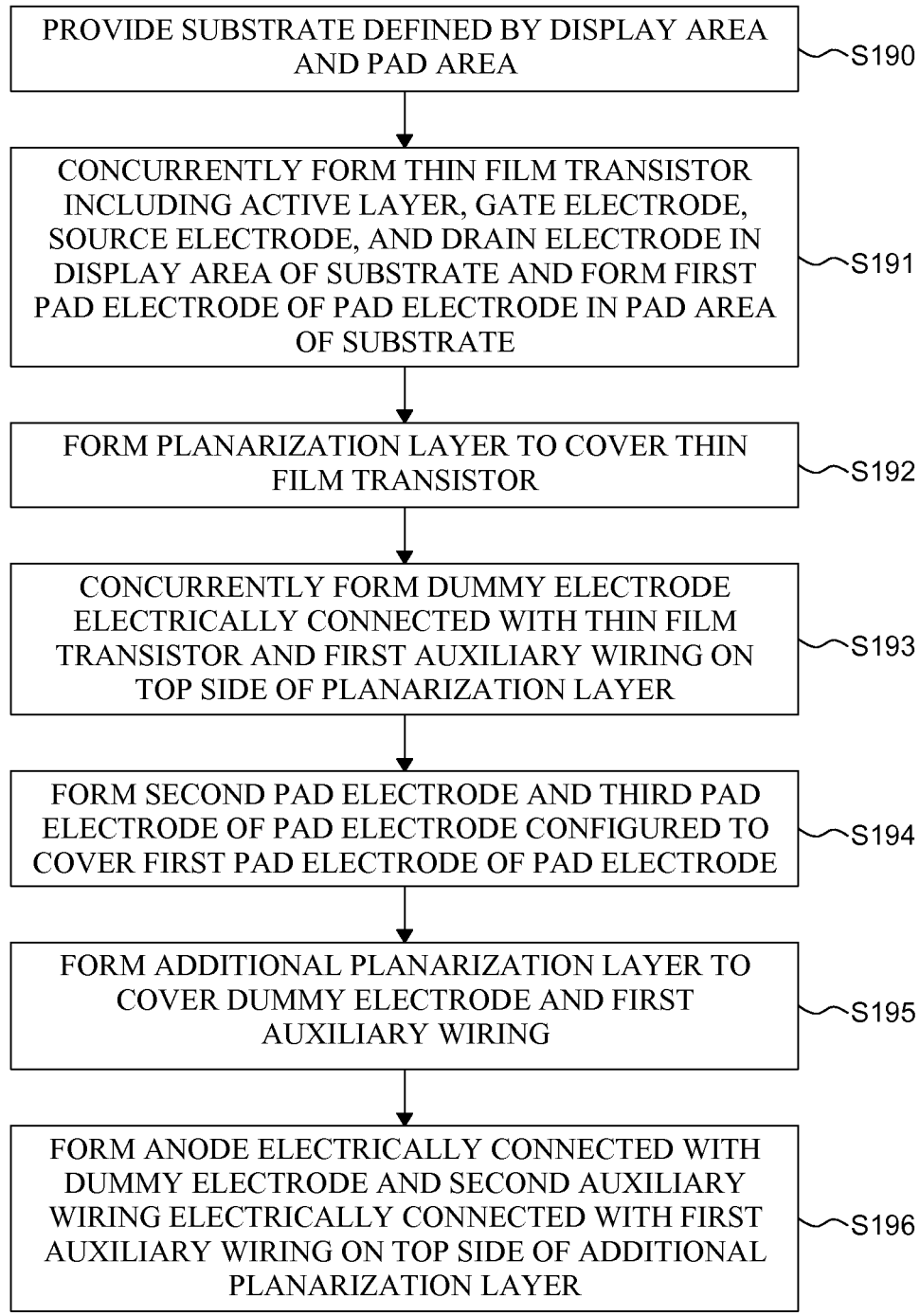
FIG. 19 is a flowchart for describing a method of manufacturing an organic light emitting display device according to still another exemplary embodiment of the present disclosure.
Figure 20A:
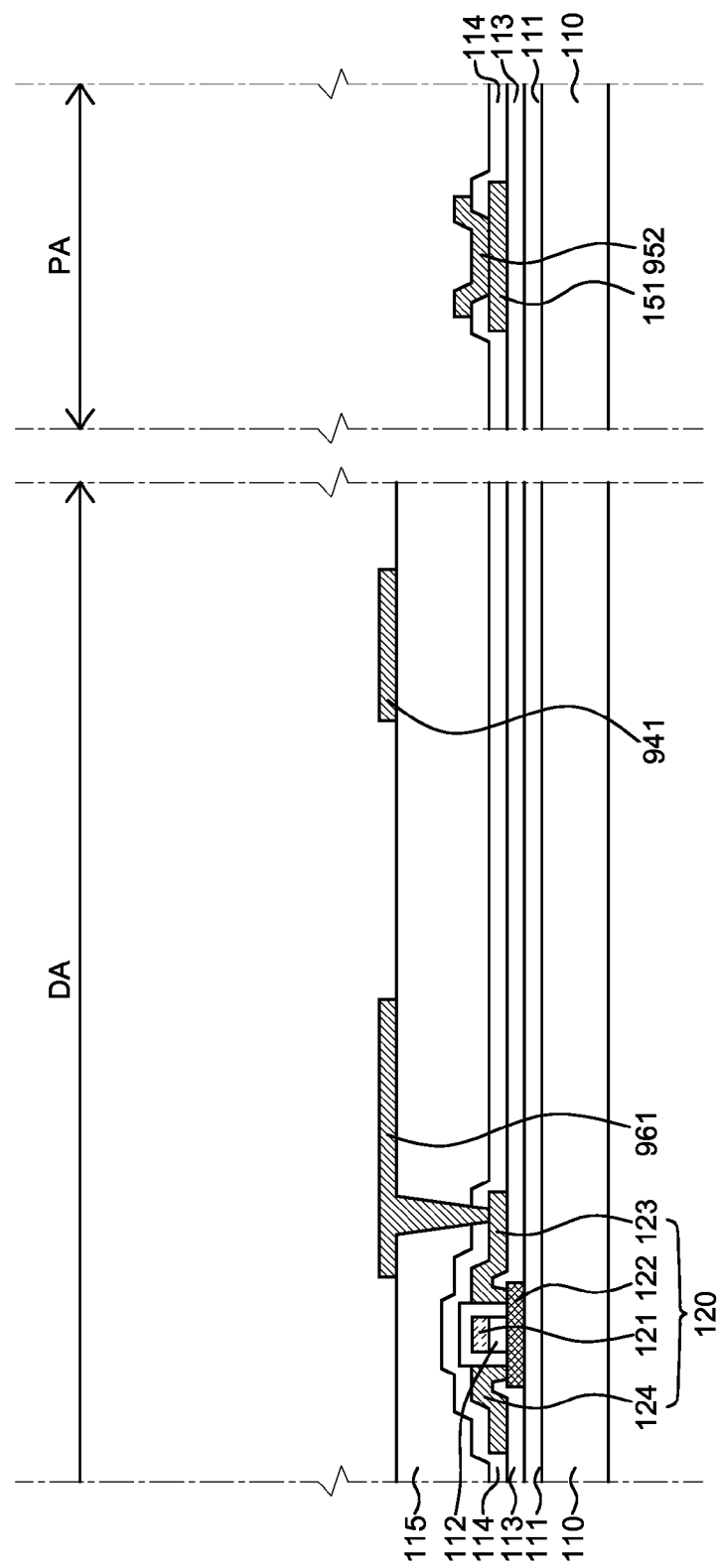
FIG. 20a to FIG. 20c are schematic process cross-sectional views for describing a method of manufacturing an organic light emitting display device according to still another exemplary embodiment of the present disclosure.
Figure 20B:
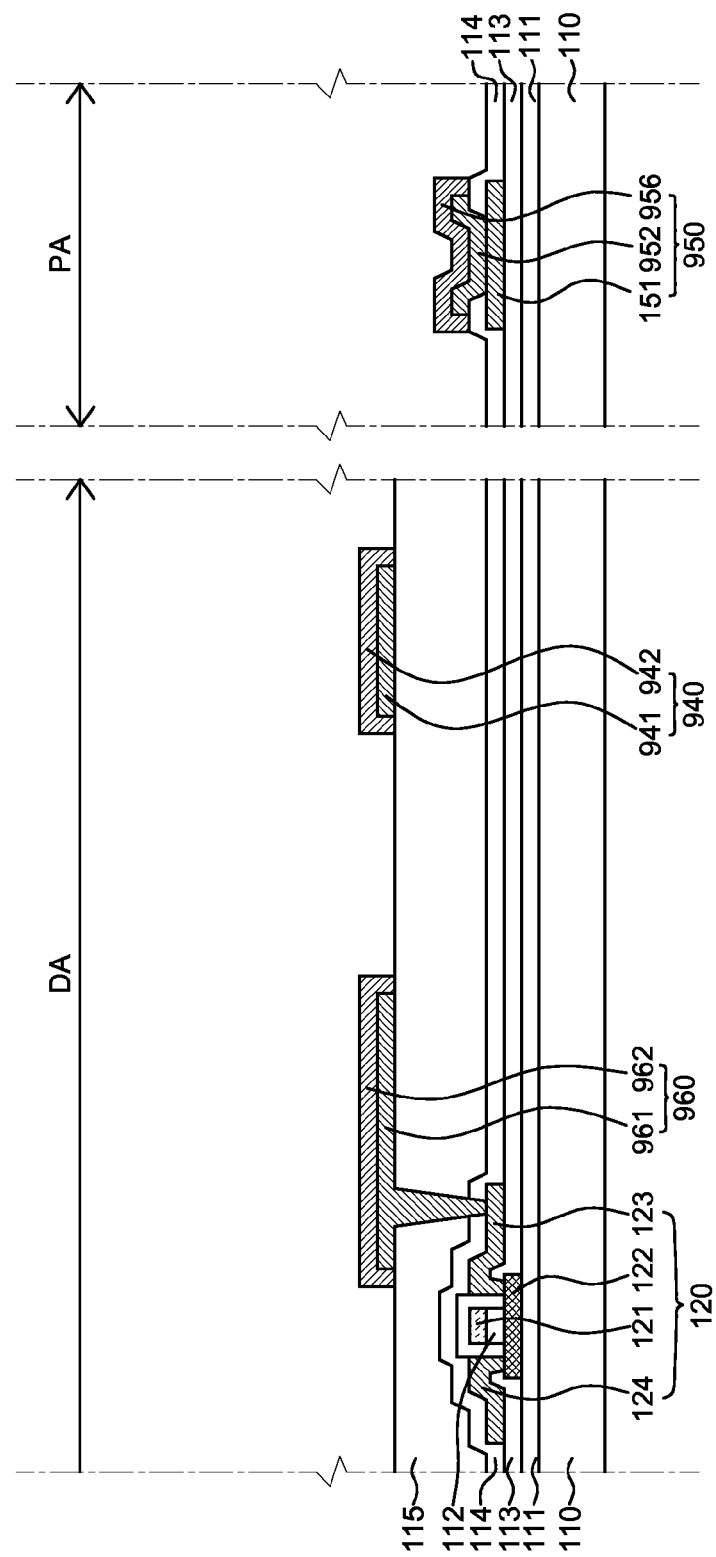
Figure 20C:
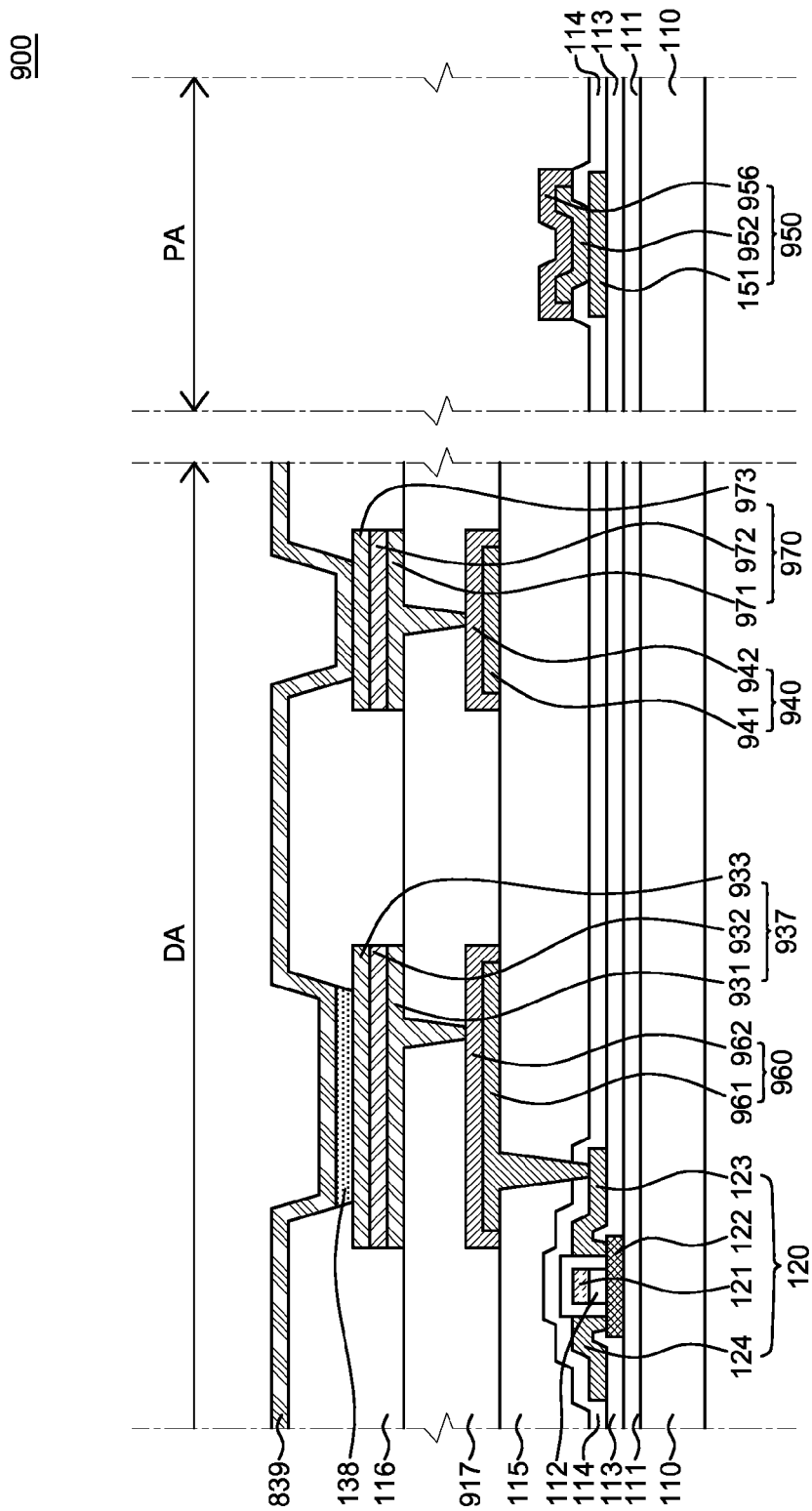

FIG. 19 is a flowchart for describing a method of manufacturing an organic light emitting display device according to still another exemplary embodiment of the present disclosure. FIG. 20a to FIG. 20c are schematic process cross-sectional views for describing a method of manufacturing an organic light emitting display device according to still another exemplary embodiment of the present disclosure. FIG. 20a to FIG. 20c are process cross-sectional views for describing a method of manufacturing the organic light emitting display device 900 illustrated in FIG. 9, and, thus, redundant explanation of the components described above with reference to FIG. 9 will be omitted.

First, the substrate 110 defined by the display area DA and the pad area PA is provided (S190), and the thin film transistor 120 including the active layer 122, the gate electrode 121, the source electrode 123, and the drain electrode 124 is formed on the display area DA of the substrate 110 at the same time when the first pad electrode 151 of the pad electrode structure 950 is formed on the pad area PA of the substrate 110 (S191), and the planarization layer 115 is formed to cover the thin film transistor 120 (S192). The processes S190, S191, and S192 are substantially the same as the processes S170, S171, and S172, and, thus, redundant explanation thereof will be omitted.

Then, the dummy electrode 960 electrically connected with the thin film transistor 120 and the first auxiliary writing 940 are formed on a top side of the planarization layer 115 at the same time (S193), and the second pad electrode 952 and the third pad electrode 956 of the pad electrode structure 950 configured to cover the first pad electrode 151 of the pad electrode structure 950 are formed (S194).

Referring to FIG. 20a, the lower electrode 961 of the dummy electrode 960 and the first layer 941 of the first auxiliary wiring 940 are formed on the planarization layer 115 in the display area DA, and the second pad electrode 952 of the pad electrode structure 950 is formed on the interlayer insulating layer 113 in the pad area PA. To be specific, a material for a lower electrode of the dummy electrode 960 is formed on the planarization layer 115 in the display area DA and the interlayer insulating layer 113 in the pad area PA. That is, the material for a lower electrode of the dummy electrode 960 is formed on the entire surface of the substrate 110. Then, by patterning the material for a lower electrode of the dummy electrode 960, the lower electrode 961 of the dummy electrode 960, the first layer 941 of the first auxiliary wiring 940, and the second pad electrode 952 of the pad electrode structure 950 are formed of the same material at the same time.

Then, referring to FIG. 20b, the upper electrode 962 is formed on the lower electrode 961 of the dummy electrode 960 and the second layer 942 is formed on the first layer 941 of the first auxiliary wiring 940 in the display area DA. Further, the third pad electrode 956 is formed on the second pad electrode 952 of the pad electrode structure 950 in the pad area PA. To be specific, a material for an upper electrode of the dummy electrode 960 is formed on the planarization layer 115, the lower electrode 961 of the dummy electrode 960 and the first layer 941 of the first auxiliary wiring 940 in the display area DA and the passivation layer 114 and the second pad electrode 952 of the pad electrode structure 950 in the pad area PA. That is, the material for an upper electrode of the dummy electrode 960 is formed on the entire surface of the substrate 110. Then, by patterning the material for an upper electrode of the dummy electrode 960, the upper electrode 962 of the dummy electrode 960, the second layer 942 of the first auxiliary wiring 940, and the third pad electrode 956 of the pad electrode structure 950 are formed of the same material at the same time. The third pad electrode 956 of the pad electrode structure 950 is formed to cover the second pad electrode 952 of the pad electrode structure 950.

Then, the additional planarization layer 917 is formed to cover the dummy electrode 960 and the first auxiliary wiring 940 (S195), and the anode 937 electrically connected with the dummy electrode 960 and the second auxiliary wiring 970 electrically connected with the first auxiliary wiring 940 are formed on a top side of the additional planarization layer 917 (S196).

Referring to FIG. 20c, the additional planarization layer 917 is formed to planarize an upper part of the dummy electrode 960 and an upper part of the first auxiliary wiring 940. The additional planarization layer 917 is formed only in the display area DA.

Then, an ITO material, an Ag alloy material, and an ITO material are formed in sequence on the additional planarization layer 917. Herein, the ITO material, the Ag alloy material, and the ITO material are formed in the display area DA of the substrate 110 and also in the pad area PA of the substrate 110. Thereafter, by etching the ITO material, the Ag alloy material, and the ITO material in a batch manner, the lower ITO layer 931, the Ag alloy layer 932, and the upper ITO layer 933 of the anode 937 are formed on the additional planarization layer 917. Further, during the etching process, the first layer 971, the second layer 972, and the third layer 973 of the second auxiliary wiring 970 are formed at the same time as the lower ITO layer 931, the Ag alloy layer 932, and the upper ITO layer 933 of the anode 937.

In the method of manufacturing an organic light emitting display device according to still another exemplary embodiment of the present disclosure, the pad electrode structure 950 can be formed at the same time when the first auxiliary wiring 940 is formed. Therefore, the pad electrode structure 950 can be formed without undergoing an additional process for forming the pad electrode structure 950. Further, the Ag alloy layer 932 is not used for the pad electrode structure 950, but the third pad electrode 956 of the pad electrode structure 950 formed of a molybdenum-titanium (MoTi) alloy is formed to cover the second pad electrode 952 of the pad electrode structure 950. Therefore, it is possible to obtain the pad electrode structure 950 with improved reliability.

Figure 21A:
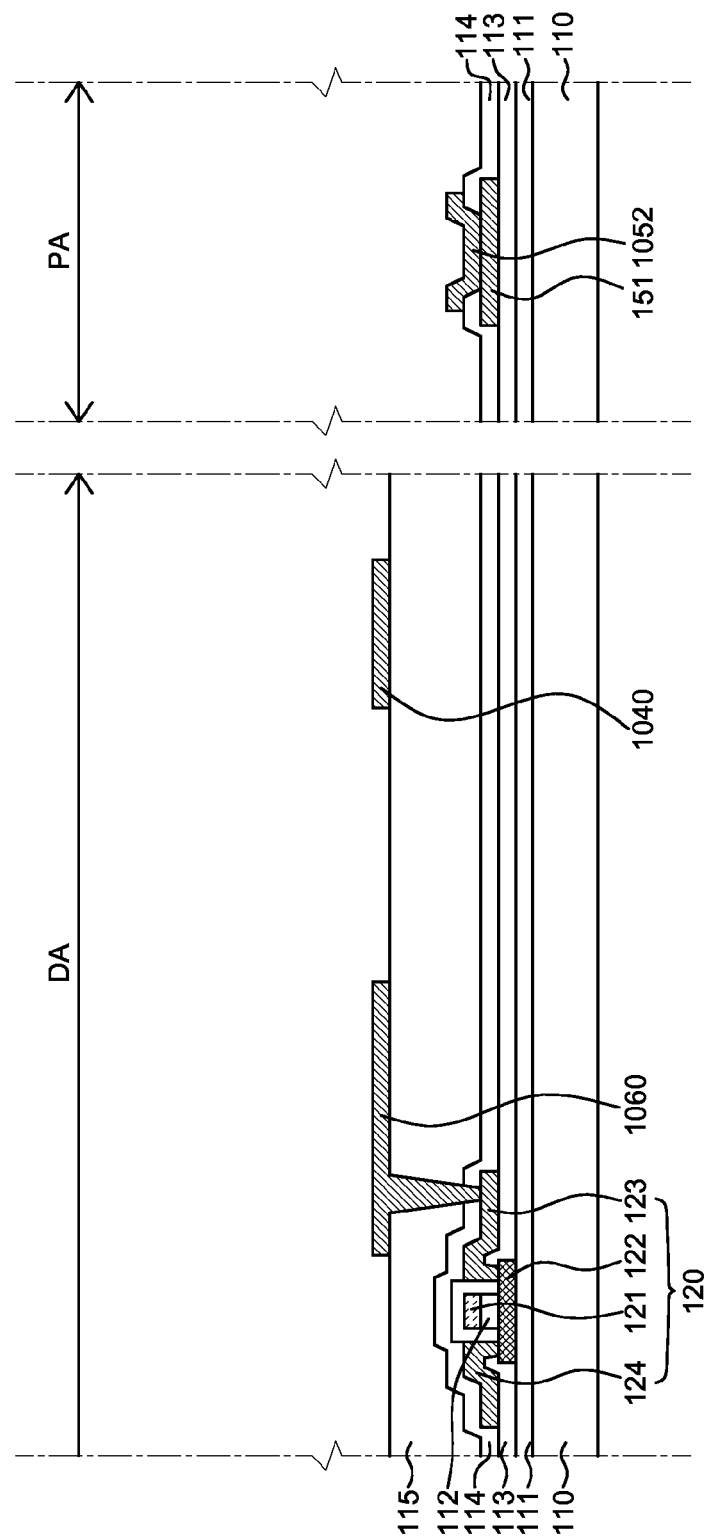
FIG. 21a to FIG. 21c are schematic process cross-sectional views for describing a method of manufacturing an organic light emitting display device according to still another exemplary embodiment of the present disclosure.
Figure 21B:
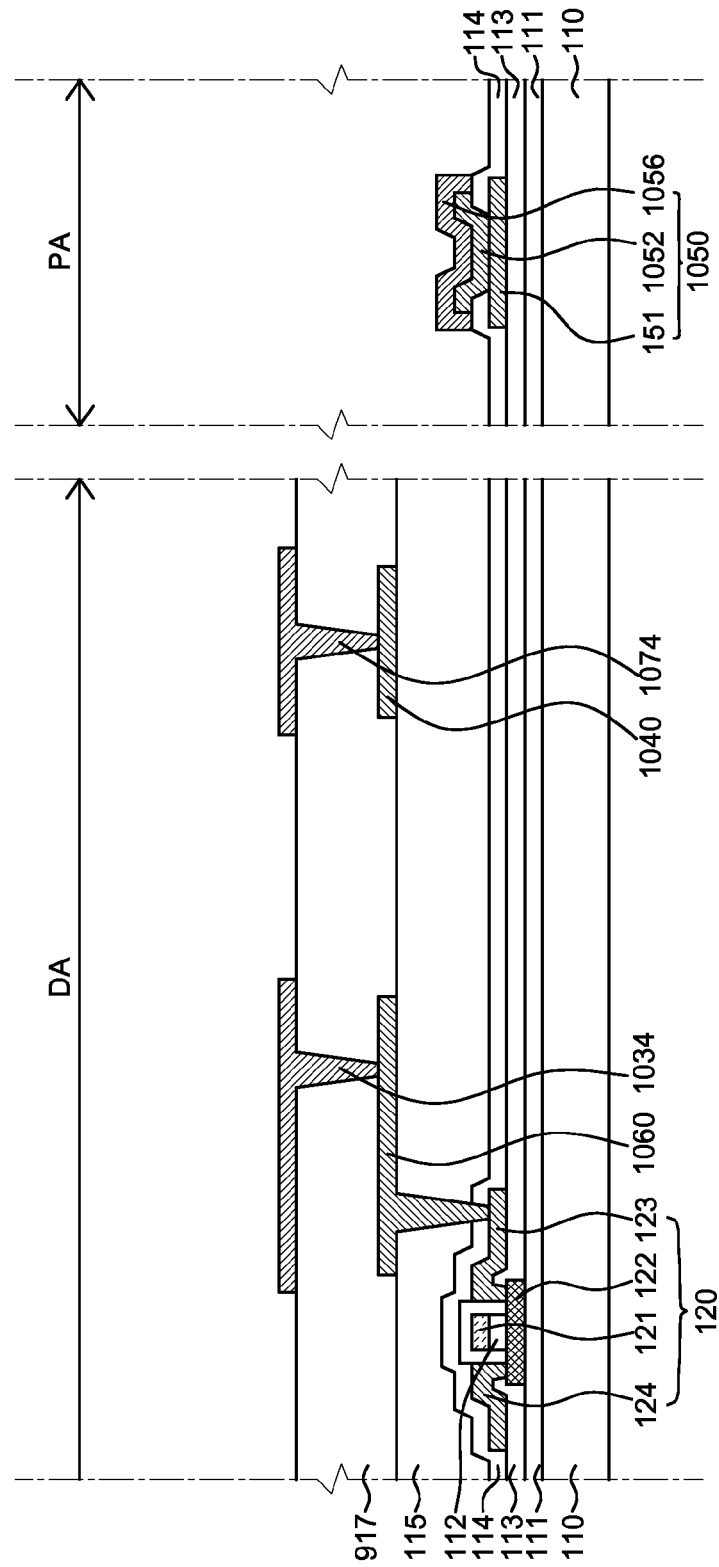
Figure 21C:
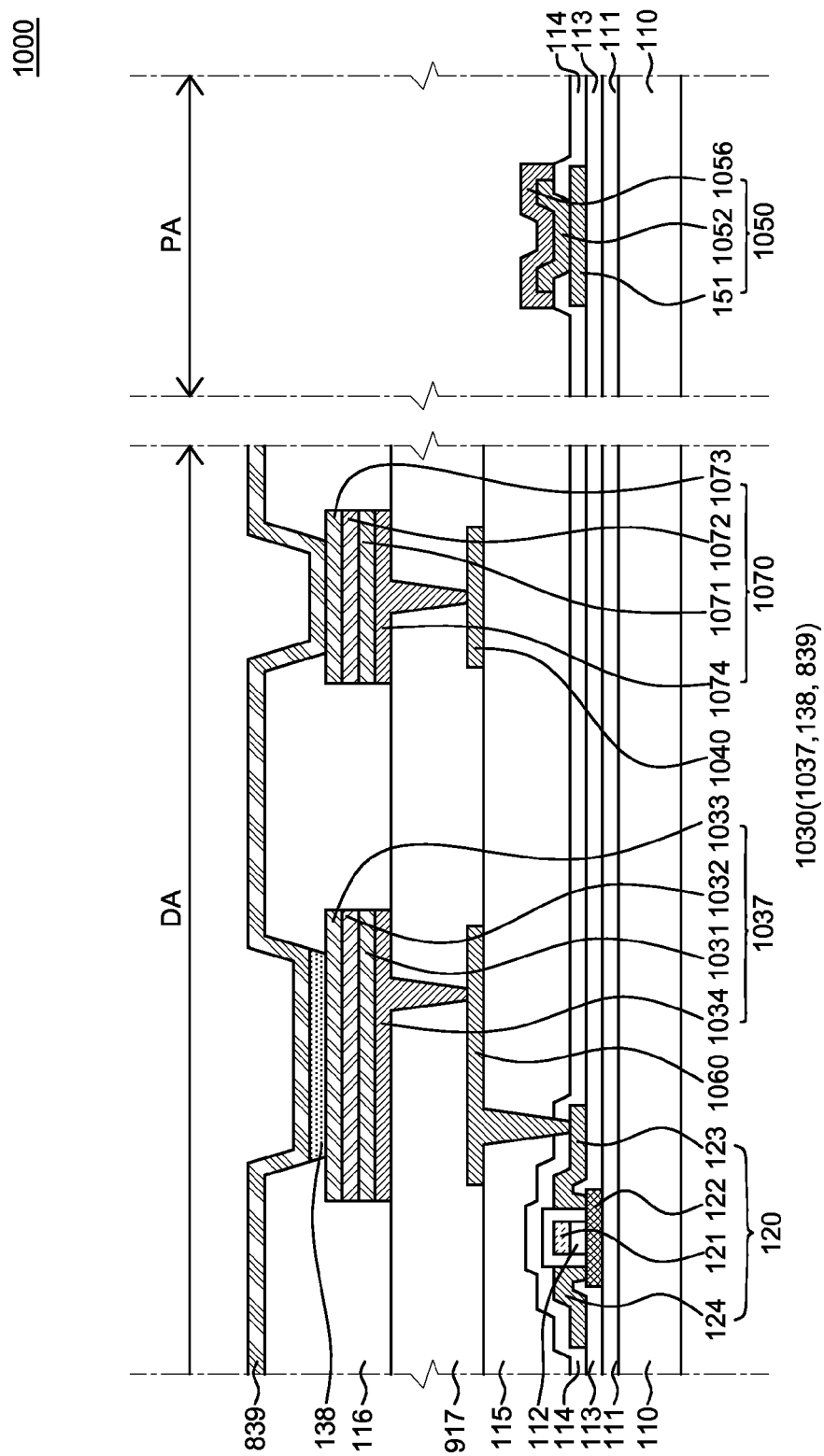

FIG. 21a to FIG. 21c are schematic process cross-sectional views for describing a method of manufacturing an organic light emitting display device according to still another exemplary embodiment of the present disclosure. FIG. 21a to FIG. 21c are process cross-sectional views for describing a method of manufacturing the organic light emitting display device 1000 illustrated in FIG. 10, and, thus, redundant explanation of the components described above with reference to FIG. 10 will be omitted.

First, the substrate 110 defined by the display area DA and the pad area PA is provided (S190), and the thin film transistor 120 including the active layer 122, the gate electrode 121, the source electrode 123, and the drain electrode 124 is formed on the display area DA of the substrate 110 at the same time when the first pad electrode 151 of the pad electrode structure 1050 is formed on the pad area PA of the substrate 110 (S191), and the planarization layer 115 is formed to cover the thin film transistor 120 (S192). The processes S190, S191, and S192 are substantially the same as the processes S170, S171, and S172, and, thus, redundant explanation thereof will be omitted.

Then, the dummy electrode 1060 electrically connected with the thin film transistor 120 and the first auxiliary writing 1040 are formed on a top side of the planarization layer 115 at the same time (S193), and the second pad electrode 1052 and the third pad electrode 1056 of the pad electrode structure 1050 configured to cover the first pad electrode 151 of the pad electrode structure 1050 are formed (S194). The additional planarization layer 917 is formed to cover the dummy electrode 1060 and the first auxiliary wiring 1040 (S195), and the anode 1037 electrically connected with the dummy electrode 1060 and the second auxiliary wiring 1070 electrically connected with the first auxiliary wiring 1040 are formed on a top side of the additional planarization layer 917 (S196).

Referring to FIG. 21*a*, the dummy electrode 1060 and the first auxiliary wiring 1040 are formed on the planarization layer 115 in the display area DA, and the second pad electrode 1052 of the pad electrode structure 1050 is formed on the interlayer insulating layer 113 in the pad area PA. To be specific, a material for a dummy electrode is formed on the planarization layer 115 in the display area DA and the interlayer insulating layer 113 in the pad area PA. That is, the material for a dummy electrode is formed on the entire surface of the substrate 110. Thereafter, by patterning the material for a dummy electrode, the dummy electrode 1060, the first auxiliary wiring 1040, and the second pad electrode 1052 of the pad electrode structure 1050 are formed of the same material at the same time.

Then, referring to FIG. 21*b*, the additional planarization layer 917 is formed to planarize an upper part of the dummy electrode 1060 and an upper part of the first auxiliary wiring 1040. The additional planarization layer 917 is formed only in the display area DA.

Then, the dummy layer 1034 of the anode 1037 and the fourth layer 1074 of the second auxiliary wiring 1070 are formed on the additional planarization layer 917 in the display area DA. Further, the third pad electrode 1056 is formed on the second pad electrode 1052 of the pad electrode structure 1050 in the pad area PA. To be specific, a material for a dummy layer of the anode 1037 is formed on the additional planarization layer 917 in the display area DA and the passivation layer 114 and the second pad electrode 1052 of the pad electrode structure 1050 in the pad area PA. That is, the material for a dummy layer of the anode 1037 is formed on the entire surface of the substrate 410. Thereafter, by patterning the material for a dummy layer, the dummy layer 1034 of the anode 1037, the fourth layer 1074 of the second auxiliary wiring 1070, and the third pad electrode 1056 of the pad electrode structure 1050 are formed of the same material at the same time. The third pad electrode 1056 of the pad electrode structure 1050 is formed to cover the second pad electrode 1052 of the pad electrode structure 1050.

Then, an ITO material, an Ag alloy material, and an ITO material are formed in sequence on the additional planarization layer 917. Herein, the ITO material, the Ag alloy material, and the ITO material are formed in the display area DA of the substrate 410 and also formed in the pad area PA of the substrate 110. Thereafter, by etching the ITO material, the Ag alloy material, and the ITO material in a batch manner, the lower ITO layer 1031, the Ag alloy layer 1032, and the upper ITO layer 1033 of the anode 1037 are formed on the dummy layer 1034 of the anode 1037. Further, during the etching process, the first layer 371, the second layer 372, and the third layer 373 of the second auxiliary wiring 1070 are formed on the fourth layer of the second auxiliary wiring 1070 at the same time as the lower ITO layer 1031, the Ag alloy layer 1032, and the upper ITO layer 1033 of the anode 1037.

In the method of manufacturing an organic light emitting display device according to still another exemplary embodiment of the present disclosure, the pad electrode structure 1050 can be formed at the same time when the first auxiliary wiring 1040 is formed. Therefore, the pad electrode structure 1050 can be formed without undergoing an additional process for forming the pad electrode structure 1050. Further, the Ag alloy layer 1032 is not used for the pad electrode structure 1050, but the third pad electrode 1056 of the pad electrode structure 1050 formed of a molybdenum-titanium (MoTi) alloy is formed to cover the second pad electrode 1052 of the pad electrode structure 1050. Therefore, it is possible to obtain the pad electrode structure 1050 with improved reliability.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device comprising:
    a substrate including a display area and a pad area;
    a pad electrode structure on the substrate in the pad area and including a first pad electrode and a second pad electrode on the first pad electrode;
    a protection conductive layer covering a lateral surface of the second pad electrode so as to reduce corrosion of the second pad electrode; and
    a passivation layer covering an edge of the first pad electrode,
    wherein the second pad electrode is electrically connected with the first pad electrode through a contact hole in the passivation layer.

2. The organic light emitting display device according to claim 1, wherein the protection conductive layer is formed of one of transparent conductive oxide, molybdenum (Mo), and a molybdenum alloy (Mo alloy).

3. The organic light emitting display device according to claim 1, further comprising:
    a thin-film transistor on the substrate in the display area and including an active layer, a gate electrode, a source electrode, and a drain electrode; and
    an anode electrically connected with the thin-film transistor and including a plurality of conductive layers,
    wherein the first pad electrode is formed of same material as the source electrode and the drain electrode, and the second pad electrode is formed of a same material as the anode.

4. The organic light emitting display device according to claim 3, wherein the anode has a structure in which a lower poly-ITO layer, a silver alloy layer, and an upper poly-ITO layer are laminated.

5. The organic light emitting display device according to claim 3, wherein the source electrode and the drain electrode have a structure in which a copper (Cu) layer is laminated on a molybdenum-titanium (MoTi) alloy layer.

6. The organic light emitting display device according to claim 1, wherein the protection conductive layer covers a lateral surface of the second pad electrode and at least a part of a top surface of the second pad electrode.

7. The organic light emitting display device according to claim 3, further comprising:
    a dummy layer covering the anode, wherein the dummy layer is formed of a same material as the protection conductive layer.

8. An organic light emitting display device comprising:
a substrate including a display area and a pad area;
a thin film transistor on the substrate in the display area and including an active layer, agate electrode, a source electrode, and a drain electrode;
an anode electrically connected with the thin film transistor and including a plurality of conductive layers; and
a pad electrode structure on the substrate in the pad area and including a first pad electrode and a second pad electrode on the first pad electrode,
wherein a material of the second pad electrode is different in etching selectivity from a material of the anode, and
wherein the second pad electrode is formed of one of polymerized transparent conductive oxide, titanium (Ti), and a molybdenum-titanium (MoTi) alloy.

9. The organic light emitting display device according to claim 8, wherein the material of the second pad electrode and the material of the anode are different from each other in etching selectivity with respect to an etchant for etching the material of the anode.

10. The organic light emitting display device according to claim 8, wherein the second pad electrode is formed of a material which is not etched by an etchant for etching the anode.

11. The organic light emitting display device according to claim 8, wherein each of the source electrode and the drain electrode includes a first conductive layer formed of a same material as the first pad electrode and a second conductive layer formed of a same material as the second pad electrode, and
the first conductive layer has a structure in which a copper (Cu) layer is laminated on a molybdenum-titanium (MoTi) alloy layer or a structure in which a molybdenum (Mo) layer, an aluminum (Al) layer, and a molybdenum layer are laminated.

12. The organic light emitting display device according to claim 8, further comprising:
a passivation layer on the source electrode and the drain electrode and including a contact hole for revealing a part of a top surface of the second pad electrode; and
an external module in direct contact with the second pad electrode via the contact hole.

13. An organic light emitting display device comprising:
a substrate having a display area and a pad area;
a thin film transistor on the substrate in the display area and including an active layer, a gate electrode, a source electrode, and a drain electrode;
an anode electrically connected with the thin film transistor and including at least two layers;
a pad electrode structure on the substrate in the pad area and including a plurality of pad electrodes;
a planarization layer that covers the thin film transistor; and
a first auxiliary wiring on a top side of the planarization layer and on a same plane as the anode,
wherein a first pad electrode of the pad electrode structure is formed of a same material as the source electrode and the drain electrode, and a second pad electrode of the pad electrode structure and a third pad electrode of the pad electrode structure cover the first pad electrode, and
wherein the second pad electrode of the pad electrode structure and the third pad electrode of the pad electrode structure are formed of a same material as the first auxiliary wiring.

14. The organic light emitting display device according to claim 13, wherein the anode has a structure in which a lower ITO (Indium Tin Oxide) layer, a silver alloy (Ag alloy) layer, and an upper ITO layer are laminated.

15. The organic light emitting display device according to claim 14, wherein the anode further includes a dummy layer which is in contact with a rear side of the lower ITO layer and electrically connected with the lower ITO layer.

16. The organic light emitting display device according to claim 15, wherein the dummy layer includes a plurality of layers, a lower layer of the plurality of layers has a structure in which a copper (Cu) layer is laminated on a molybdenum-titanium (MoTi) alloy layer, and an upper layer of the plurality of layers is formed of molybdenum-titanium (MoTi) alloy and covers the lower layer.

17. The organic light emitting display device according to claim 15, wherein the dummy layer is formed of a same material as the second pad electrode of the pad electrode structure and the third pad electrode of the pad electrode structure.

* * * * *